(12) United States Patent
Fallon

(10) Patent No.: US 7,714,747 B2
(45) Date of Patent: May 11, 2010

(54) DATA COMPRESSION SYSTEMS AND METHODS

(75) Inventor: James J. Fallon, Armonk, NY (US)

(73) Assignee: Realtime Data LLC, New York, NY (US)

( * ) Notice: Subject to any disclaimer, the term of this patent is extended or adjusted under 35 U.S.C. 154(b) by 0 days.

(21) Appl. No.: 11/651,365

(22) Filed: Jan. 8, 2007

(65) Prior Publication Data

US 2007/0109155 A1    May 17, 2007

Related U.S. Application Data

(63) Continuation of application No. 10/668,768, filed on Sep. 22, 2003, now Pat. No. 7,161,506, which is a continuation of application No. 10/016,355, filed on Oct. 29, 2001, now Pat. No. 6,624,761, which is a continuation-in-part of application No. 09/705,446, filed on Nov. 3, 2000, now Pat. No. 6,309,424, which is a continuation of application No. 09/210,491, filed on Dec. 11, 1998, now Pat. No. 6,195,024.

(51) Int. Cl.
    *H03M 7/34*    (2006.01)
(52) U.S. Cl. ............................ 341/51; 341/50; 341/67; 341/75; 341/79
(58) Field of Classification Search .................. 341/50, 341/51, 67, 75, 79
    See application file for complete search history.

(56) References Cited

U.S. PATENT DOCUMENTS

| | | | |
|---|---|---|---|
| 3,394,352 A | 7/1968 | Wernikoff et al. | |
| 3,490,690 A | 1/1970 | Apple et al. | |
| 4,021,782 A | 5/1977 | Hoerning | |
| 4,032,893 A | 6/1977 | Moran | |
| 4,054,951 A | 10/1977 | Jackson et al. | |
| 4,302,775 A | 11/1981 | Widergren et al. | |
| 4,325,085 A | 4/1982 | Gooch | |
| 4,360,840 A | 11/1982 | Wolfrum et al. | |

(Continued)

FOREIGN PATENT DOCUMENTS

DE    4127518    2/1992

(Continued)

OTHER PUBLICATIONS

Rice, Robert F., "Some Practical Universal Noiseless Coding Techniques", Jet Propulsion Laboratory, Pasadena, California, JPL Publication 79-22, Mar. 15, 1979.

(Continued)

*Primary Examiner*—Linh V Nguyen
(74) *Attorney, Agent, or Firm*—Sterne, Kessler, Goldstein & Fox, PLLC

(57) ABSTRACT

Systems and methods for providing fast and efficient data compression using a combination of content independent data compression and content dependent data compression. In one aspect, a method for compressing data comprises the steps of: analyzing a data block of an input data stream to identify a data type of the block, the input data stream comprising a plurality of disparate data type; performing content dependent data compression on the data block, if the data type of the data block is identified; performing content independent data compression on the data block, if the data type of the data block is not identified.

22 Claims, 34 Drawing Sheets

U.S. PATENT DOCUMENTS

| | | |
|---|---|---|
| 4,386,416 A | 5/1983 | Giltner et al. |
| 4,394,774 A | 7/1983 | Widergren et al. |
| 4,494,108 A | 1/1985 | Langdon, Jr. et al. |
| 4,499,499 A | 2/1985 | Brickman et al. |
| 4,574,351 A | 3/1986 | Dang et al. |
| 4,593,324 A | 6/1986 | Ohkubo et al. |
| 4,626,829 A | 12/1986 | Hauck |
| 4,682,150 A | 7/1987 | Mathes et al. |
| 4,701,745 A | 10/1987 | Waterworth |
| 4,729,020 A | 3/1988 | Schaphorst et al. |
| 4,730,348 A | 3/1988 | MacCrisken |
| 4,748,638 A | 5/1988 | Friedman et al. |
| 4,754,351 A | 6/1988 | Wright |
| 4,804,959 A | 2/1989 | Makansi et al. |
| 4,813,040 A | 3/1989 | Futato |
| 4,862,167 A | 8/1989 | Copeland, III |
| 4,866,601 A | 9/1989 | DuLac et al. |
| 4,870,415 A | 9/1989 | Van Maren et al. |
| 4,872,009 A | 10/1989 | Tsukiyama et al. |
| 4,876,541 A | 10/1989 | Storer |
| 4,888,812 A | 12/1989 | Dinan et al. |
| 4,890,282 A | 12/1989 | Lambert et al. |
| 4,897,717 A | 1/1990 | Hamilton et al. |
| 4,906,991 A | 3/1990 | Fiala et al. |
| 4,906,995 A | 3/1990 | Swanson |
| 4,929,946 A | 5/1990 | O'Brien et al. |
| 4,953,324 A | 9/1990 | Herrmann |
| 4,956,808 A | 9/1990 | Aakre et al. |
| 4,965,675 A | 10/1990 | Hori et al. |
| 4,988,998 A | 1/1991 | O'Brien |
| 5,003,307 A | 3/1991 | Whiting et al. |
| 5,016,009 A | 5/1991 | Whiting et al. |
| 5,028,922 A | 7/1991 | Huang |
| 5,045,848 A | 9/1991 | Fascenda |
| 5,045,852 A | 9/1991 | Mitchell et al. |
| 5,046,027 A | 9/1991 | Taaffe et al. |
| 5,049,881 A | 9/1991 | Gibson et al. |
| 5,091,782 A | 2/1992 | Krause et al. |
| 5,097,261 A | 3/1992 | Langdon, Jr. et al. |
| 5,109,226 A | 4/1992 | Mac Lean, Jr. et al. |
| 5,109,433 A | 4/1992 | Notenboom |
| 5,113,522 A | 5/1992 | Dinwiddie, Jr. et al. |
| 5,115,309 A | 5/1992 | Hang |
| 5,121,342 A | 6/1992 | Szymborski et al. |
| 5,126,739 A | 6/1992 | Whiting et al. |
| 5,128,963 A | 7/1992 | Akagiri |
| 5,146,221 A | 9/1992 | Whiting et al. |
| 5,150,430 A | 9/1992 | Chu |
| 5,155,484 A | 10/1992 | Chambers, IV |
| 5,159,336 A | 10/1992 | Rabin et al. |
| 5,167,034 A | 11/1992 | MacLean, Jr. et al. |
| 5,175,543 A | 12/1992 | Lantz |
| 5,179,651 A | 1/1993 | Taaffe et al. |
| 5,187,793 A | 2/1993 | Keith et al. |
| 5,191,431 A | 3/1993 | Hasegawa et al. |
| 5,204,756 A | 4/1993 | Chevion et al. |
| 5,209,220 A | 5/1993 | Hiyama et al. |
| 5,212,742 A | 5/1993 | Normile et al. |
| 5,226,176 A | 7/1993 | Westaway et al. |
| 5,227,893 A | 7/1993 | Ett |
| 5,231,492 A | 7/1993 | Dangi et al. |
| 5,237,460 A | 8/1993 | Miller et al. |
| 5,237,675 A | 8/1993 | Hannon, Jr. |
| 5,243,341 A | 9/1993 | Seroussi et al. |
| 5,243,348 A | 9/1993 | Jackson |
| 5,247,638 A | 9/1993 | O'Brien et al. |
| 5,247,646 A | 9/1993 | Osterlund et al. |
| 5,249,053 A | 9/1993 | Jain |
| 5,263,168 A | 11/1993 | Toms et al. |
| 5,270,832 A | 12/1993 | Balkanski et al. |
| 5,280,600 A | 1/1994 | Van Maren et al. |
| 5,287,420 A | 2/1994 | Barrett |
| 5,289,580 A | 2/1994 | Latif et al. |
| 5,293,379 A | 3/1994 | Carr |
| 5,293,576 A | 3/1994 | Mihm, Jr. et al. |
| 5,307,497 A | 4/1994 | Feigenbaum et al. |
| 5,309,555 A | 5/1994 | Akins et al. |
| 5,341,440 A | 8/1994 | Earl et al. |
| 5,347,600 A | 9/1994 | Barnsley et al. |
| 5,355,498 A | 10/1994 | Provino et al. |
| 5,357,614 A | 10/1994 | Pattisam et al. |
| 5,367,629 A | 11/1994 | Chu et al. |
| 5,372,290 A | 12/1994 | Lempel et al. |
| 5,379,036 A | 1/1995 | Storer |
| 5,379,757 A | 1/1995 | Hiyama et al. |
| 5,381,145 A | 1/1995 | Allen et al. |
| 5,389,922 A | 2/1995 | Seroussi et al. |
| 5,394,534 A | 2/1995 | Kulakowski et al. |
| 5,396,228 A | 3/1995 | Garahi |
| 5,400,401 A | 3/1995 | Wasilewski et al. |
| 5,403,639 A | 4/1995 | Belsan et al. |
| 5,406,278 A | 4/1995 | Graybill et al. |
| 5,406,279 A | 4/1995 | Anderson et al. |
| 5,410,671 A | 4/1995 | Elgamal et al. |
| 5,412,384 A | 5/1995 | Chang et al. |
| 5,414,850 A | 5/1995 | Whiting |
| 5,420,639 A | 5/1995 | Perkins |
| 5,434,983 A | 7/1995 | Yaso et al. |
| 5,437,020 A | 7/1995 | Wells et al. |
| 5,452,287 A | 9/1995 | DiCecco et al. |
| 5,454,079 A | 9/1995 | Roper et al. |
| 5,454,107 A | 9/1995 | Lehman et al. |
| 5,455,576 A * | 10/1995 | Clark et al. .................. 341/50 |
| 5,455,680 A | 10/1995 | Shin |
| 5,461,679 A | 10/1995 | Normile et al. |
| 5,463,390 A | 10/1995 | Whiting et al. |
| 5,467,087 A | 11/1995 | Chu |
| 5,471,206 A | 11/1995 | Allen et al. |
| 5,479,587 A | 12/1995 | Campbell et al. |
| 5,479,633 A | 12/1995 | Wells et al. |
| 5,483,470 A | 1/1996 | Alur et al. |
| 5,486,826 A | 1/1996 | Remillard |
| 5,488,364 A | 1/1996 | Cole |
| 5,495,244 A | 2/1996 | Jeong et al. |
| 5,504,842 A | 4/1996 | Gentile |
| 5,506,844 A | 4/1996 | Rao |
| 5,506,872 A | 4/1996 | Mohler |
| 5,506,944 A | 4/1996 | Gentile |
| 5,528,628 A | 6/1996 | Park et al. |
| 5,530,845 A | 6/1996 | Hiatt et al. |
| 5,533,051 A | 7/1996 | James |
| 5,535,311 A | 7/1996 | Zimmerman |
| 5,535,356 A | 7/1996 | Kim et al. |
| 5,535,369 A | 7/1996 | Wells et al. |
| 5,537,658 A | 7/1996 | Bakke et al. |
| 5,539,865 A | 7/1996 | Gentile |
| 5,542,031 A | 7/1996 | Douglass et al. |
| 5,544,290 A | 8/1996 | Gentile |
| 5,546,395 A | 8/1996 | Sharma et al. |
| 5,546,475 A | 8/1996 | Bolle et al. |
| 5,553,160 A | 9/1996 | Dawson |
| 5,557,551 A | 9/1996 | Craft |
| 5,557,668 A | 9/1996 | Brady |
| 5,557,749 A | 9/1996 | Norris |
| 5,561,421 A | 10/1996 | Smith et al. |
| 5,561,824 A | 10/1996 | Carreiro et al. |
| 5,563,961 A | 10/1996 | Rynderman et al. |
| 5,574,952 A | 11/1996 | Brady et al. |
| 5,574,953 A | 11/1996 | Rust et al. |
| 5,576,953 A | 11/1996 | Hugentobler |
| 5,581,715 A | 12/1996 | Verinsky et al. |
| 5,583,500 A | 12/1996 | Allen et al. |
| 5,586,264 A | 12/1996 | Belknap et al. |
| 5,586,285 A | 12/1996 | Hasbun et al. |

| | | | | | | |
|---|---|---|---|---|---|---|
| 5,590,306 A | 12/1996 | Watanabe et al. | | 5,812,789 A | 9/1998 | Diaz et al. |
| 5,596,674 A | 1/1997 | Bhandari et al. | | 5,818,368 A | 10/1998 | Langley |
| 5,604,824 A | 2/1997 | Chui et al. | | 5,818,369 A | 10/1998 | Withers |
| 5,606,706 A | 2/1997 | Takamoto et al. | | 5,818,530 A | 10/1998 | Canfield et al. |
| 5,610,657 A | 3/1997 | Zhang | | 5,819,215 A | 10/1998 | Dobson et al. |
| 5,611,024 A | 3/1997 | Campbell et al. | | 5,822,781 A | 10/1998 | Wells et al. |
| 5,612,788 A | 3/1997 | Stone | | 5,825,424 A | 10/1998 | Canfield et al. |
| 5,613,069 A | 3/1997 | Walker | | 5,825,830 A | 10/1998 | Kopf |
| 5,615,017 A | 3/1997 | Choi | | 5,832,037 A | 11/1998 | Park |
| 5,615,287 A | 3/1997 | Fu et al. | | 5,832,126 A | 11/1998 | Tanaka |
| 5,619,995 A | 4/1997 | Lobodzinski | | 5,835,788 A | 11/1998 | Blumer et al. |
| 5,621,820 A | 4/1997 | Rynderman et al. | | 5,836,003 A | 11/1998 | Sadeh |
| 5,623,623 A | 4/1997 | Kim et al. | | 5,838,996 A | 11/1998 | deCarmo |
| 5,623,701 A | 4/1997 | Bakke et al. | | 5,839,100 A | 11/1998 | Wegener |
| 5,627,534 A | 5/1997 | Craft | | 5,841,979 A | 11/1998 | Schulhof et al. |
| 5,627,995 A | 5/1997 | Miller et al. | | 5,847,762 A | 12/1998 | Canfield et al. |
| 5,629,732 A | 5/1997 | Moskowitz et al. | | 5,850,565 A | 12/1998 | Wightman |
| 5,630,092 A | 5/1997 | Carreiro et al. | | 5,861,824 A | 1/1999 | Ryu et al. |
| 5,635,632 A | 6/1997 | Fay et al. | | 5,861,920 A | 1/1999 | Mead et al. |
| 5,635,932 A | 6/1997 | Shinagawa et al. | | 5,864,342 A | 1/1999 | Kajiya et al. |
| 5,638,498 A | 6/1997 | Tyler et al. | | 5,867,167 A | 2/1999 | Deering |
| 5,640,158 A | 6/1997 | Okayama et al. | | 5,867,602 A | 2/1999 | Zandi et al. |
| 5,642,506 A | 6/1997 | Lee | | 5,870,036 A | 2/1999 | Franaszek et al. |
| 5,649,032 A | 7/1997 | Burt et al. | | 5,870,087 A | 2/1999 | Chau |
| 5,652,795 A | 7/1997 | Dillon et al. | | 5,872,530 A | 2/1999 | Domyo et al. |
| 5,652,857 A | 7/1997 | Shimoi et al. | | 5,874,907 A | 2/1999 | Craft |
| 5,652,917 A | 7/1997 | Maupin et al. | | 5,883,975 A | 3/1999 | Narita et al. |
| 5,654,703 A | 8/1997 | Clark, II | | 5,884,269 A | 3/1999 | Cellier et al. |
| 5,655,138 A | 8/1997 | Kikinis | | 5,886,655 A | 3/1999 | Rust |
| 5,666,560 A | 9/1997 | Moertl et al. | | 5,887,165 A | 3/1999 | Martel et al. |
| 5,668,737 A | 9/1997 | Iler | | 5,889,961 A | 3/1999 | Dobbek |
| 5,671,355 A | 9/1997 | Collins | | 5,892,847 A | 4/1999 | Johnson |
| 5,671,389 A | 9/1997 | Saliba | | 5,909,557 A | 6/1999 | Betker et al. |
| 5,671,413 A | 9/1997 | Shipman et al. | | 5,909,559 A | 6/1999 | So |
| 5,675,333 A | 10/1997 | Boursier et al. | | 5,915,079 A | 6/1999 | Vondran, Jr. et al. |
| 5,675,789 A | 10/1997 | Ishii et al. | | 5,917,438 A | 6/1999 | Ando |
| 5,686,916 A | 11/1997 | Bakhmutsky | | 5,918,068 A | 6/1999 | Shafe' |
| 5,692,159 A | 11/1997 | Shand | | 5,918,225 A | 6/1999 | White et al. |
| 5,694,619 A | 12/1997 | Konno | | 5,920,326 A | 7/1999 | Rentschler et al. |
| 5,696,927 A | 12/1997 | MacDonald et al. | | 5,923,860 A | 7/1999 | Olarig |
| 5,703,793 A | 12/1997 | Wise et al. | | 5,930,358 A | 7/1999 | Rao |
| 5,708,511 A | 1/1998 | Gandhi et al. | | 5,936,616 A | 8/1999 | Torborg, Jr. et al. |
| 5,715,477 A | 2/1998 | Kikinis | | 5,943,692 A | 8/1999 | Marberg et al. |
| 5,717,393 A | 2/1998 | Nakano et al. | | 5,945,933 A | 8/1999 | Kalkstein |
| 5,717,394 A | 2/1998 | Schwartz et al. | | 5,949,355 A | 9/1999 | Panaoussis |
| 5,719,862 A | 2/1998 | Lee et al. | | 5,951,623 A | 9/1999 | Reynar et al. |
| 5,721,958 A | 2/1998 | Kikinis | | 5,955,976 A * | 9/1999 | Heath .................. 341/87 |
| 5,724,475 A | 3/1998 | Kirsten | | 5,956,490 A | 9/1999 | Buchholz et al. |
| 5,729,228 A | 3/1998 | Franaszek et al. | | 5,960,465 A | 9/1999 | Adams |
| 5,740,395 A | 4/1998 | Wells et al. | | 5,964,842 A | 10/1999 | Packard |
| 5,742,773 A | 4/1998 | Blomfield-Brown et al. | | 5,968,149 A | 10/1999 | Jaquette et al. |
| 5,748,904 A | 5/1998 | Huang et al. | | 5,969,927 A | 10/1999 | Schirmer et al. |
| 5,757,852 A | 5/1998 | Jericevic et al. | | 5,973,630 A | 10/1999 | Heath |
| 5,765,027 A | 6/1998 | Wang et al. | | 5,974,235 A | 10/1999 | Nunally et al. |
| 5,767,898 A * | 6/1998 | Urano et al. .................. 348/43 | | 5,974,387 A | 10/1999 | Kageyama |
| 5,768,445 A | 6/1998 | Troeller et al. | | 5,974,471 A | 10/1999 | Belt |
| 5,768,525 A | 6/1998 | Kralowetz et al. | | 5,978,483 A | 11/1999 | Thompson, Jr. et al. |
| 5,771,340 A | 6/1998 | Nakazato et al. | | 5,982,360 A | 11/1999 | Wu et al. |
| 5,774,715 A | 6/1998 | Madany et al. | | 5,982,723 A | 11/1999 | Kamatani |
| 5,778,411 A | 7/1998 | DeMoss et al. | | 5,987,022 A | 11/1999 | Geiger et al. |
| 5,781,767 A | 7/1998 | Inoue et al. | | 5,987,590 A | 11/1999 | So |
| 5,784,572 A | 7/1998 | Rostoker et al. | | 5,990,884 A | 11/1999 | Douma et al. |
| 5,787,487 A | 7/1998 | Hashimoto et al. | | 5,991,515 A | 11/1999 | Fall et al. |
| 5,794,229 A | 8/1998 | French et al. | | 5,996,033 A | 11/1999 | Chiu-Hao |
| 5,796,864 A | 8/1998 | Callahan | | 6,000,009 A | 12/1999 | Brady |
| 5,799,110 A | 8/1998 | Israelsen et al. | | 6,002,411 A | 12/1999 | Dye |
| 5,805,834 A | 9/1998 | McKinley et al. | | 6,003,115 A | 12/1999 | Spear et al. |
| 5,805,932 A | 9/1998 | Kawashima et al. | | 6,008,743 A | 12/1999 | Jaquette |
| 5,808,660 A | 9/1998 | Sekine et al. | | 6,011,901 A | 1/2000 | Kirsten |
| 5,809,176 A | 9/1998 | Yajima | | 6,014,694 A | 1/2000 | Aharoni et al. |
| 5,809,299 A | 9/1998 | Cloutier et al. | | 6,023,755 A | 2/2000 | Casselman |
| 5,809,337 A | 9/1998 | Hannah et al. | | 6,026,217 A | 2/2000 | Adiletta |
| 5,812,195 A | 9/1998 | Zhang | | 6,028,725 A | 2/2000 | Blumenau |

| | | | | | | | | |
|---|---|---|---|---|---|---|---|---|
| 6,031,939 | A | 2/2000 | Gilbert et al. | | 6,513,113 | B1 | 1/2003 | Kobayashi |
| 6,032,148 | A | 2/2000 | Wilkes | | 6,523,102 | B1 | 2/2003 | Dye et al. |
| 6,058,459 | A | 5/2000 | Owen et al. | | 6,526,174 | B1 | 2/2003 | Graffagnino |
| 6,061,398 | A | 5/2000 | Satoh et al. | | 6,529,633 | B1 | 3/2003 | Easwar et al. |
| 6,070,179 | A | 5/2000 | Craft | | 6,532,121 | B1 | 3/2003 | Rust et al. |
| 6,073,232 | A | 6/2000 | Kroeker et al. | | 6,539,438 | B1 | 3/2003 | Ledzius et al. |
| 6,075,470 | A | 6/2000 | Little et al. | | 6,539,456 | B2 | 3/2003 | Stewart |
| 6,078,958 | A | 6/2000 | Echeita et al. | | 6,542,644 | B1 | 4/2003 | Satoh |
| 6,091,777 | A | 7/2000 | Guetz et al. | | 6,577,254 | B2 | 6/2003 | Rasmussen |
| 6,092,123 | A | 7/2000 | Steffan et al. | | 6,590,609 | B1 | 7/2003 | Kitade et al. |
| 6,094,634 | A | 7/2000 | Yahagi et al. | | 6,597,812 | B1 | 7/2003 | Fallon et al. |
| 6,097,520 | A | 8/2000 | Kadnier | | 6,601,104 | B1 | 7/2003 | Fallon |
| 6,098,114 | A | 8/2000 | McDonald et al. | | 6,604,040 | B2 | 8/2003 | Kawasaki et al. |
| 6,104,389 | A | 8/2000 | Ando | | 6,604,158 | B1 | 8/2003 | Fallon |
| 6,105,130 | A | 8/2000 | Wu et al. | | 6,606,040 | B2 * | 8/2003 | Abdat .................. 341/87 |
| 6,128,412 | A | 10/2000 | Satoh | | 6,606,413 | B1 | 8/2003 | Zeineh |
| 6,134,631 | A | 10/2000 | Jennings, III | | 6,609,223 | B1 | 8/2003 | Wolfgang |
| 6,141,053 | A | 10/2000 | Saukkonen | | 6,618,728 | B1 | 9/2003 | Rail |
| 6,145,020 | A | 11/2000 | Barnett | | 6,624,761 | B2 | 9/2003 | Fallon |
| 6,145,069 | A | 11/2000 | Dye | | 6,650,261 | B2 * | 11/2003 | Nelson et al. .............. 341/106 |
| 6,169,241 | B1 | 1/2001 | Shimizu | | 6,661,839 | B1 | 12/2003 | Ishida et al. |
| 6,170,007 | B1 | 1/2001 | Venkatraman et al. | | 6,661,845 | B1 | 12/2003 | Herath |
| 6,170,047 | B1 | 1/2001 | Dye | | 6,704,840 | B2 | 3/2004 | Nalawadi et al. |
| 6,170,049 | B1 | 1/2001 | So | | 6,711,709 | B1 * | 3/2004 | York .................. 714/748 |
| 6,172,936 | B1 | 1/2001 | Kitazaki | | 6,717,534 | B2 | 4/2004 | Yokose |
| 6,173,381 | B1 | 1/2001 | Dye | | 6,731,814 | B2 * | 5/2004 | Zeck et al. .................. 382/239 |
| 6,175,650 | B1 | 1/2001 | Sindhu et al. | | 6,745,282 | B2 | 6/2004 | Okada et al. |
| 6,175,856 | B1 | 1/2001 | Riddle | | 6,748,457 | B2 | 6/2004 | Fallon et al. |
| 6,182,125 | B1 | 1/2001 | Borella et al. | | 6,756,922 | B2 | 6/2004 | Ossia |
| 6,185,625 | B1 | 2/2001 | Tso et al. | | 6,768,749 | B1 | 7/2004 | Osler et al. |
| 6,185,659 | B1 | 2/2001 | Milillo et al. | | 6,792,151 | B1 | 9/2004 | Barnes et al. |
| 6,192,082 | B1 | 2/2001 | Moriarty et al. | | 6,810,434 | B2 | 10/2004 | Muthujumaraswathy et al. |
| 6,192,155 | B1 | 2/2001 | Fan | | 6,813,689 | B2 | 11/2004 | Baxter, III |
| 6,195,024 | B1 | 2/2001 | Fallon | | 6,819,271 | B2 | 11/2004 | Geiger et al. |
| 6,195,465 | B1 | 2/2001 | Zandi et al. | | 6,822,589 | B1 | 11/2004 | Dye et al. |
| 6,208,273 | B1 | 3/2001 | Dye et al. | | 6,856,651 | B2 | 2/2005 | Singh |
| 6,215,904 | B1 | 4/2001 | Lavallee | | 6,862,278 | B1 | 3/2005 | Chang et al. |
| 6,219,754 | B1 | 4/2001 | Belt et al. | | 6,879,266 | B1 | 4/2005 | Dye et al. |
| 6,222,886 | B1 | 4/2001 | Yogeshwar | | 6,885,316 | B2 | 4/2005 | Mehring |
| 6,225,922 | B1 | 5/2001 | Norton | | 6,885,319 | B2 | 4/2005 | Geiger et al. |
| 6,226,667 | B1 | 5/2001 | Matthews et al. | | 6,888,893 | B2 | 5/2005 | Li et al. |
| 6,226,740 | B1 | 5/2001 | Iga | | 6,909,383 | B2 | 6/2005 | Shokrollahi et al. |
| 6,230,223 | B1 | 5/2001 | Olarig | | 6,944,740 | B2 | 9/2005 | Abali et al. |
| 6,237,054 | B1 | 5/2001 | Freitag, Jr. | | 6,959,359 | B1 | 10/2005 | Suzuki et al. |
| 6,243,829 | B1 | 6/2001 | Chan | | 6,963,608 | B1 | 11/2005 | Wu |
| 6,253,264 | B1 | 6/2001 | Sebastian | | 6,993,597 | B2 | 1/2006 | Nakagawa et al. |
| 6,272,178 | B1 * | 8/2001 | Nieweglowski et al. 375/240.03 | | 7,007,099 | B1 | 2/2006 | Donati et al. |
| 6,272,627 | B1 | 8/2001 | Mann | | 7,054,493 | B2 | 5/2006 | Schwartz |
| 6,272,628 | B1 | 8/2001 | Aguilar et al. | | 7,069,342 | B1 | 6/2006 | Biederman |
| 6,282,641 | B1 | 8/2001 | Christensen | | 7,089,391 | B2 | 8/2006 | Geiger et al. |
| 6,298,408 | B1 | 10/2001 | Park | | 7,102,544 | B1 | 9/2006 | Liu |
| 6,308,311 | B1 | 10/2001 | Carmichael et al. | | 7,129,860 | B2 | 10/2006 | Alvarez, II et al. |
| 6,309,424 | B1 * | 10/2001 | Fallon .................. 341/51 | | 7,130,913 | B2 | 10/2006 | Fallon |
| 6,310,563 | B1 | 10/2001 | Har et al. | | 7,161,506 | B2 | 1/2007 | Fallon |
| 6,317,714 | B1 | 11/2001 | Del Castillo et al. | | 7,181,608 | B2 | 2/2007 | Fallon et al. |
| 6,330,622 | B1 | 12/2001 | Schaefer | | 7,190,284 | B1 | 3/2007 | Dye et al. |
| 6,345,307 | B1 | 2/2002 | Booth | | 7,319,667 | B1 | 1/2008 | Biederman |
| 6,356,589 | B1 | 3/2002 | Gebler et al. | | 7,321,937 | B2 | 1/2008 | Fallon |
| 6,356,937 | B1 | 3/2002 | Montville et al. | | 7,330,912 | B1 | 2/2008 | Fox et al. |
| 6,392,567 | B2 | 5/2002 | Satoh | | 7,352,300 | B2 | 4/2008 | Fallon |
| 6,404,931 | B1 | 6/2002 | Chen et al. | | 7,358,867 | B2 | 4/2008 | Fallon |
| 6,421,387 | B1 | 7/2002 | Rhee | | 7,376,772 | B2 | 5/2008 | Fallon |
| 6,434,168 | B1 | 8/2002 | Kari | | 7,378,992 | B2 | 5/2008 | Fallon |
| 6,434,695 | B1 | 8/2002 | Esfahani et al. | | 7,386,046 | B2 | 6/2008 | Fallon |
| 6,442,659 | B1 | 8/2002 | Blumenau | | 7,395,345 | B2 | 7/2008 | Fallon |
| 6,449,658 | B1 | 9/2002 | Lafe et al. | | 7,400,274 | B2 | 7/2008 | Fallon |
| 6,449,682 | B1 | 9/2002 | Toorians | | 7,415,530 | B2 | 8/2008 | Fallon |
| 6,452,602 | B1 | 9/2002 | Morein | | 7,417,568 | B2 | 8/2008 | Fallon et al. |
| 6,452,933 | B1 | 9/2002 | Duffield et al. | | 7,552,069 | B2 | 6/2009 | Kepecs |
| 6,459,429 | B1 | 10/2002 | Deering | | 7,565,441 | B2 | 7/2009 | Romanik et al. |
| 6,463,509 | B1 | 10/2002 | Teoman et al. | | 2001/0031092 | A1 * | 10/2001 | Zeck et al. .................. 382/239 |
| 6,487,640 | B1 | 11/2002 | Lipasti | | 2001/0032128 | A1 | 10/2001 | Kepecs |
| 6,489,902 | B2 | 12/2002 | Heath | | 2001/0047473 | A1 | 11/2001 | Fallon |

| | | | |
|---|---|---|---|
| 2001/0052038 A1 | 12/2001 | Fallon et al. | |
| 2001/0054131 A1 | 12/2001 | Alvarez, II et al. | |
| 2002/0037035 A1 | 3/2002 | Singh | |
| 2002/0080871 A1 | 6/2002 | Fallon et al. | |
| 2002/0101367 A1 | 8/2002 | Geiger et al. | |
| 2002/0104891 A1 | 8/2002 | Otto | |
| 2002/0126755 A1 | 9/2002 | Li et al. | |
| 2002/0191692 A1 | 12/2002 | Fallon et al. | |
| 2003/0030575 A1* | 2/2003 | Frachtenberg et al. | 341/51 |
| 2003/0034905 A1 | 2/2003 | Anton et al. | |
| 2003/0084238 A1 | 5/2003 | Okada et al. | |
| 2003/0142874 A1 | 7/2003 | Schwartz | |
| 2003/0191876 A1 | 10/2003 | Fallon | |
| 2004/0042506 A1 | 3/2004 | Fallon et al. | |
| 2004/0073710 A1 | 4/2004 | Fallon | |
| 2006/0015650 A1 | 1/2006 | Fallon | |
| 2006/0181441 A1 | 8/2006 | Fallon | |
| 2006/0181442 A1 | 8/2006 | Fallon | |
| 2006/0184696 A1 | 8/2006 | Fallon | |
| 2006/0190644 A1 | 8/2006 | Fallon | |
| 2006/0195601 A1 | 8/2006 | Fallon | |
| 2007/0043939 A1 | 2/2007 | Fallon et al. | |
| 2007/0050514 A1 | 3/2007 | Fallon | |
| 2007/0050515 A1 | 3/2007 | Fallon | |
| 2007/0067483 A1 | 3/2007 | Fallon | |
| 2007/0083746 A1 | 4/2007 | Fallon et al. | |
| 2007/0109154 A1 | 5/2007 | Fallon | |
| 2007/0109156 A1 | 5/2007 | Fallon | |
| 2007/0174209 A1 | 7/2007 | Fallon et al. | |
| 2008/0232457 A1 | 9/2008 | Fallon | |
| 2009/0154545 A1 | 6/2009 | Fallon et al. | |
| 2009/0287839 A1 | 11/2009 | Fallon et al. | |

FOREIGN PATENT DOCUMENTS

| | | |
|---|---|---|
| EP | 0164677 | 12/1985 |
| EP | 0185098 | 6/1986 |
| EP | 0283798 | 9/1988 |
| EP | 0595406 | 5/1994 |
| EP | 0405572 | 11/1994 |
| EP | 0718751 | 6/1996 |
| EP | 0493130 | 6/1997 |
| EP | 0587437 | 2/2002 |
| GB | 2162025 | 1/1986 |
| JP | 6051989 | 2/1994 |
| JP | 9188009 | 7/1997 |
| JP | 11149376 | 6/1999 |
| WO | WO 9414273 | 6/1994 |
| WO | WO 9429852 | 12/1994 |
| WO | WO 9502873 | 1/1995 |
| WO | WO 9748212 | 12/1997 |
| WO | WO 9908186 | 2/1999 |
| WO | WO 02/39591 | 5/2002 |

OTHER PUBLICATIONS

Anderson, J., et al. "Codec squeezes color teleconferencing through digital telephone lines", Electronics 1984, pp. 113-115.
Venbrux, Jack, "A VLSI Chip Set for High-Speed Lossless Data Compression", IEEE Trans. On Circuits and Systems for Video Technology, vol. 2, No. 44, Dec. 1992, pp. 381-391.
"Fast Dos Soft Boot", IBM Technical Disclosure Bulletin, Feb. 1994, vol. 37, Issue No. 2B, pp. 185-186.
"Operating System Platform Abstraction Method", IBM Technical Disclosure Bulletin, Feb. 1995, vol. 38, Issue No. 2, pp. 343-344.
Murashita, K., et al., "High-Speed Statistical Compression using Self-Organized Rules and Predetermined Code Tables", IEEE, 1996 Data Compression Conference.
Coene, W., et al. "A Fast Route For Application of Rate-distortion Optimal Quantization in an MPEG Video Encoder" Proceedings of the International Conference on Image Processing, US., New York, IEEE, Sep. 16, 1996, pp. 825-828.
Rice, Robert, "Lossless Coding Standards for Space Data Systems", IEEE 1058-6393/97, pp. 577-585.
Millman, Howard, "Image and video compression", Computerworld, vol. 33, Issue No. 3, Jan. 18, 1999, pp. 78.
"IBM boosts your memory", Geek.com [online], Jun. 26, 2000 [retrieved on Jul. 6, 2007], <URL:http://www.geek.com/ibm-boosts-your-memory/>.
"IBM Research Breakthrough Doubles Computer Memory Capacity", IBM Press Release [online], Jun. 26, 2000 [retrieved on Jul. 6, 2007], <URL:http://www-03.ibm.com/press/us/en/pressrelease/1653.wss>.
"ServerWorks To Deliver IBM's Memory eXpansion Technology in Next-Generation Core Logic for Servers", ServerWorks Press Release [online], Jun. 27, 2000 [retrieved on Jul. 14, 2000], <URL:http://www.serverworks.com/news/press/000627.html>.
Abali, B., et al., "Memory Expansion Technology (MXT) Software support and performance", IBM Journal of Research and Development, vol. 45, Issue No. 2, Mar. 2001, pp. 287-301.
Franaszek, P. A., et al., "Algorithms and data structures for compressed-memory machines", IBM Journal of Research and Development, vol. 45, Issue No. 2, Mar. 2001, pp. 245-258.
Franaszek, P. A., et al., "On internal organization in compressed random-access memories", IBM Journal of Research and Development, vol. 45, Issue No. 2, Mar. 2001, pp. 259-270.
Smith, T.B., et al., "Memory Expansion Technology (MXT) Competitive impact", IBM Journal of Research and Development, Vo. 45, Issue No. 2, Mar. 2001, pp. 303-309.
Tremaine, R. B., et al., "IBM Memory Expansion Technology (MXT)", IBM Journal of Research and Development, vol. 45, Issue No. 2, Mar. 2001, pp. 271-285.
Yeh, Pen-Shu, "The CCSDS Lossless Data Compression Recommendation for Space Applications", Chapter 16, Lossless Compression Handbook, Elsevier Science (USA), 2003, pp. 311-326.
Expand Networks Accelerator 4000 Series User's Guide.
Tridgell, Andrew; "Efficient Algorithms for Sorting and Synchronization"; A thesis submitted for the degree of Doctor of Philosophy at the Australian National University; Feb. 1999; pp. iii-106.
Jung, et al.; "Performance optimization of wireless local area networks through VLSI data compression"; Wireless Networks, vol. 4, 1998; pp. 27-39.
Jones, et al.; "Lossless data compression for short duration 3D frames in positron emission tomography", IEEE Conference Record Nuclear Science Symposium and Medical Imaging Conference; vol. 3; pp. 1831-1834.
Maier, Mark W.; "Algorithm Evaluation for the Synchronous Data Compression Standard"; University of Alabama; pp. 1-10. 1988.
Bassiouni, et al.; "A Scheme for Data Compression in Supercomputers"; IEEE; 1988; pp. 272-278.
Welch, Terry A.; "A Technique for High-Performance Data Compression"; IEEE; Jun. 1984; pp. 8-19.
ALDC: Adaptive Lossless Data Compression; IBM; 1994.
ALDC-Macro: Adaptive Lossless Data Compression; IBM Corporation; 1994.
ALDC1-20S: Adaptive Lossless Data Compression; IBM Corporation; 1994.
ALDC1-40S: Adaptive Lossless Data Compression; IBM Corporation; 1994.
ALDC1-5S: Adaptive Lossless Data Compression; IBM Corporation; 1994.
Craft, David J.; "Data Compression Choice No Easy Call"; Computer Technology Review; vol. XIV, No. 1; Jan. 1994.
Costlow, Terry; "Sony designs faster, denser tape drive"; Electronic Engineering Times; May 20, 1996, pp. 86-87.
Wilson, Ron; "IBM ups compression ante"; Electronic Engineering Times; Aug. 16, 1993; pp. 1-94.
"IBM Announces New Feature for 3480 Subsystem"; Tucson Today; vol. 12, No. 337, Jul. 25, 1989.
Syngress Media, Inc.; "CCA Citrix Certified Administrator for MetaFrame 1.8 Study Guide"; 2000.
International Telecommunication Union; "Data Compression Procedures for Data Circuit Terminating Equipment (DCE) Using Error Correction Procedures"; Geneva, 1990.
Cheng, et al.; "A fast, highly reliable data compression chip and algorithm for storage systems"; IBM J. Res. Develop.; vol. 40, No. 6, Nov. 1996; pp. 603-613.

Cisco Systems; "Cisco IOS Data Compression"; 1997; pp. 1-10.
Craft, D. J.; "A fast hardware data compression algorithm and some algorithmic extensions"; IBM J. Res. Develop.; vol. 42; No. 6; Nov. 6, 1998; pp. 733-746.
Rustici, Robert; "Enhanced CU-SeeMe"1995, Zero in Technologies, Inc.
White Pine Software; "CU-SeeMe Pro: Quick Start Guide"; Version 4.0 for Windows; 1999.
"CU-SeeMe Reflector"; www.geektimes.com/michael/CU-SeeMe/faqs/reflectors.html; accessed on Dec. 2, 2008.
Daniels, et al.; "Citrix WinFrame 1.6 Beta"; May 1, 1996; license.icopyright.net/user/downloadLicense.act?lic=3.7009-9123; accessed Dec. 2, 2008.
Held, et al.; "Data Compression"; Third Edition; John Wiley & Sons Ltd.; 1991.
Data Compression Applications and Innovations Workshop; Proceedings of a Workshop held in Conjunction with the IEEE Data Compression Conference; Snowbird, Utah; Mar. 31, 1995.
Britton, et al.; "Discovery Desktop Conferencing with NetMeeting 2.0"; IDG Books Worldwide, inc.; 1997.
Sattler, Michael; "Internet Tv with Cu-SeeMe"; Sams.Net Publishing; 1995; First Edition.
IBM Microelectronics Comdex Fall '93 Booth Location.
Disz, et al.; "Performance Model of the Argonne Voyager Multimedia Server; IEEE; 1997; pp. 316-327.
"Downloading and Installing NetMeeting"; www.w4mq.com/help/h3.htm; accessed on Dec. 2, 2008.
Fox, et al.; "Adapting to Network and Client Variability via On-Demand Dynamic Distillation"; ASPLOS VII; Oct. 1996; pp. 160-170.
Fox, et al.; "Adapting to Network and Client Variation Using Infrastructural Proxies: Lessons and Perceptives"; IEEE Personal Communications, Aug. 1998; pp. 10-19.
Han, et al.; "CU-SeeMe VR Immersive Desktop Teleconferencing"; Department of Computer Science; Cornell University; To appear in ACM Multimedia 1996.
Howard, et al.; "Parallel Lossless Image Compression Using Huffman and Arithmetic Coding"; 1992; pp. 1-9.
Howard, Paul G.; "Text Image Compression Using Soft Pattern Matching"; The Computer Journal; vol. 40, No. 2/3; 1997; pp. 146-156.
Howard, et al.; "The Emerging JBIG2 Standard"; IEEE Transactions on Circuits and Systems for Video Technology, vol. 8, No. 7, Nov. 1998; pp. 838-848.
Craft, D. J.; "A fast hardware data compression algorithm and some algorithmic extensions"; Journal of Research and Development; vol. 42, No. 6, Nov. 1998; pp. 733-745.
"Direct Access Storage Device Compression and Decompression Data Flow"; IBM Technical Disclosure Bulletin; vol. 38, No. 11; Nov. 1995; pp. 291-295.
ICA Timeline, Sep. 24, 2007.
Converse, et al.; "Low Bandwidth X Extension"; Protocol Version 1.0; X Consortium; Dec. 21, 1996.
Magstar and IBM 3590 High Performance Tape Subsystem Technical Guide; Nov. 1996; IBM International Technical Support Organization.
MetaFrame Administration Student Workbook; Jun. 1998; Citrix Professional Courseware; Citrix Systems, Inc.
NCD WinCenter 3.1: Bringing Windows to Every Desktop; 1998.
Overview NetMeeting 2.1; Microsoft Tech Net; technet.microsoft.com/en-us/library/cc767141(printer).aspx; accessed Dec. 2, 2008.
NetMeeting 2.1 Resource Kit; Microsoft TechNet; technet.microsoft.com/en-us/library/cc767142(printer).aspx; accessed on Dec. 2, 2008.
Conferencing Standards: NetMeeeting 2.1 Resource Kit; Microsoft TechNet; technet.microsoft.com/en-us/library/cc767150(printer).aspx; accessed Dec. 2, 2008.
Summers, Bob; "Official Microsoft NetMeeting Book"; Microsoft Press; 1998.
Zebrose, Katherin L. "Iniegrating Hardware Accelerators into Internetworking Switches"; Telco Systems 1994.
Simpson, et al.; "A Multiple Processor Approach to Data Compression"; ACM; 1998; pp. 641-649.
"IBM Technology Products Introduces New Family of High-Performance Data Compression Products"; IBM; Aug. 16, 1993.
ReadMe; PowerQuest Drive Image Pro; Version 3.00; 1994-1999; PowerQuest Corporation; p. 1-6.
Schulzrinne, et al.; "RTP Profile for Audio and Video Conferences with Minimal Control"; Jan. 1996; www.ietf.org/rfc/rfc1890.txt; accessed on Dec. 3, 2008.
Zhu, C.; "RTP Payload Format for H.263 Video Streams"; Standards Track; Sep. 1997; pp. 1-12.
Simpson, W.; "The Point-To-Point Protocol (PPP)"; Standards Track; Jul. 1994; pp. i-52.
Reynolds, et al.; "Assigned Numbers"; Standards Track; Oct. 1994; pp. 1-230.
Deutsch, et al.; "ZLIP Compressed Data Format Specification version 3.3"; Informational; May 1996; p. 1-10.
Deutsch, P.; "DEFLATE Compressed Data Format Specification version 1.3"; Informational; May 1996; pp. 1-15.
Rand, D.; "The PPP Compression Control Protocol (CCP)"; Standards Track; Jun. 1996; pp. 1-9.
Schneider, et al.; "PPP LZS-DCP Compression Protocol (LZS-DCP)"; Informational; Aug. 1996; pp. 1-18.
Friend, et al.; "PPP Stac LZS Compression Protocol"; Informational; Aug. 1996; pp. 1-20.
Schneider, et al.; "PPP for Data Compression in Data Circuit-Terminating Equipment (DCE)"; Informational; Aug. 1996; pp. 1-10.
Atkins, et al.; "PGP Message Exchange Formats"; Informational; Aug. 1996; pp. 1-21.
Castineyra, et al.; "The Nimrod Routing Architecture"; Informational, Aug. 1996; pp. 1-27.
Freed, et al.; "Multipurpose Internet Mail Extensions (MIME) Part Four: Registration Procedures"; Best Current Practice; Nov. 1996; pp. 1-21.
Shacham, et al.; "IP Payload Compression Protocol (IPComp)"; Standards Track; Dec. 1998; pp. 1-10.
Sidewinder 50 Product Manual; Seagate Technology, Inc.; 1997.
IBM RAMAC Virtual Array; IBM; Jul. 1997.
Bruni, et al.; "DB2or OS/390 and Data Compression" IBM Corporation; Nov. 1998.
Smith, Mark; "Thin Client/Server Computing Works"; WindowsITPro; Nov. 1, 1998; pp. 1-13; license.icopyright.net/user/downloadLicense.act?lic=3.7009-8355; accessed Dec. 2, 2008.
International Telecommunication Union; "Information Technology — Digital Compression and Coding of Continuous-Tone Still Images-Requirements and Guidelines"; 1993.
International Telecommunications Union; "Information technology — Lossless and near-lossless compression of continuous-tone still images — Baseline"; 1999.
Davis, Andrew W.; "The Video Answering Machine: Intel ProShare's Next Step"; Advanced Imaging; vol. 12, No. 3; Mar. 1997; pp. 28, 30.
Abbott, Ill, Walter D.; "A Simple, Low Overhead Data Compression Algoithm for Converting Lossy Compression Processes to Lossless"; Naval Postgraduate School Thesis; Dec. 1993.
Thomborson, Clark; "V.42bis and Other Ziv-Lempel Variants"; IEEE; 1991; p. 460.
Thomborson, Cork; "The V.42bis Standard for Data-Compressing Modems"; IEEE; Oct. 1992; pp. 41-53.
Sun, Andrew; "Using and Managing PPP"; O'Reilly & Associates, Inc.; 1999.
"What is the V42bis Standard?"; www.faqs.org/faqs/compression-faq/part1/section-10.html; accessed on Dec. 2, 2008.
"The WSDC Download Guide: Drive Image Professional for DOS, OS/2, and Windows"; wsdcds01.watson.ibm.com/WSDC.nsf/Guides/Download/Applications-DriveImage.htm; Accessed Nov. 22, 1999.
"The WSDC Download Guide: Drive Image Professional"; wsdcds01.watson.ibm.com/wsdc.nsf/Guides/Download/Applications-DirveImage.htm; accessed on May 3, 2001.
APPNOTE_TXT from pkware.txt; Version 6.3.2; PKWARE Inc., 1989.
CU-SeeMe readme.txt; Dec. 2, 1995.
CU-seeme txt from indstate.txt; README.TXT for CU-SeeMe version 0.90b1; Mar. 23, 1997.
Cuseeme txt 19960221.txt; CUSEEME.TXT; Feb. 21, 1996.

Citrix Technology Guide. 1997.
Lettieri, et al.; "Data Compression in the V.42bis Modems"; pp. 398-403. 1990.
High Performance x2/V.34+/V.42bis 56K BPS Plug & Play External Voice/FAX/Data Modem User's Manual. 1997.
H.323 Protocols Suite; www.protocols.com/pbook/h323.htm.
Hoffman, Roy; "Data Compression in Digital Systems"; Chapman & Hall; 1997; Chapter 14, pp. 344-360.
LBX X Consortium Algorithms; rzdocs.uni-hohenheim.de/aix_4.33/ext_doc/usr/share/man/info/en_US/a_doc_lib/x 11...";X11R6 Technical Specifications.
Basics of Images; www.geom.uiuc.edu/events/courses/1996/cmwh/Stills/basics.html.
Parties' Joint Claim Construction and Prehearing Statement Pursuant to P.R. 4-3, filed in *Realtime Data, LLC d/b/a/ IXO v. Packeteer, Inc. et al.*, Civil Action No. 6:08-cv-00144-LED; U.S. District Court for the Eastern District of Texas Feb. 18, 2009.
Declaration of Professor James A. Storer, Ph.D., relating to U.S. Patent No. 6,604,158, Mar. 18, 2009.
Declaration of Professor James A. Storer, Ph.D., relating to U.S. Patent No. 6,601,104, Mar. 18, 2009.
Declaration of Professor James A. Storer, Ph.D., relating to U.S. Patent No. 7,321,937, May 4, 2009.
Declaration of Professor James A. Storer, Ph.D., relating to U.S. Patent No. 6,624,761, May 4, 2009.
Declaration of Professor James A. Storer, Ph.D., relating to U.S. Patent No. 7,378,992, May 20, 2009.
Declaration of Professor James A. Storer, Ph.D., relating to U.S. Patent No. 7,161,506, May 26, 2009.
"Video Coding for Low Bit Rate Communication", International Telecommunication Union (ITU),Recommendation H.263, § 3.4 (Mar. 1996).
Official Order Granting Request for Inter Partes Reexamination of U.S. Pat. No. 6,624,761, Control No. 95/000,464, issued Jul. 24, 2009, 29 pgs.
Non-Final Office Action in Inter Partes Reexamination of U.S. Pat. No. 6,624,761, Control No. 95/000,464, issued Dec. 15, 2009, 20 pgs.
Response to Office Action in Inter Partes Reexamination of U.S. Pat. No. 7,321,937, Control No. 95/000,466, filed Oct. 13, 2009, 26 pgs.
Response to Office Action in Inter Partes Reexamination of U.S. Pat. No. 7,321,937, Control No. 95/000,466, filed Aug. 24, 2009, 39 pgs.
Non-Final Office Action in Inter Partes Reexamination of U.S. Pat. No. 7,321,937, Control No. 95/000,466, issued Jun. 22, 2009, 11 pgs.
Official Order Granting Request for Inter Partes Reexamination of U.S. Pat. No. 7,321,937, Control No. 95/000,466, issued Jun. 22, 2009, 16 pgs.
Official Action Closing Prosecution for Inter Partes Reexamination of U.S. Pat. No. 7,321,937, Control No. 95/000,466, issued Dec. 22, 2009, 12 pgs.
Comments by Third Party Requester to Patent Owner's Response Inter Partes Reexamination of U.S. Patent No. 7,321,937, Control No. 95/000,466, filed Nov. 10, 2009, 30 pgs.
Supplemental Declaration of Professor James A. Storer, Ph.D. under 37 C.F.R. §1.132 in Inter Partes Reexamination of U.S. Patent No. 7,321,937, Control No. 95/000,466, executed on Nov. 10, 2009, 16 pgs.
Examiner Interview Summary in Ex Parte Reexamination of U.S. Pat. No. 6,601,104, Control No. 90/009,428, issued Dec. 3, 2009, 3 pgs.
Response to Office Action in Ex Parte Reexamination of U.S. Pat. No. 6,601,104, Control No. 90/009,428, filed Dec. 28, 2009, 13 pgs.
Non-Final Office Action in Ex Parte Reexamination of U.S. Pat. No. 6,601,104, Control No. 90/009,428, issued Nov. 2, 2009, 13 pgs.
Official Order Granting Request for Ex Parte Reexamination of U.S. Pat. No. 6,601,104, Control No. 90/009,428, issued Jun. 1, 2009, 12 pgs.
Declaration of Dr. George T. Ligler under 37 C.F.R. §1.132 in Ex Parte Reexamination of U.S. Pat. No. 6,601,104, Control No. 90/009,428, executed Dec. 28, 2009 16 pgs.
Supplementary Declaration of Dr. George T. Ligler under 37 C.F.R. §1.132 in Ex Parte Reexamination of U.S. Pat. No. 6,601,104, Control No. 90/009,428, executed Dec. 30, 2009 1 pg.

Declaration of Dr. George T. Ligler under 37 C.F.R. §1.132 in Inter Partes Reexamination of U.S. Pat. No. 7,321,937, Control No. 95/000,466, executed Aug. 24, 2009 16 pgs.
Official Order Granting Request for Inter Partes Reexamination of U.S. Pat. No. 7,161,506, Control No. 95/000,479, issued Aug. 14, 2009, 41 pgs.
Non-Final Office Action in Inter Partes Reexamination of U.S. Pat. No. 7,161,506, Control No. 95/000,479, issued Dec. 15, 2009, 37 pgs.
Official Order Granting Request for Inter Partes Reexamination of U.S. Pat. No. 7,378,992, Control No. 95/000,478, issued Aug. 13, 2009, 60 pgs.
Non-Final Office Action in Inter Partes Reexamination of U.S. Pat. No. 7,378,992, Control No. 95/000,478, issued Dec. 15, 2009, 27 pgs.
Official Order Granting Request for Inter Partes Reexamination of U.S. Pat. No. 6,604,158 Control No. 95/000,486, issued Aug. 14, 2009, 35 pgs.
Non-Final Office Action in Inter Partes Reexamination of U.S. Pat. No. 6,604,158, Control No. 95/000,486, issued Nov. 12, 2009, 199 pgs.
Expert Report of Dr. James A. Storer on Invalidity filed on behalf of some of the defendants [Includes Appendices - Exhibits A-K (Exhibit A has been redacted pursuant to a protective order)] filed in *Realtime Data, LLC d/b/a/IXO v. Packeteer, Inc. et al.*, Civil Action No. 6:08-cv-00144-LED; U.S. District Court for the Eastern District of Texas, Jun. 10, 2009, 1090 pgs.
Supplementary Expert Report of Dr. James A. Storer on Invalidity filed on behalf of some of the defendants [Includes Appendices - Exhibits 1-8] filed in *Realtime Data, LLC d/b/a/IXO v. Packeteer, Inc. et al.*, Civil Action No. 6:08-cv-00144-Led; U.S. District Court for the Eastern District of Texas, Jun. 19, 2009, 301 pgs.
Expert Report of James B. Gambrel on Inequitable Conduct filed on behalf of some of the defendants [Includes Appendices - Exhibits A-I] filed in *Realtime Data, LLC d/b/a/IXO v. Packeteer, Inc. et al.*, Civil Action No. 6:08-cv-00144-Led; U.S. District Court for the Eastern District of Texas, Jun. 10, 2009, 199 pgs.
Report and Recommendation of United States Magistrate Judge on Motion for Partial Summary Judgment issued on Jun. 23, 2009, in *Realtime Data, LLC d/b/a/IXO v. Packeteer, Inc. et al.*, Civil Action No. 6:08-cv-00144-Led; U.S. District Court for the Eastern District of Texas, 22 pgs.
Order Adopting Report and Recommendation of United States Magistrate Judge, *Realtime Data, LLC D/B/A Ixo v. Packeteer, Inc., et al.*, District Court for the Eastern District of Texas, No. 6:08cv144, Aug. 24, 2009, 2 pgs.
Opinion and Order of United States Magistrate Judge regarding Claim Construction, *Realtime Data, LLC D/B/A Ixo v. Packeteer, Inc., et al.*, District Court for the Eastern District of Texas, No. 6:08cv144, issued Jun. 22, 2009, 75 pgs.
Script for Defendants' Joint Claim Construction Technology Tutorial Presented to the Magistrate Judge in *Realtime Data, LLC d/b/a/IXO v. Packeteer, Inc. et al.*, Civil Action No. 6:08-cv-00144-LED; U.S. District Court for the Eastern District of Texas, no date on document, 95 pgs.
Script for Realtimes' Technology Tutorial Presented to the Magistrate Judge in *Realtime Data, LLC d/b/a/IXO v. Packeteer, Inc. et al.* Civil Action No. 6:08-cv00144-LED; U.S. District Court for the Eastern District of Texas, Mar. 16, 2009, 69 pgs.
Opinion and Order of United States Magistrate Judge regarding Plaintiffs Motion to Strike Unauthorized New Invalidity Theories from Defendant Citrix's Opening and Reply Briefs in Support of its Motion for Summary Judgment of Invalidity, *Realtime Data, LLC D/B/A Ixo v. Packeteer, Inc., et al.*, District Court for the Eastern District of Texas, No. 6:08cv144, issued Dec. 8, 2009, 10 pgs.
Declaration of Patrick Gogerty, *Realtime Data, LLC D/B/A Ixo v. Packeteer, Inc., et al.*, District Court for the Eastern District of Texas, No. 6:08cv144, executed May 8, 2009, 3 pgs.
Defendant Citrix Systems, Inc.'s Notice Pursuant to 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 7 pgs.

Blue Coat Defendants' Notice Pursuant to 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 7 pgs.

Expand Networks' 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 4 pgs.

Expand Networks' 35 U.S.C. Section 282 Disclosures (Amended), *Realtime Data, LLC D/B/A Ixo v. Packeteer, Inc., et al.*, District Court for the Eastern District of Texas, No. 6:08cv144, filed Dec. 11, 2009, 5 pgs.

Defendant Citrix Systems, Inc.'s Notice of Obviousness Combinations Pursuant to Court Order, *Realtime Data, LLC D/B/A Ixo v. Packeteer, Inc., et al.*, District Court for the Eastern District of Texas, No. 6:08cv144, filed Dec. 11, 2009, 3 pgs.

Order of United States Magistrate Judge regarding Motion to Limit the Number of Prior Art References to be Asserted at Trail, *Realtime Data, LLC D/B/A Ixo v. Packeteer, Inc., et al.*, District Court for the Eastern District of Texas, No. 6:08cv144, filed Dec. 21, 2009, 6 pgs.

Expand Defendants' Notice of Obviousness Combinations Pursuant to Court Order, *Realtime Data, LLC D/B/A Ixo v. Packeteer, Inc., et al.*, District Court for the Eastern District of Texas, No. 6:08cv144, filed Dec. 22, 2009, 3 pgs.

Blue Coat Systems, Inc. and 7-Eleven, Inc.'s Notice of Obviousness Combinations to be Used at Trial, *Realtime Data, LLC D/B/A Ixo v. Packeteer, Inc., et al.*, District Court for the Eastern District of Texas, No. 6:08cv144, filed Dec. 22, 2009, 30 pgs.

Defendant Citrix Systems, Inc's Notice of Other Prior Art References Within the Scope of the References Discussed at the Dec. 17, 2009 Hearing, *Realtime Data, LLC D/B/A Ixo v. Packeteer, Inc., et al.*, District Court for the Eastern District of Texas, No. 6:08cv144, filed Dec. 29, 2009, 6 pgs.

Docket Listing downloaded Jan. 4, 2010 for *Realtime Data, LLC D/B/A Ixo v. Packeteer, Inc., et al.*, District Court for the Eastern District of Texas, No. 6:08cv144, filed Apr. 18, 2008, 161 pgs.

Preliminary Data Sheet, 9600 Data Compressor Processor, Hi/fn, 1997-99, HIFN 000001-68, 68 pgs.

Data Sheet, 9751 Data Compression Processor, 1997-99, HIFN 000069-187, 119 pgs.

Signal Termination Guide, Application Note, Hi/fn, 1997-98, HIFN 000188-194, 7 pgs.

How LZS Data Compression Works, Application Note, Hi/fn, 1997-99, HIFN 000195-207, 13 pgs.

Reference Hardware, 9751 Compression Processor, Hi/fn, 1997-99, HIFN 000208-221, 14 pgs.

Using 9751 in Big Endian Systems, Application Note, Hi/fn, 1997-99, HIFN 000222-234, 13 pgs.

Specification Update, 9751 Compression Processor, Hi/fn, 1997-2000, HIFN 000235-245, 11 pgs.

9732AM Product Release, Hi/fn, 1994-99, HIFN 000246-302, 57 pgs.

Data Sheet, 9732A Data Compression Processor, Hi/fn, 1997-99, HIFN 000303-353, 51 pgs.

9711 to 7711 Migration, Application Note, Hi/fn, 1997-99, HIFN 000354-361, 8 pgs.

Specification Update, 9711 Data Compression Processor, Hi/fn, 1997-99, HFIN 000362-370, 9 pgs.

Differences Between the 9710 & 9711 Processors, Application Note, Hi/fn, 1997-99, HIFN 000371-77, 7 pgs.

Specification Update, 9710 Data Compression Processor, Hi/fn, 1997-99, HIFN 000378-388, 11 pgs.

9706/9706A Data Compression Coprocessor Data Sheet, Stac Electronics, 1991-97, HIFN 000389-473, 85 pgs.

9705/9705A Data Compression Coprocessor, Stac Electronics, 1988-96, HIFN 000474-562, 88 pgs.

9705/9705A Data Compression Coprocessor Data Sheet, Stac Electronics, 1988-96, HIFN 000563-649, 87 pgs.

9700/9701 Compression Coprocessors, Hi/fn, 1997, HIFN 000650-702, 53 pgs.

Data Sheet 9610 Data Compression Processor, Hi/fn, 1997-98, HIFN 000703-744, 42 pgs.

Specification Update 9610 Data Compression Processor, Hi/fn, 1997-99, HIFN 000745-751, 7 pgs.

9705 Data Compression Coprocessor, Stac Electronics, 1988-92, HIFN 000752-831, 80 pgs.

9705 Network Software Design Guide, Application Note, Stac Electronics, 1990-91, HIFN 000832-861, 30 pgs.

Data Sheet 9601 Data Compression Processor, Hi/fn, May 21, 1998, HIFN 000862-920, 59 pgs.

7751 Encryption Processor Reference Kit, Hi/fn, Apr. 1999, HIFN 000921-1114, 194 pgs.

Hardware Data Book, Hi/fn, Nov. 1998, HIFN 001115-1430, 316 pgs.

Data Compression Data Book, Hi/fn, Jan. 1999, HIFN 001431-1889, 459 pgs.

Reference Software 7751 Encryption Processor, Hi/fn, Nov. 1998, HIFN 002164-2201, 38 pgs.

Interface Specification for Synergize Encoding/Decoding Program, JPB, Oct. 10, 1997, HIFN 002215-2216, 2 pgs.

Anderson, Chip, Extended Memory Specification Driver, 1998, HIFN 002217-2264, 48 pgs.

Whiting, Doug, LZS Hardware API, Mar. 12, 1993, HIFN 002265-68, 4 pgs.

Whiting, Doug, Encryption in Sequoia, Apr. 28, 1997, HIFN 002309-2313, 5 pgs.

LZS221-C Version 4 Data Compression Software, Data Sheet, Hi/fn, 1994-97, HIFN 002508-2525, 18 pgs.

eXtended Memory Specification (XMS), ver. 2.0, Microsoft, Jul. 19, 1988, HIFN 002670-2683, 14 pgs.

King, Stanley, Just for Your Info—From Microsoft 2, May 4, 1992,HIFN 002684- 2710, 27 pgs.

eXtended Memory Specification (XMS), ver. 2.0, Microsoft, Jul. 19, 1988, HIFN 002711-2724, 14 pgs.

Advanced LZS Technology (ALZS), Whitepaper, Hi/fn, Jun. 1, 1998, HIFN 002725-2727, 3 pgs.

Secure Tape Technology (STT) Whitepaper, Hi/fn, Jun. 1, 1998, HIFN 002728-2733, 6 pgs.

SSLRef 3.0 Api Details, Netscape, Nov. 19, 1996, HIFN 002734-2778, 45 pgs.

LZS221-C Version 4 Data Compression Software Data Sheet , Hi/fn, 1994-97, HIFN 002779-2796, 18 pgs.

MPPC-C Version 4 Data Compression Software Data Sheet, Hi/fn, 1994-1997, HIFN 002797-2810, 14 pgs.

Magstar MP Hardware Reference B Series Models Document GA32-0365-01, 1996-1997, [IBM_1_601 pp. 1-338], 338 pages.

Magstar MP 3570 Tape Subsystem, Operator Guide, B-Series Models, 1998- 1999, [IBM_1_601 pp. 339-525], 187 pages.

Preview, IBM Magstar 3590 Tape System Enhancements, Hardware Announcement, Feb. 16, 1999, [IBM_1_601 pp. 526-527], 2 pgs.

New IBM Magstar 3590 Models E11 and E1A Enhance Tape Drive Performance, Hardware Announcement, Apr. 20, 1999, [IBM_1_601 pp. 528-540] 13 pgs.

New IBM Magstar 3590 Model A60 Dramatically Enhances Tape Drive Performance, Hardware Announcement Jul. 27, 1999, [IBM_1_601 pp. 541550] 10 pgs.

The IBM Magstar Mp Tape Subsystem Provides Fast Access to Data, Sep. 3, 1996, Announcement No. 196-176, [IBM_1_601 pp. 551-563] 13 pgs.

IBM 3590 High Performance Tape Subsystem, Apr. 10, 1995, Announcement 195-106, [IBM_1_601 pp. 564-581] 18 pgs.

Standard ECMA-222 (Jun. 1995): ECMA — Standardizing Information and Communications Systems, Adaptive Lossless Data Compression Algorithm, [IBM_1_601 pp. 564-601] 38 pgs.

IBM 3590 and 3494 Revised Availability, Hardware Announcement Aug. 8, 1995, [IBM_743_1241 pp. 1] 1 pg.

Direct Delivery of IBM 3494, 3466, and 3590 Storage Products, Hardware Announcement, Sep. 30, 1997, Announcement 197-297, [IBM_743_1241 pp. 2-3] 2 pgs.

IBM Magstar 3590 Enhances Open Systems, Hardware Announcement Feb. 9, 1996, Announcement 198-014, [IBM_743_1241 pp. 4-7] 4 pgs.

Hardware Withdrawal: IBM Magstar 3590 A00 Controller — Replacement Available, Announcement No. 197-267, Withdrawal Announcement, Dec. 9, 1997, [IBM_743_1241 p. 9] 1 pg.

IBM Magstar 3590 Tape Subsystem, Introduction and Planning Guide, Document No. GA32-0329007, [IBM_743_1241 pp. 10-499] 490 pgs.

NetMeeting 2.0 Reviewers Guide, Apr. 1997, [MSCS_298_339] 42 pgs.

Microsoft NetMeeting Compatible Products and Services Directory, Apr. 1997, [MSCS_242297] 56 pgs.

Microsoft NetMeeting "Try This!" Guide, 1997, [MSCS_340_345] 6 pgs.

The Professional Companion to NetMeeting 2 — the Technical Guide to Installing, Configuring, and Supporting NetMeeting 2.0 in Your Organization -Microsoft NetMeeting 2.0, 1996-97, [MSCS_2_241] 240 pgs.

CUSeeMe 3.1.2 User Guide, Nov. 1998, [RAD_1_220] 220 pgs.

MeetingPoint Conference Server Users Guide 3.0, Nov. 1997, [RAD_221_548] 328 pgs.

MeetingPoint Conference Server Users Guide 4.0.2, Dec. 1999, [RAD_549_818] 270 pgs.

MeetingPoint Conference Service Users Guide 3.5.1, Dec. 1998, [RAD_819_1062] 244 pgs.

Enhanced CUSeeMe — Authorized Guide, 1995-1996, [RAD_1063_1372] 310 pgs.

Meeting Point Reader File, Jun. 1999, [RAD_1437_1445] 9 pgs.

Press Release - White Pine Announces Launch of MeetingPoint Conferences Server, Oct. 9, 1997, [RAD_1738_1739] 2 pgs.

Press Release - Leading Network Service Providers Line Up to Support White Pine's Meeting Point Conference Server Technology, Oct. 9, 1997, [RAD_1740_1743] 4 pgs.

BYTE—A New MeetingPoint for Videoconferencing, Oct. 9, 1997, [RAD_1744_1750] 7 pgs.

Notice of Allowance in Commonly-Assigned U.S. Appl. No. 11/651,366, issued Apr. 10, 2009, 7 pgs.

Amendment under 37 C.F.R. §1.132 in Commonly-Assigned U.S. Appl. No. 11/651,366, filed Jul. 30, 2008, 18 pgs.

CCITT Draft Recommendation T.4, RFC 804, Jan. 1981, 12 pgs.

SNA Formats, IBM Corporation, $14^{th}$ Ed., Nov. 1993, 3 pgs.

Munteanu et al, "Wavelet-Based Lossless Compression Scheme with Progressive Transmission Capability," John Wiley & Sons, Inc., Int'l J. Imaging Sys. Tech., vol. 10, (1999) pp. 76-85.

Forchhammer and Jensen, "Data Compression of Scanned Halftone Images," IEEE Trans. Commun., vol. 42, Feb.-Apr. 1994, pp. 1881-1893.

* cited by examiner

DATA COMPRESSION SYSTEMS AND METHODS

CROSS-REFERENCE TO RELATED APPLICATIONS

This application is a Continuation of U.S. patent application Ser. No. 10/668,768, which is a Continuation of U.S. patent application Ser. No. 10/016,355, now U.S. Pat. No. 6,624,761, which is a Continuation-In-Part of U.S. patent application Ser. No. 09/705,446, now U.S. Pat. No. 6,309,424, which is a Continuation of U.S. patent application Ser. No. 09/210,491, now U.S. Pat. No. 6,195,024, each of which is hereby incorporated by reference herein in its entirety.

BACKGROUND

1. Technical Field

The present invention relates generally to a data compression and decompression and, more particularly, to systems and methods for data compression using content independent and content dependent data compression and decompression.

2. Description of Related Art

Information may be represented in a variety of manners. Discrete information such as text and numbers are easily represented in digital data. This type of data representation is known as symbolic digital data. Symbolic digital data is thus an absolute representation of data such as a letter, figure, character, mark, machine code, or drawing.

Continuous information such as speech, music, audio, images and video, frequently exists in the natural world as analog information. As is well known to those skilled in the art, recent advances in very large scale integration (VLSI) digital computer technology have enabled both discrete and analog information to be represented with digital data. Continuous information represented as digital data is often referred to as diffuse data. Diffuse digital data is thus a representation of data that is of low information density and is typically not easily recognizable to humans in its native form.

There are many advantages associated with digital data representation. For instance, digital data is more readily processed, stored, and transmitted due to its inherently high noise immunity. In addition, the inclusion of redundancy in digital data representation enables error detection and/or correction. Error detection and/or correction capabilities are dependent upon the amount and type of data redundancy, available error detection and correction processing, and extent of data corruption.

One outcome of digital data representation is the continuing need for increased capacity in data processing, storage, and transmittal. This is especially true for diffuse data where increases in fidelity and resolution create exponentially greater quantities of data. Data compression is widely used to reduce the amount of data required to process, transmit, or store a given quantity of information. In general, there are two types of data compression techniques that may be utilized either separately or jointly to encode/decode data: lossless and lossy data compression.

Lossy data compression techniques provide for an inexact representation of the original uncompressed data such that the decoded (or reconstructed) data differs from the original unencoded/uncompressed data. Lossy data compression is also known as irreversible or noisy compression. Entropy is defined as the quantity of information in a given set of data. Thus, one obvious advantage of lossy data compression is that the compression ratios can be larger than the entropy limit, all at the expense of information content. Many lossy data compression techniques seek to exploit various traits within the human senses to eliminate otherwise imperceptible data. For example, lossy data compression of visual imagery might seek to delete information content in excess of the display resolution or contrast ratio.

On the other hand, lossless data compression techniques provide an exact representation of the original uncompressed data. Simply stated, the decoded (or reconstructed) data is identical to the original unencoded/uncompressed data. Lossless data compression is also known as reversible or noiseless compression. Thus, lossless data compression has, as its current limit, a minimum representation defined by the entropy of a given data set.

There are various problems associated with the use of lossless compression techniques. One fundamental problem encountered with most lossless data compression techniques are their content sensitive behavior. This is often referred to as data dependency. Data dependency implies that the compression ratio achieved is highly contingent upon the content of the data being compressed. For example, database files often have large unused fields and high data redundancies, offering the opportunity to losslessly compress data at ratios of 5 to 1 or more. In contrast, concise software programs have little to no data redundancy and, typically, will not losslessly compress better than 2 to 1.

Another problem with lossless compression is that there are significant variations in the compression ratio obtained when using a single lossless data compression technique for data streams having different data content and data size. This process is known as natural variation.

A further problem is that negative compression may occur when certain data compression techniques act upon many types of highly compressed data. Highly compressed data appears random and many data compression techniques will substantially expand, not compress this type of data.

For a given application, there are many factors that govern the applicability of various data compression techniques. These factors include compression ratio, encoding and decoding processing requirements, encoding and decoding time delays, compatibility with existing standards, and implementation complexity and cost, along with the adaptability and robustness to variations in-input data. A direct relationship exists in the current art between compression ratio and the amount and complexity of processing required. One of the limiting factors in most existing prior art lossless data compression techniques is the rate at which the encoding and decoding processes are performed. Hardware and software implementation tradeoffs are often dictated by encoder and decoder complexity along with cost.

Another problem associated with lossless compression methods is determining the optimal compression technique for a given set of input data and intended application. To combat this problem, there are many conventional content dependent techniques that may be utilized. For instance, file type descriptors are typically appended to file names to describe the application programs that normally act upon the data contained within the file. In this manner data types, data structures, and formats within a given file may be ascertained. Fundamental limitations with this content dependent technique include:

(1) the extremely large number of application programs, some of which do not possess published or documented file formats, data structures, or data type descriptors;

(2) the ability for any data compression supplier or consortium to acquire, store, and access the vast amounts of data required to identify known file descriptors and associated data types, data structures, and formats; and (3) the rate at which new application programs are developed and the need to update file format data descriptions accordingly.

An alternative technique that approaches the problem of selecting an appropriate lossless data compression technique is disclosed, for example, in U.S. Pat. No. 5,467,087 to Chu entitled "High Speed Lossless Data Compression System" ("Chu"). FIG. 1 illustrates an embodiment of this data compression and decompression technique. Data compression 1 comprises two phases, a data pre-compression phase 2 and a data compression phase 3. Data decompression 4 of a compressed input data stream is also comprised of two phases, a data type retrieval phase 5 and a data decompression phase 6. During the data compression process 1, the data pre-compressor 2 accepts an uncompressed data stream, identifies the data type of the input stream, and generates a data type identification signal. The data compressor 3 selects a data compression method from a preselected set of methods to compress the input data stream, with the intention of producing the best available compression ratio for that particular data type.

There are several limitations associated with the Chu method. One such limitation is the need to unambiguously identify various data types. While these might include such common data types as ASCII, binary, or unicode, there, in fact, exists a broad universe of data types that fall outside the three most common data types. Examples of these alternate data types include: signed and unsigned integers of various lengths, differing types and precision of floating point numbers, pointers, other forms of character text, and a multitude of user defined data types. Additionally, data types may be interspersed or partially compressed, making data type recognition difficult and/or impractical. Another limitation is that given a known data type, or mix of data types within a specific set or subset of input data, it may be difficult and/or impractical to predict which data encoding technique yields the highest compression ratio.

Accordingly, there is a need for a data compression system and method that would address limitations in conventional data compression techniques as described above.

SUMMARY OF THE INVENTION

The present invention is directed to systems and methods for providing fast and efficient data compression using a combination of content independent data compression and content dependent data compression. In one aspect of the invention, a method for compressing data comprises the steps of:

analyzing a data block of an input data stream to identify a data type of the data block, the input data stream comprising a plurality of disparate data types;

performing content dependent data compression on the data block, if the data type of the data block is identified;

performing content independent data compression on the data block, if the data type of the data block is not identified.

In another aspect, the step of performing content independent data compression comprises: encoding the data block with a plurality of encoders to provide a plurality of encoded data blocks; determining a compression ratio obtained for each of the encoders; comparing each of the determined compression ratios with a first compression threshold; selecting for output the input data block and appending a null compression descriptor to the input data block, if all of the encoder compression ratios do not meet the first compression threshold; and selecting for output the encoded data block having the highest compression ratio and appending a corresponding compression type descriptor to the selected encoded data block, if at least one of the compression ratios meet the first compression threshold.

In another aspect, the step of performing content dependent compression comprises the steps of: selecting one or more encoders associated with the identified data type and encoding the data block with the selected encoders to provide a plurality of encoded data blocks; determining a compression ratio obtained for each of the selected encoders; comparing each of the determined compression ratios with a second compression threshold; selecting for output the input data block and appending a null compression descriptor to the input data block, if all of the encoder compression do not meet the second compression threshold; and selecting for output the encoded data block having the highest compression ratio and appending a corresponding compression type descriptor to the selected encoded data block, if at least one of the compression ratios meet the second compression threshold.

In yet another aspect, the step of performing content independent data compression on the data block, if the data type of the data block is not identified, comprises the steps of: estimating a desirability of using of one or more encoder types based one characteristics of the data block; and compressing the data block using one or more desirable encoders.

In another aspect, the step of performing content dependent data compression on the data block, if the data type of the data block is identified, comprises the steps of: estimating a desirability of using of one or more encoder types based on characteristics of the data block; and compressing the data block using one or more desirable encoders.

In another aspect, the step of analyzing the data block comprises analyzing the data block to recognize one of a data type, data structure, data block format, file substructure, and/or file types. A further step comprises maintaining an association between encoder types and data types, data structures, data block formats, file substructure, and/or file types.

In yet another aspect of the invention, a method for compressing data comprises the steps of:

analyzing a data block of an input data stream to identify a data type of the data block, the input data stream comprising a plurality of disparate data types;

performing content dependent data compression on the data block, if the data type of the data block is identified;

determining a compression ratio of the compressed data block obtained using the content dependent compression and comparing the compression ratio with a first compression threshold; and performing content independent data compression on the data block, if the data type of the data block is not identified or if the compression ratio of the compressed data block obtained using the content dependent compression does not meet the first compression threshold.

Advantageously, the present invention employs a plurality of encoders applying a plurality of compression techniques on an input data stream so as to achieve maximum compression in accordance with the real-time or pseudo real-time data rate constraint. Thus, the output bit rate is not fixed and the amount, if any, of permissible data quality degradation is user or data specified.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

Figure 1:
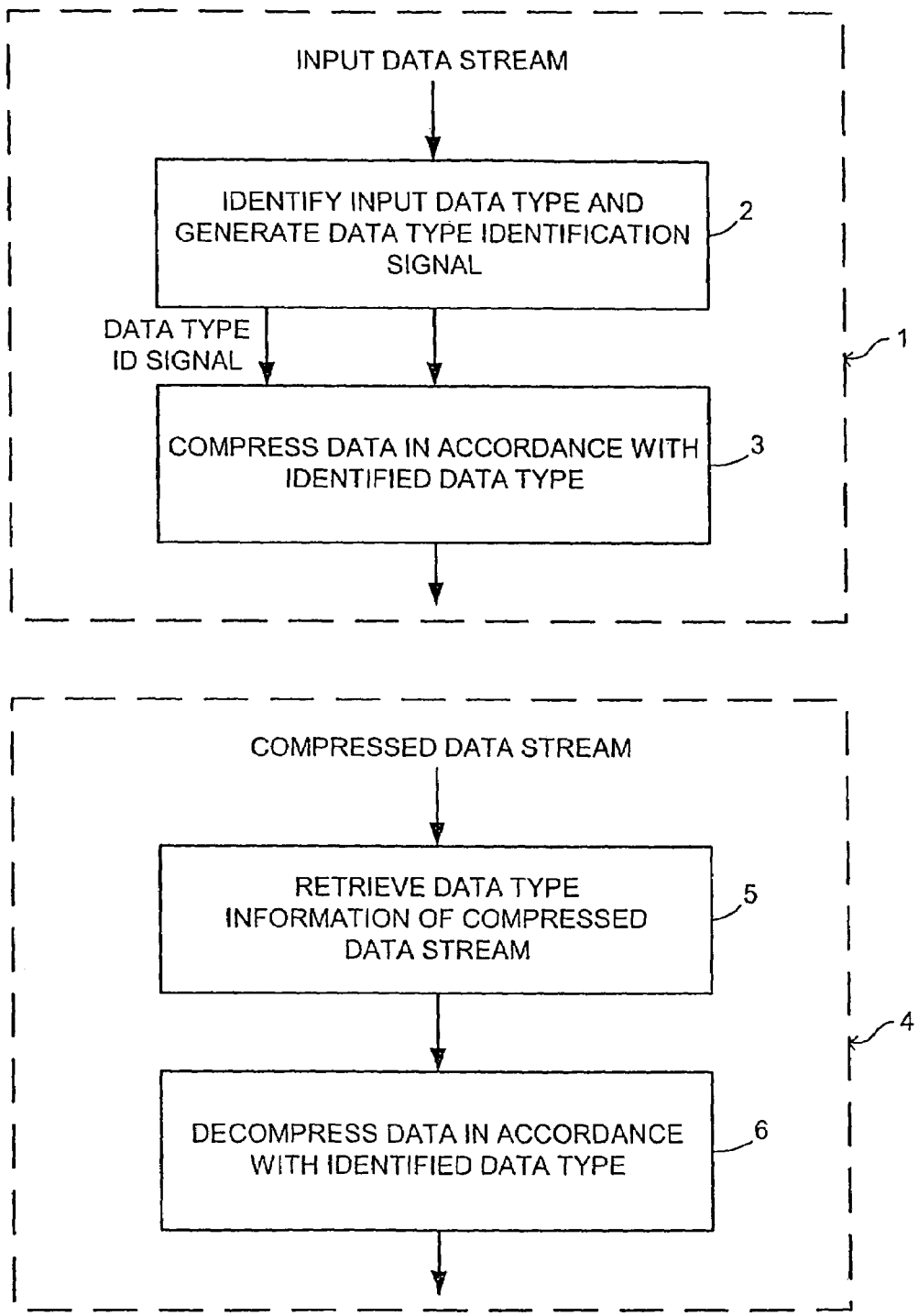
FIG. 1 is a block/flow diagram of a content dependent high-speed lossless data compression and decompression system/method according to the prior art.

The present invention is directed to systems and methods for providing data compression and decompression using content independent and content dependent data compression and decompression. In the following description, it is to be understood that system elements having equivalent or similar functionality are designated with the same reference numerals in the Figures. It is to be further understood that the present invention may be implemented in various forms of hardware, software, firmware, or a combination thereof. In particular, the system modules described herein are preferably implemented in software as an application program that is executable by, e.g., a general purpose computer or any machine or device having any suitable and preferred microprocessor architecture. Preferably, the present invention is implemented on a computer platform including hardware such as one or more central processing units (CPU), a random access memory (RAM), and input/output (I/O) interface(s). The computer platform also includes an operating system and microinstruction code. The various processes and functions described herein may be either part of the microinstruction code or application programs which are executed via the operating system. In addition, various other peripheral devices may be connected to the computer platform such as an additional data storage device and a printing device.

It is to be further understood that, because some of the constituent system components described herein are preferably implemented as software modules, the actual system connections shown in the Figures may differ depending upon the manner in which the systems are programmed. It is to be appreciated that special purpose microprocessors may be employed to implement the present invention. Given the teachings herein, one of ordinary skill in the related art will be able to contemplate these and similar implementations or configurations of the present invention.

Figure 2:
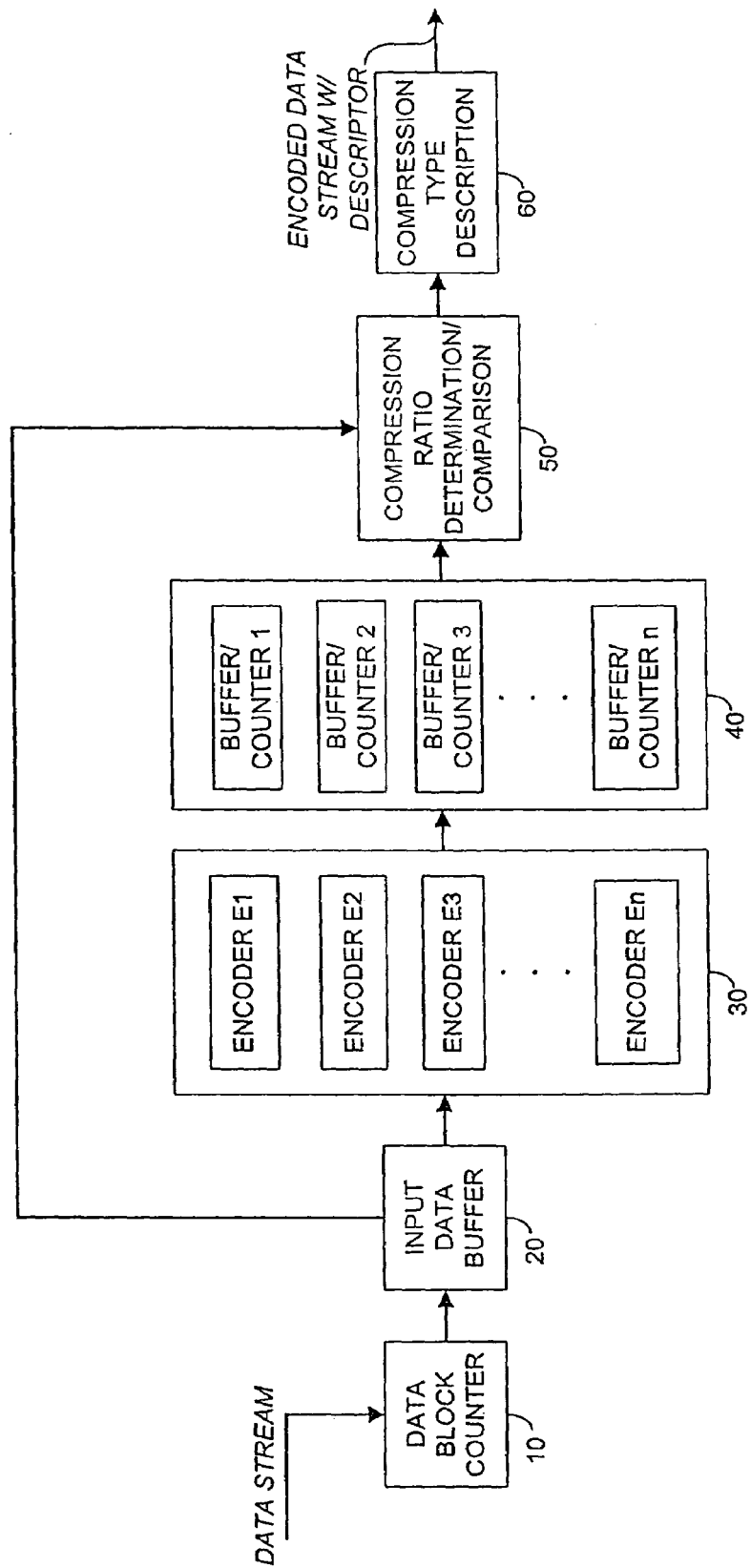
FIG. 2 is a block diagram of a content independent data compression system according to one embodiment of the present invention.

Referring now to FIG. 2 a block diagram illustrates a content independent data compression system according to one embodiment of the present invention. The data compression system includes a counter module 10 that receives as input an uncompressed or compressed data stream. It is to be understood that the system processes the input data stream in data blocks that may range in size from individual bits through complete files or collections of multiple files. Additionally, the data block size may be fixed or variable. The counter module 10 counts the size of each input data block (i.e., the data block size is counted in bits, bytes, words, any convenient data multiple or metric, or any combination thereof).

An input data buffer 20, operatively connected to the counter module 10, may be provided for buffering the input data stream in order to output an uncompressed data stream in the event that, as discussed in further detail below, every encoder fails to achieve a level of compression that exceeds an a priori specified minimum compression ratio threshold. It is to be understood that the input data buffer 20 is not required for implementing the present invention.

An encoder module 30 is operatively connected to the buffer 20 and comprises a set of encoders E1, E2, E3 ... En. The encoder set E1, E2, E3 ... En may include any number "n" of those lossless encoding techniques currently well known within the art such as run length, Huffman, Lempel-Ziv Dictionary Compression, arithmetic coding, data compaction, and data null suppression. It is to be understood that the encoding techniques are selected based upon their ability to effectively encode different types of input data. It is to be appreciated that a full complement of encoders are preferably selected to provide a broad coverage of existing and future data types.

The encoder module 30 successively receives as input each of the buffered input data blocks (or unbuffered input data blocks from the counter module 10). Data compression is performed by the encoder module 30 wherein each of the encoders E1 ... En processes a given input data block and outputs a corresponding set of encoded data blocks. It is to be appreciated that the system affords a user the option to enable/disable any one or more of the encoders E1 ... En prior to operation. As is understood by those skilled in the art, such feature allows the user to tailor the operation of the data compression system for specific applications. It is to be further appreciated that the encoding process may be performed either in parallel or sequentially. In particular, the encoders E1 through En of encoder module 30 may operate in parallel (i.e., simultaneously processing a given input data block by utilizing task multiplexing on a single central processor, via dedicated hardware, by executing on a plurality of processor or dedicated hardware systems, or any combination thereof). In addition, encoders E1 through En may operate sequentially on a given unbuffered or buffered input data block. This process is intended to eliminate the complexity and additional processing overhead associated with multiplexing concurrent encoding techniques on a single central processor and/or dedicated hardware, set of central processors and/or dedicated hardware, or any achievable combination. It is to be further appreciated that encoders of the identical type may be applied in parallel to enhance encoding speed. For instance, encoder E1 may comprise two parallel Huffman encoders for parallel processing of an input data block.

A buffer/counter module 40 is operatively connected to the encoding module 30 for buffering and counting the size of each of the encoded data blocks output from encoder module 30. Specifically, the buffer/counter 30 comprises a plurality of buffer/counters BC1, BC2, BC3 ... BCn, each operatively associated with a corresponding one of the encoders E1 ... En. A compression ratio module 50, operatively connected to the output buffer/counter 40, determines the compression ratio obtained for each of the enabled encoders E1 ... En by taking the ratio of the size of the input data block to the size of the output data block stored in the corresponding buffer/counters BC1 ... BCn. In addition, the compression ratio module 50 compares each compression ratio with an a priori-specified compression ratio threshold limit to determine if at least one of the encoded data blocks output from the enabled encoders E1 ... En achieves a compression that exceeds an a priori-specified threshold. As is understood by those skilled in the art, the threshold limit may be specified as any value inclusive of data expansion, no data compression or expansion, or any arbitrarily desired compression limit. A description module 60, operatively coupled to the compression ratio module 50, appends a corresponding compression type descriptor to each encoded data block which is selected for output so as to indicate the type of compression format of the encoded data block.

Figure 3A:
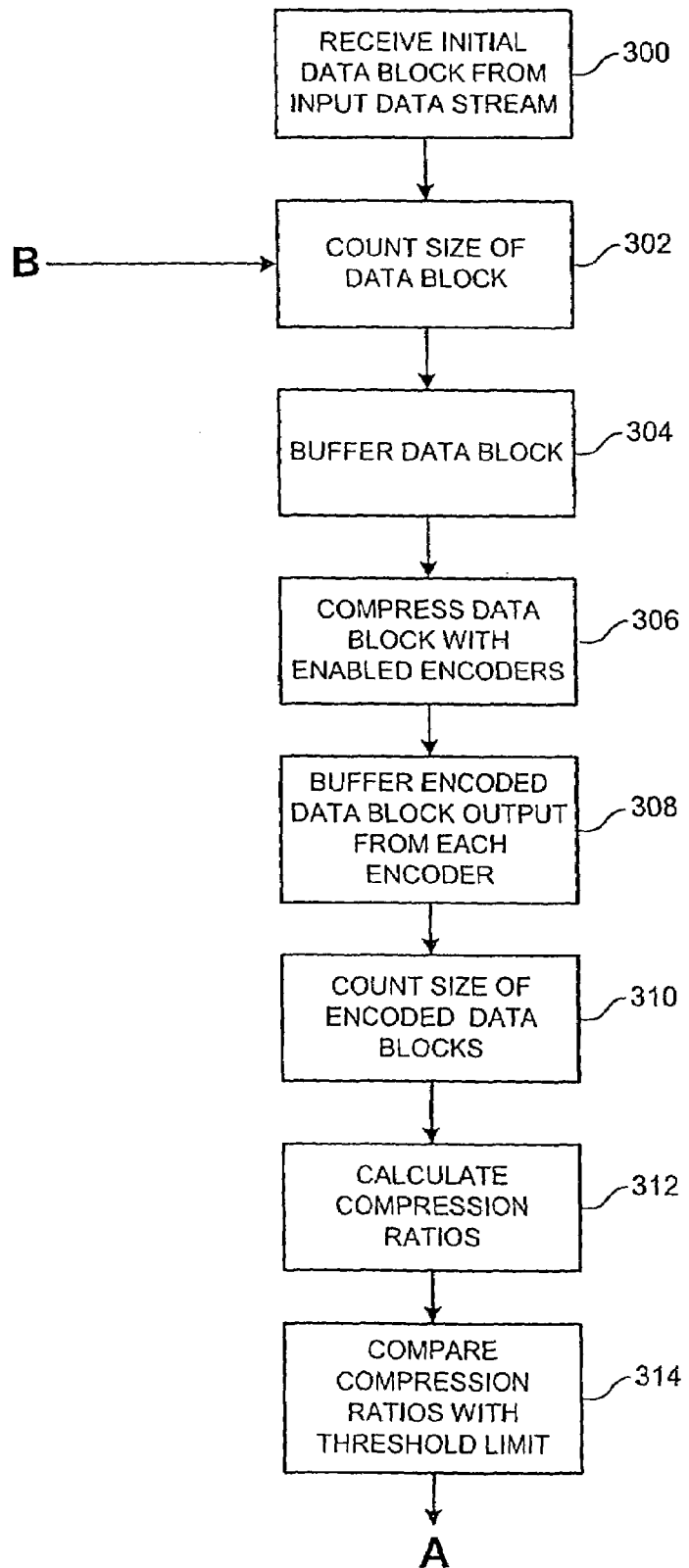
FIGS. 3a and 3b comprise a flow diagram of a data compression method according to one aspect of the present invention, which illustrates the operation of the data compression system of FIG. 2.
Figure 3B:
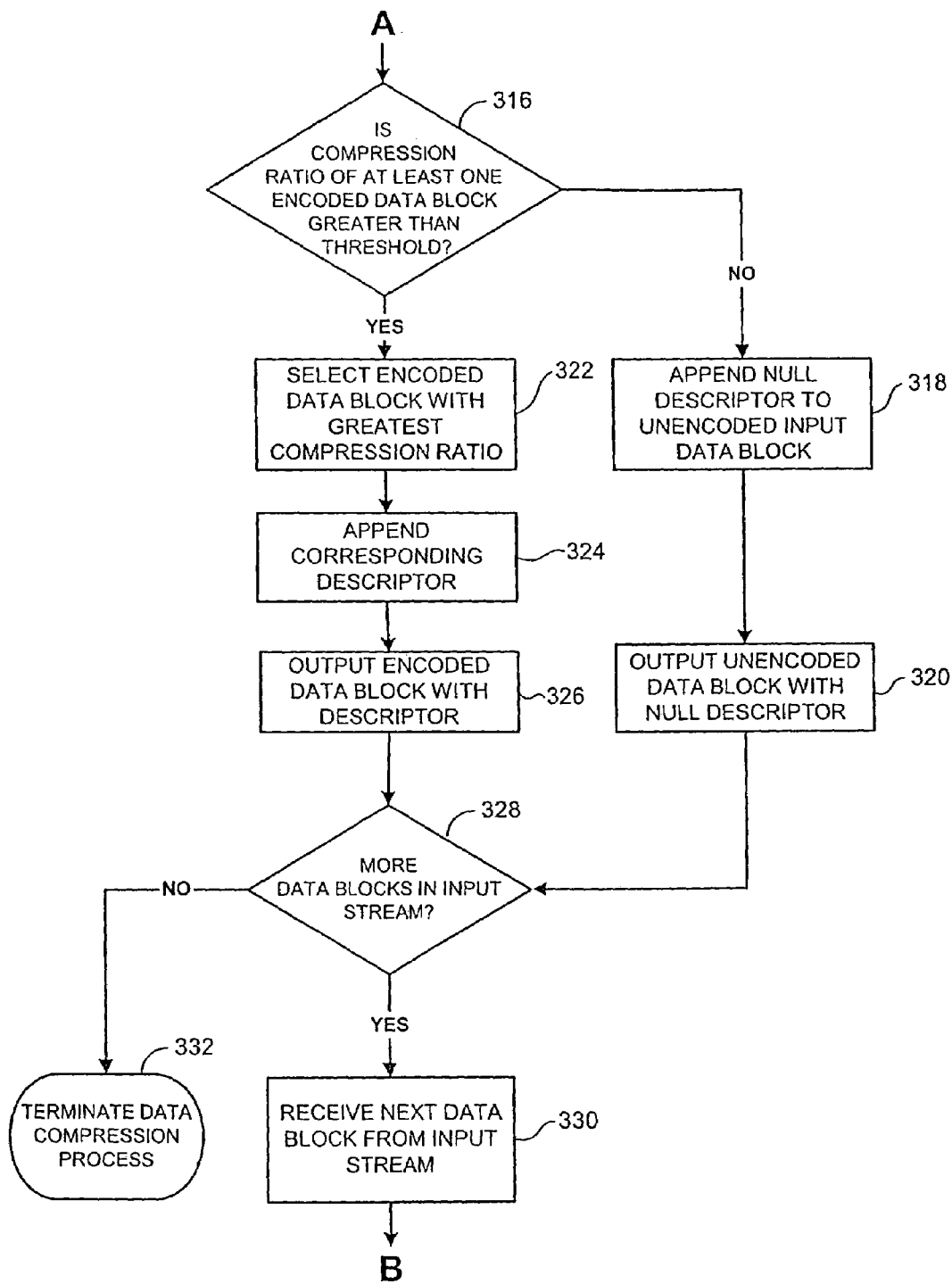

The operation of the data compression system of FIG. 2 will now be discussed in further detail with reference to the flow diagram of FIGS. 3a and 3b. A data stream comprising one or more data blocks is input into the data compression system and the first data block in the stream is received (step 300). As stated above, data compression is performed on a per data block basis. Accordingly, the first input data block in the input data stream is input into the counter module 10 that counts the size of the data block (step 302). The data block is then stored in the buffer 20 (step 304). The data block is then sent to the encoder module 30 and compressed by each (enabled) encoder E1 ... En (step 306). Upon completion of the encoding of the input data block, an encoded data block is output from each (enabled) encoder E1 ... En and maintained in a corresponding buffer (step 308), and the encoded data block size is counted (step 310).

Next, a compression ratio is calculated for each encoded data block by taking the ratio of the size of the input data block (as determined by the input counter 10) to the size of each encoded data block output from the enabled encoders (step 312). Each compression ratio is then compared with an a priori-specified compression ratio threshold (step 314). It is to be understood that the threshold limit may be specified as any value inclusive of data expansion, no data compression or expansion, or any arbitrarily desired compression limit. It is to be further understood that notwithstanding that the current limit for lossless data compression is the entropy limit (the present definition of information content) for the data, the present invention does not preclude the use of future developments in lossless data compression that may increase lossless data compression ratios beyond what is currently known within the art.

After the compression ratios are compared with the threshold, a determination is made as to whether the compression ratio of at least one of the encoded data blocks exceeds the threshold limit (step 316). If there are no encoded data blocks having a compression ratio that exceeds the compression ratio threshold limit (negative determination in step 316), then the original unencoded input data block is selected for output and a null data compression type descriptor is appended thereto (step 318). A null data compression type descriptor is defined as any recognizable data token or descriptor that indicates no data encoding has been applied to the in put data block. Accordingly, the unencoded input data block with its corresponding null data compression type descriptor is then output for subsequent data processing, storage, or transmittal (step 320).

On the other hand, if one or more of the encoded data blocks possess a compression ratio greater than the compression ratio threshold limit (affirmative result in step 316), then the encoded data block having the greatest compression ratio is selected (step 322). An appropriate data compression type descriptor is then appended (step 324). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 326).

After the encoded data block or the unencoded data input data block is output (steps 326 and 320), a determination is made as to whether the input data stream contains additional data blocks to be processed (step 328). If the input data stream includes additional data blocks (affirmative result in step 328), the next successive data block is received (step 330), its block size is counted (return to step 302) and the data compression process in repeated. This process is iterated for each data block in the input data stream. Once the final input data block is processed (negative result in step 328), data compression of the input data stream is finished (step 322).

Since a multitude of data types may be present within a given input data block, it is often difficult and/or impractical to predict the level of compression that will be achieved by a specific encoder. Consequently, by processing the input data blocks with a plurality of encoding techniques and comparing the compression results, content free data compression is advantageously achieved. It is to be appreciated that this approach is scalable through future generations of processors, dedicated hardware, and software. As processing capacity increases and costs reduce, the benefits provided by the present invention will continue to increase. It should again be noted that the present invention may employ any lossless data encoding technique.

Figure 4:
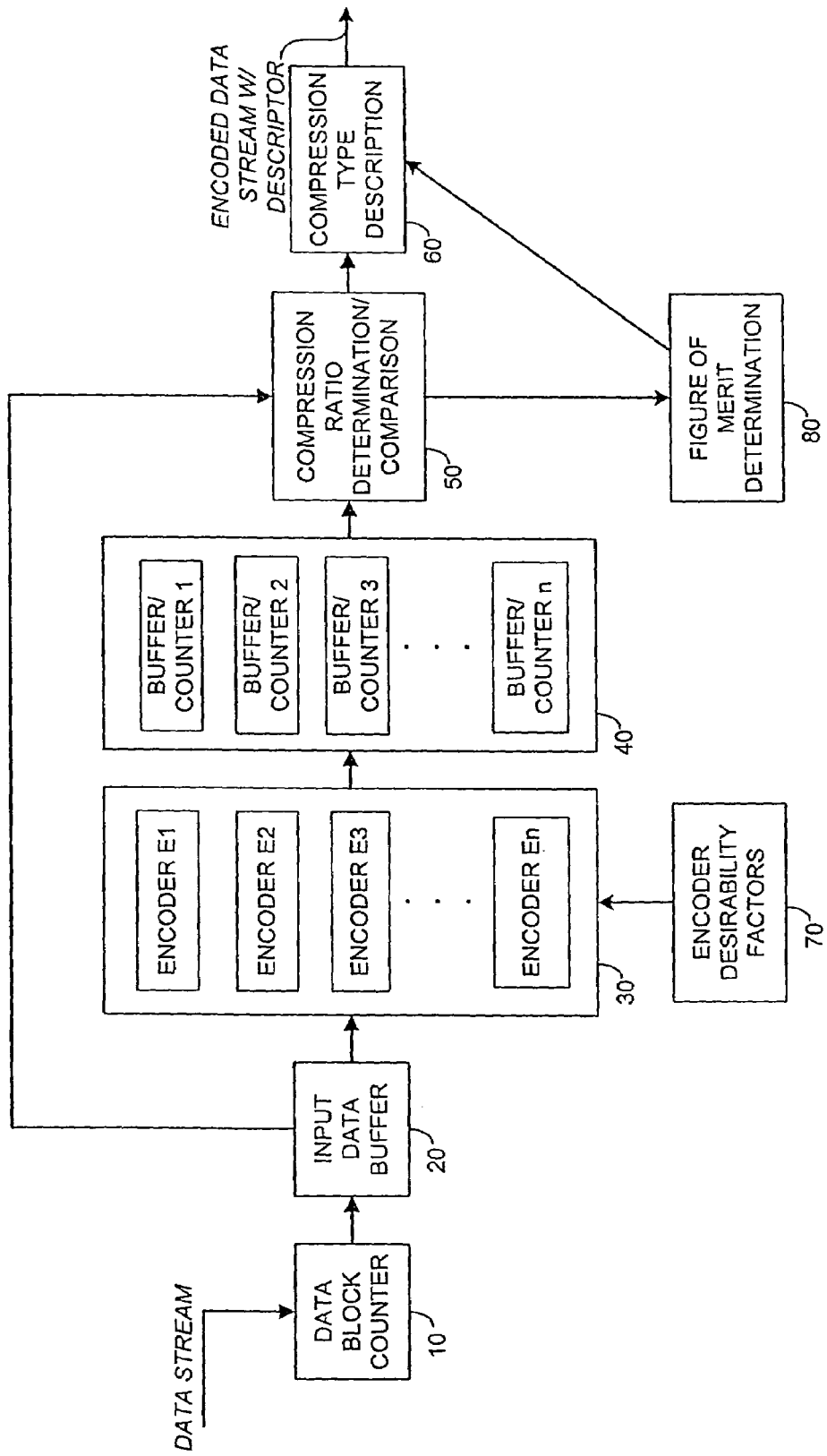
FIG. 4 is a block diagram of a content independent data compression system according to another embodiment of the present invention having an enhanced metric for selecting an optimal encoding technique.

Referring now to FIG. 4, a block diagram illustrates a content independent data compression system according to another embodiment of the present invention. The data compression system depicted in FIG. 4 is similar to the data compression system of FIG. 2 except that the embodiment of FIG. 4 includes an enhanced metric functionality for selecting an optimal encoding technique. In particular, each of the encoders E1 . . . En in the encoder module 30 is tagged with a corresponding one of user-selected encoder desirability factors 70. Encoder desirability is defined as an a priori user specified factor that takes into account any number of user considerations including, but not limited to, compatibility of the encoded data with existing standards, data error robustness, or any other aggregation of factors that the user wishes to consider for a particular application. Each encoded data block output from the encoder module 30 has a corresponding desirability factor appended thereto. A figure of merit module 80, operatively coupled to the compression ratio module 50 and the descriptor module 60, is provided for calculating a figure of merit for each of the encoded data blocks which possess a compression ratio greater than the compression ratio threshold limit. The figure of merit for each encoded data block is comprised of a weighted average of the a priori user specified threshold and the corresponding encoder desirability factor. As discussed below in further detail with reference to FIGS. 5a and 5b, the figure of merit substitutes the a priori user compression threshold limit for selecting and outputting encoded data blocks.

Figure 5A:
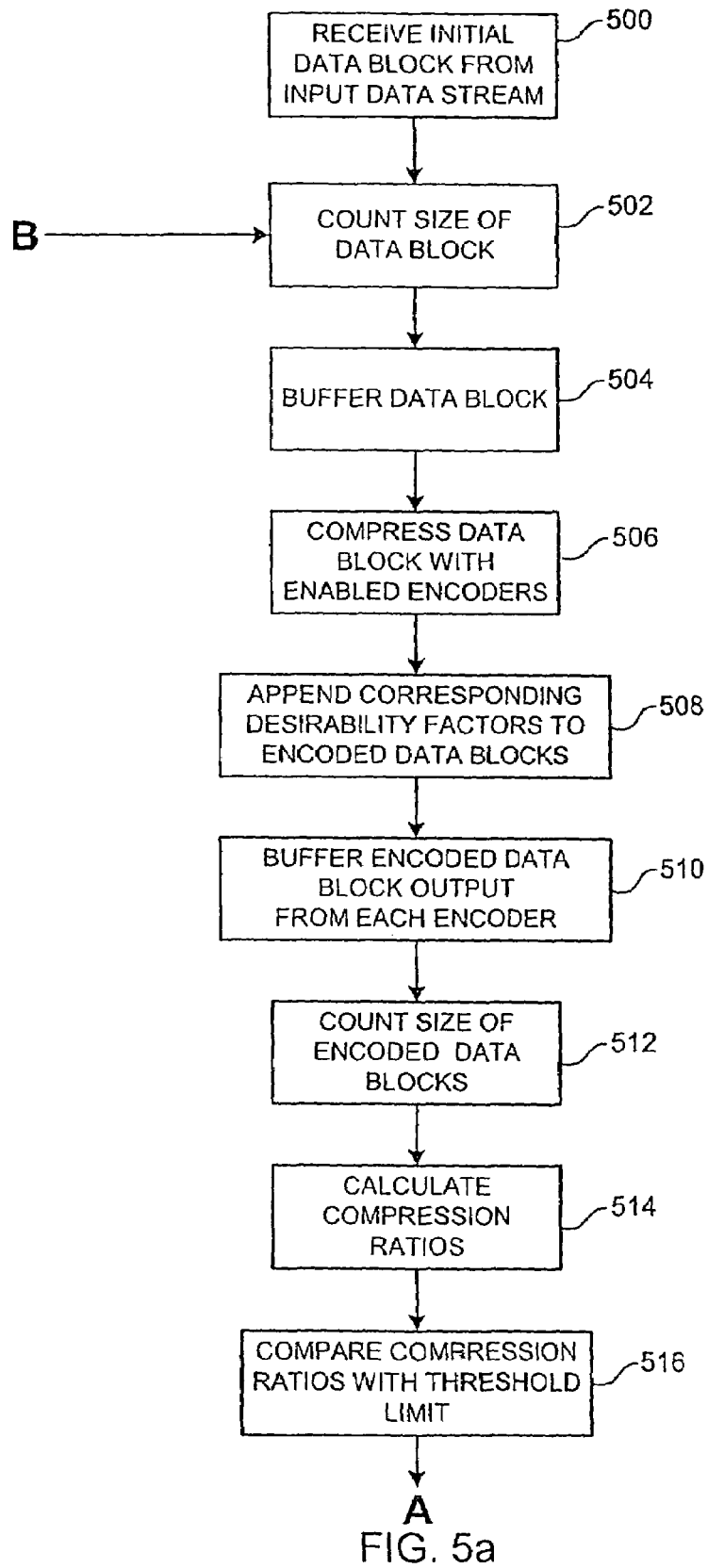
FIGS. 5a and 5b comprise a flow diagram of a data compression method according to another aspect of the present invention, which illustrates the operation of the data compression system of FIG. 4.
Figure 5B:
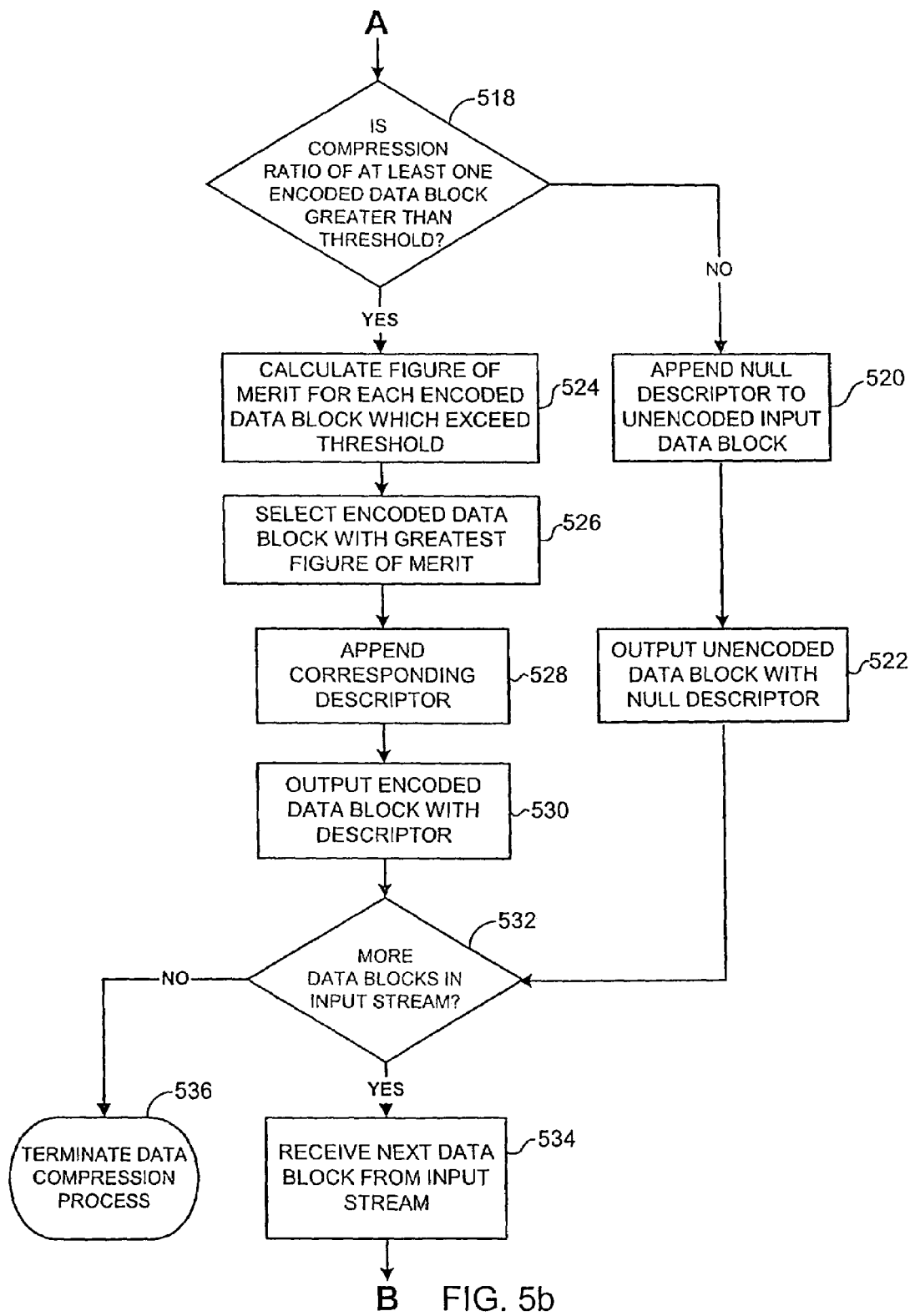

The operation of the data compression system of FIG. 4 will now be discussed in further detail with reference to the flow diagram of FIGS. 5a and 5b. A data stream comprising one or more data blocks is input into the data compression system and the first data block in the stream is received (step 500). The size of the first data block is then determined by the counter module 10 (step 502). The data block is then stored in the buffer 20 (step 504). The data block is then sent to the encoder module 30 and compressed by each (enabled) encoder in the encoder set E1 . . . En (step 506). Each encoded data block processed in the encoder module 30 is tagged with an encoder desirability factor that corresponds the particular encoding technique applied to the encoded data block (step 508). Upon completion of the encoding of the input data block, an encoded data block with its corresponding desirability factor is output from each (enabled) encoder E1 . . . En and maintained in a corresponding buffer (step 510), and the encoded data block size is counted (step 512).

Next, a compression ratio obtained by each enabled encoder is calculated by taking the ratio of the size of the input data block (as determined by the input counter 10) to the size of the encoded data block output from each enabled encoder (step 514). Each compression ratio is then compared with an a priori-specified compression ratio threshold (step 516). A determination is made as to whether the compression ratio of at least one of the encoded data blocks exceeds the threshold limit (step 518). If there are no encoded data blocks having a compression ratio that exceeds the compression ratio threshold limit (negative determination in step 518), then the original unencoded input data block is selected for output and a null data compression type descriptor (as discussed above) is appended thereto (step 520). Accordingly, the original unencoded input data block with its corresponding null data compression type descriptor is then output for subsequent data processing, storage, or transmittal (step 522).

On the other hand, if one or more of the encoded data blocks possess a compression ratio greater than the compression ratio threshold limit (affirmative result in step 518), then a figure of merit is calculated for each encoded data block having a compression ratio which exceeds the compression ratio threshold limit (step 524). Again, the figure of merit for a given encoded data block is comprised of a weighted average of the a priori user specified threshold and the corresponding encoder desirability factor associated with the encoded data block. Next, the encoded data block having the greatest figure of merit is selected for output (step 526). An appropriate data compression type descriptor is then appended (step 528) to indicate the data encoding technique applied to the encoded data block. The encoded data block (which has the greatest figure of merit) along with its corresponding data compression type descriptor is then output for subsequent data processing, storage, or transmittal (step 530).

After the encoded data block or the unencoded input data block is output (steps 530 and 522), a determination is made as to whether the input data stream contains additional data blocks to be processed (step 532). If the input data stream includes additional data blocks (affirmative result in step 532), then the next successive data block is received (step 534), its block size is counted (return to step 502) and the data compression process is iterated for each successive data block in the input data stream. Once the final input data block is processed (negative result in step 532), data compression of the input data stream is finished (step 536).

Figure 6:
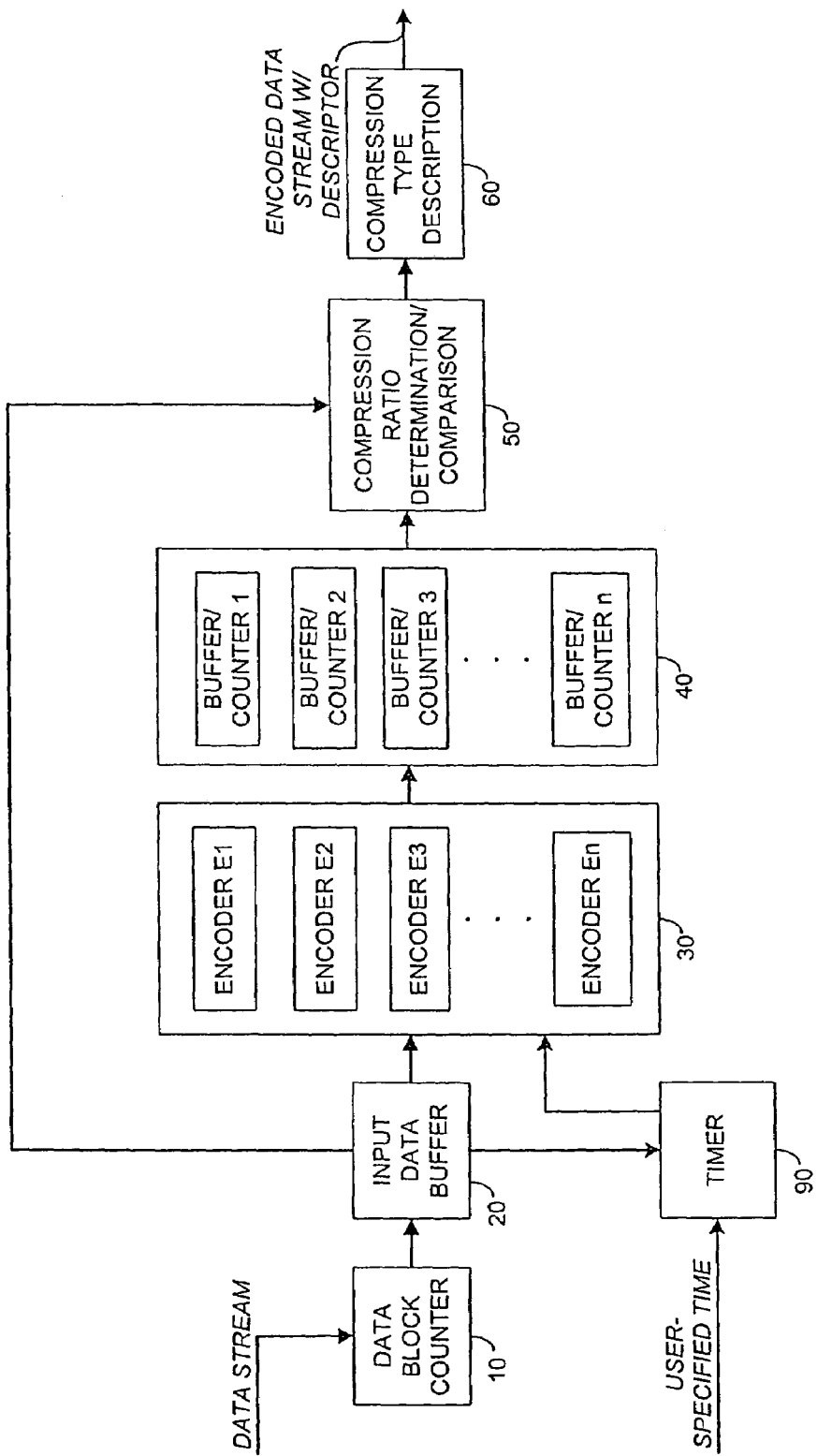
FIG. 6 is a block diagram of a content independent data compression system according to another embodiment of the present invention having an a priori specified timer that provides real-time or pseudo real-time of output data.

Referring now to FIG. 6, a block diagram illustrates a data compression system according to another embodiment of the present invention. The data compression system depicted in FIG. 6 is similar to the data compression system discussed in detail above with reference to FIG. 2 except that the embodiment of FIG. 6 includes an a priori specified timer that provides real-time or pseudo real-time output data. In particular, an interval timer 90, operatively coupled to the encoder module 30, is preloaded with a user specified time value. The role of the interval timer (as will be explained in greater detail below with reference to FIGS. 7a and 7b) is to limit the processing time for each input data block processed by the encoder module 30 so as to ensure that the real-time, pseudo real-time, or other time critical nature of the data compression processes is preserved.

Figure 7A:
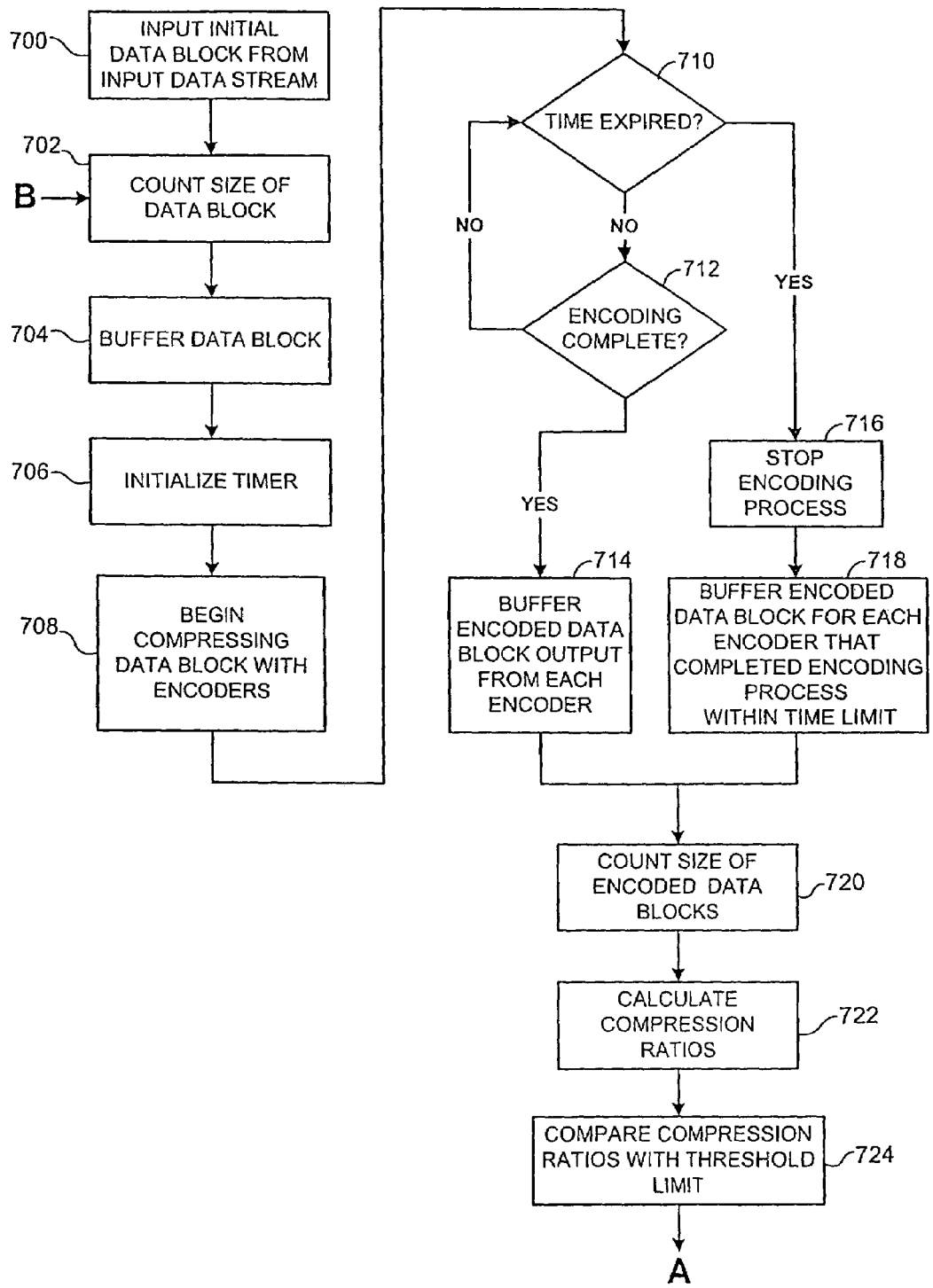
FIGS. 7a and 7b comprise a flow diagram of a data compression method according to another aspect of the present invention, which illustrates the operation of the data compression system of FIG. 6.
Figure 7B:
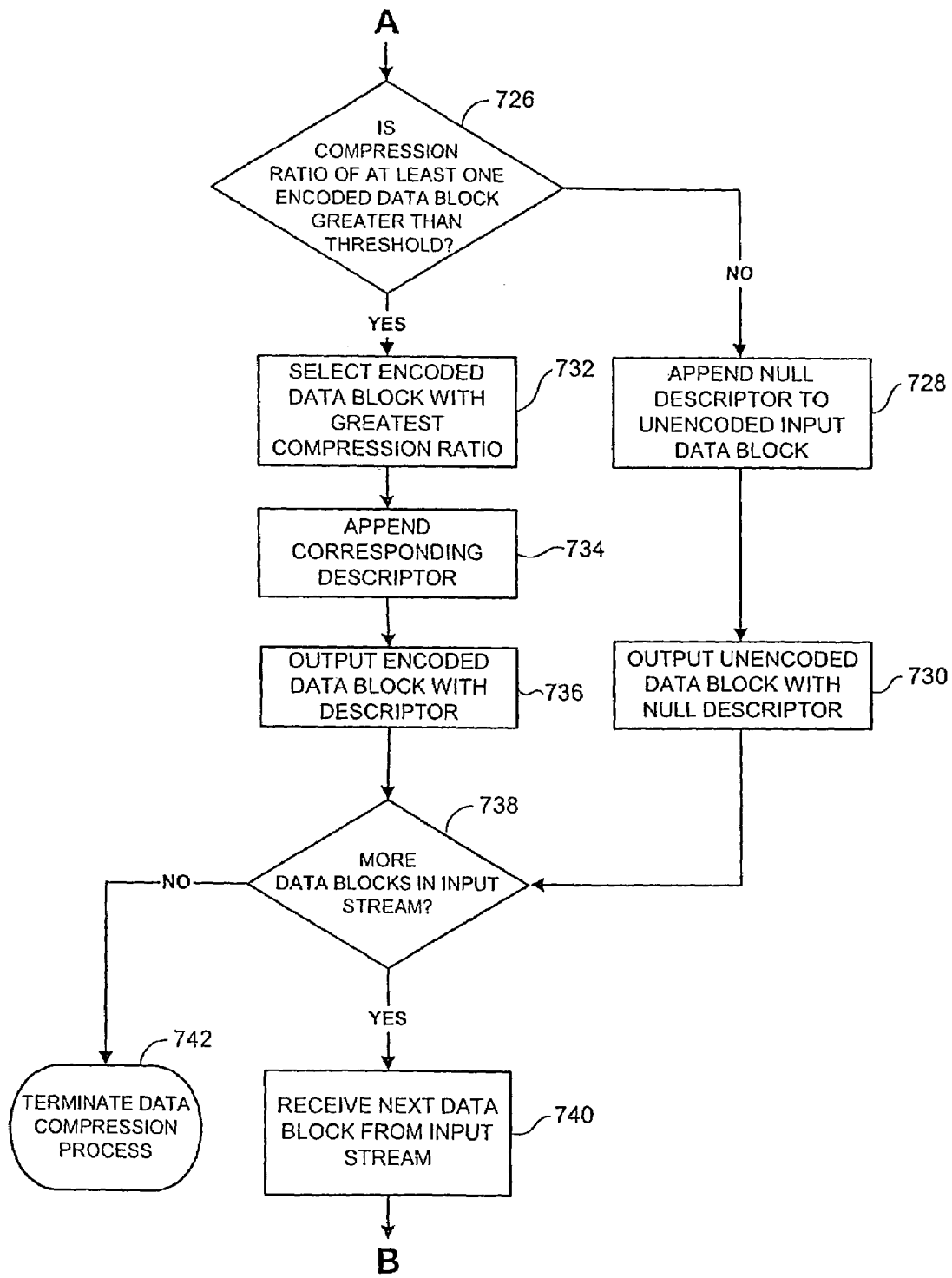

The operation of the data compression system of FIG. 6 will now be discussed in further detail with reference to the flow diagram of FIGS. 7a and 7b. A data stream comprising one or more data blocks is input into the data compression system and the first data block in the data stream is received (step 700), and its size is determined by the counter module 10 (step 702). The data block is then stored in buffer 20 (step 704).

Next, concurrent with the completion of the receipt and counting of the first data block, the interval timer 90 is initialized (step 706) and starts counting towards a user-specified time limit. The input data block is then sent to the encoder module 30 wherein data compression of the data block by each (enabled) encoder E1 . . . En commences (step 708). Next, a determination is made as to whether the user specified time expires before the completion of the encoding process (steps 710 and 712). If the encoding process is completed before or at the expiration of the timer, i.e., each encoder (E1 through En) completes its respective encoding process (negative result in step 710 and affirmative result in step 712), then an encoded data block is output from each (enabled) encoder E1 . . . En and maintained in a corresponding buffer (step 714).

On the other hand, if the timer expires (affirmative result in 710), the encoding process is halted (step 716). Then, encoded data blocks from only those enabled encoders E1 . . . En that have completed the encoding process are selected and maintained in buffers (step 718). It is to be appreciated that it is not necessary (or in some cases desirable) that some or all of the encoders complete the encoding process before the interval timer expires. Specifically, due to encoder data dependency and natural variation, it is possible that certain encoders may not operate quickly enough and, therefore, do not comply with the timing constraints of the end use. Accordingly, the time limit ensures that the real-time or pseudo real-time nature of the data encoding is preserved.

After the encoded data blocks are buffered (step 714 or 718), the size of each encoded data block is counted (step 720). Next, a compression ratio is calculated for each encoded data block by taking the ratio of the size of the input data block (as determined by the input counter 10) to the size of the encoded data block output from each enabled encoder (step 722). Each compression ratio is then compared with an a priori-specified compression ratio threshold (step 724). A determination is made as to whether the compression ratio of at least one of the encoded data blocks exceeds the threshold limit (step 726). If there are no encoded data blocks having a compression ratio that exceeds the compression ratio threshold limit (negative determination in step 726), then the original unencoded input data block is selected for output and a null data compression type descriptor is appended thereto (step 728). The original unencoded input data block with its corresponding null data compression type descriptor is then output for subsequent data processing, storage, or transmittal (step 730).

On the other hand, if one or more of the encoded data blocks possess a compression ratio greater than the compression ratio threshold limit (affirmative result in step 726), then the encoded data block having the greatest compression ratio is selected (step 732). An appropriate data compression type descriptor is then appended (step 734). The encoded data block having the greatest compression ratio along with its corresponding data compression type descriptor is then output for subsequent data processing, storage, or transmittal (step 736).

After the encoded data block or the unencoded input data block is output (steps 730 or 736), a determination is made as to whether the input data stream contains additional data blocks to be processed (step 738). If the input data stream includes additional data blocks (affirmative result in step 738), the next successive data block is received (step 740), its block size is counted (return to step 702) and the data compression process in repeated. This process is iterated for each data block in the input data stream, with each data block being processed within the user-specified time limit as discussed above. Once the final input data block is processed (negative result in step 738), data compression of the input data stream is complete (step 742).

Figure 8:
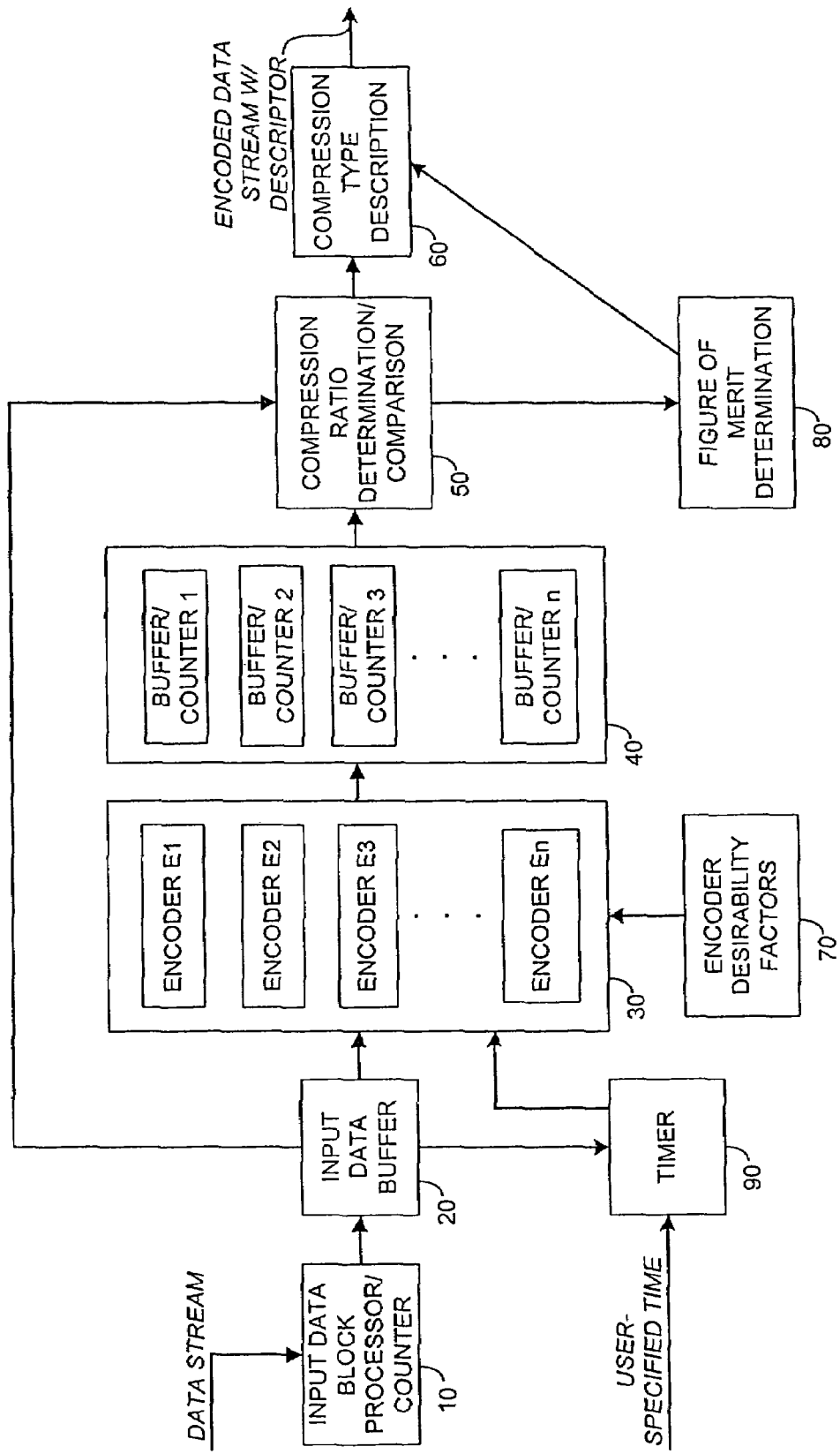
FIG. 8 is a block diagram of a content independent data compression system according to another embodiment having an a priori specified timer that provides real-time or pseudo real-time of output data and an enhanced metric for selecting an optimal encoding technique.

Referring now to FIG. 8, a block diagram illustrates a content independent data compression system according to another embodiment of the present system. The data compression system of FIG. 8 incorporates all of the features discussed above in connection with the system embodiments of FIGS. 2, 4, and 6. For example, the system of FIG. 8 incorporates both the a priori specified timer for providing real-time or pseudo real-time of output data, as well as the enhanced metric for selecting an optimal encoding technique. Based on the foregoing discussion, the operation of the system of FIG. 8 is understood by those skilled in the art.

Figure 9:
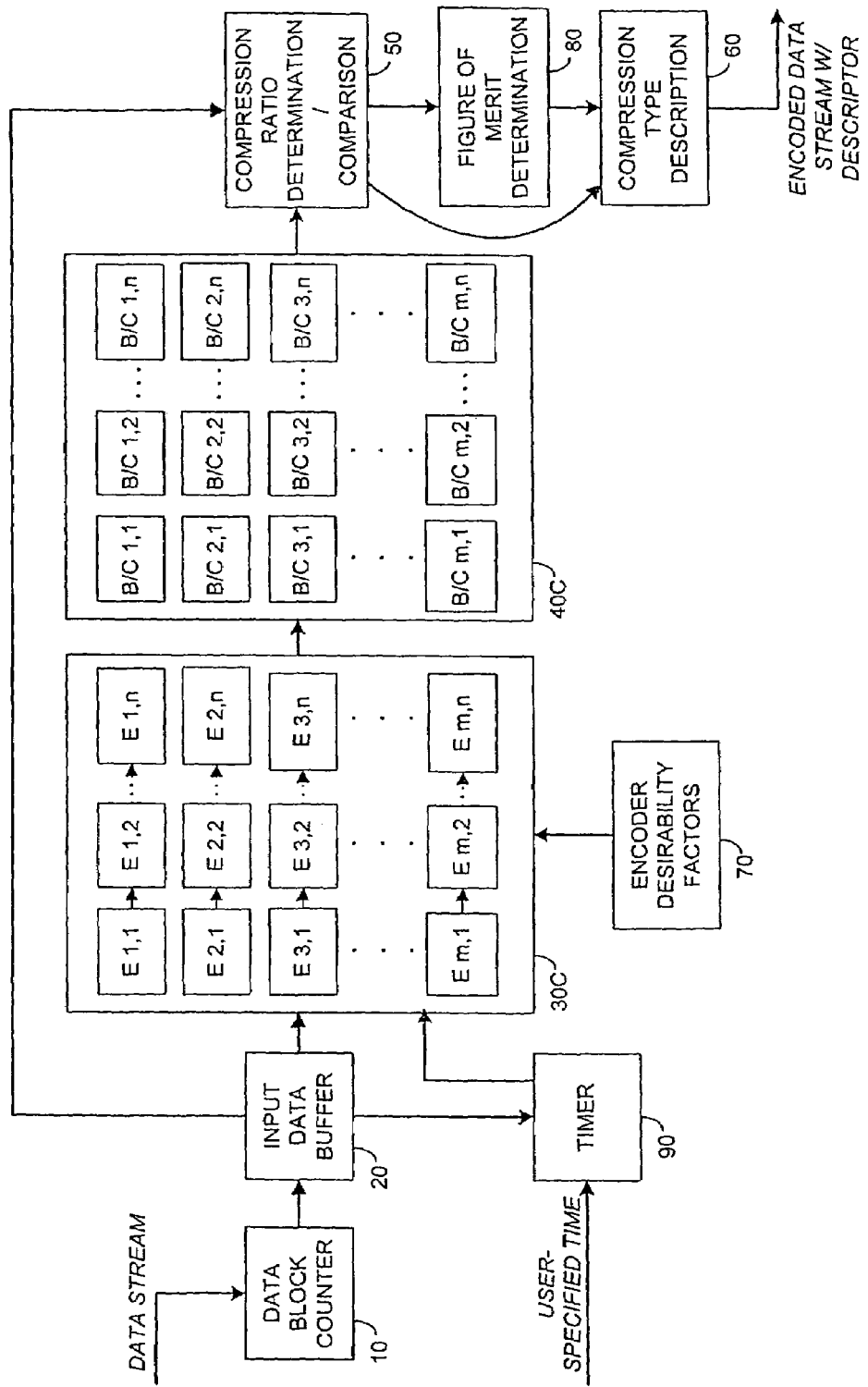
FIG. 9 is a block diagram of a content independent data compression system according to another embodiment of the present invention having an encoding architecture comprising a plurality of sets of serially cascaded encoders.

Referring now to FIG. 9, a block diagram illustrates a data compression system according to a preferred embodiment of the present invention. The system of FIG. 9 contains many of the features of the previous embodiments discussed above. However, this embodiment advantageously includes a cascaded encoder module 30c having an encoding architecture comprising a plurality of sets of serially-cascaded encoders Em,n, where "m" refers to the encoding path (i.e., the encoder set) and where "n" refers to the number of encoders in the respective path. It is to be understood that each set of serially cascaded encoders can include any number of disparate and/or similar encoders (i.e., n can be any value for a given path m).

The system of FIG. 9 also includes a output buffer module 40c which comprises a plurality of buffer/counters B/C m,n, each associated with a corresponding one of the encoders Em,n. In this embodiment, an input data block is sequentially applied to successive encoders (encoder stages) in the encoder path so as to increase the data compression ratio. For example, the output data block from a first encoder E1,1, is buffered and counted in B/C1,1, for subsequent processing by a second encoder E1,2. Advantageously, these parallel sets of sequential encoders are applied to the input data stream to effect content free lossless data compression. This embodiment provides for multi-stage sequential encoding of data with the maximum number of encoding steps subject to the available real-time, pseudo real-time, or other timing constraints.

As with each previously discussed embodiment, the encoders Em,n may include those lossless encoding techniques currently well known within the art, including: run length, Huffman, Lempel-Ziv Dictionary Compression, arithmetic coding, data compaction, and data null suppression. Encoding techniques are selected based upon their ability to effectively encode different types of input data. A full complement of encoders provides for broad coverage of existing and future data types. The input data blocks may be applied simultaneously to the encoder paths (i.e., the encoder paths may operate in parallel, utilizing task multiplexing on a single central processor, or via dedicated hardware, or by executing on a plurality of processor or dedicated hardware systems, or any combination thereof). In addition, an input data block may be sequentially applied to the encoder paths. Moreover, each serially cascaded encoder path may comprise a fixed (predetermined) sequence of encoders or a random sequence of encoders. Advantageously, by simultaneously or sequentially processing input data blocks via a plurality of sets of serially cascaded encoders, content free data compression is achieved.

Figure 10A:
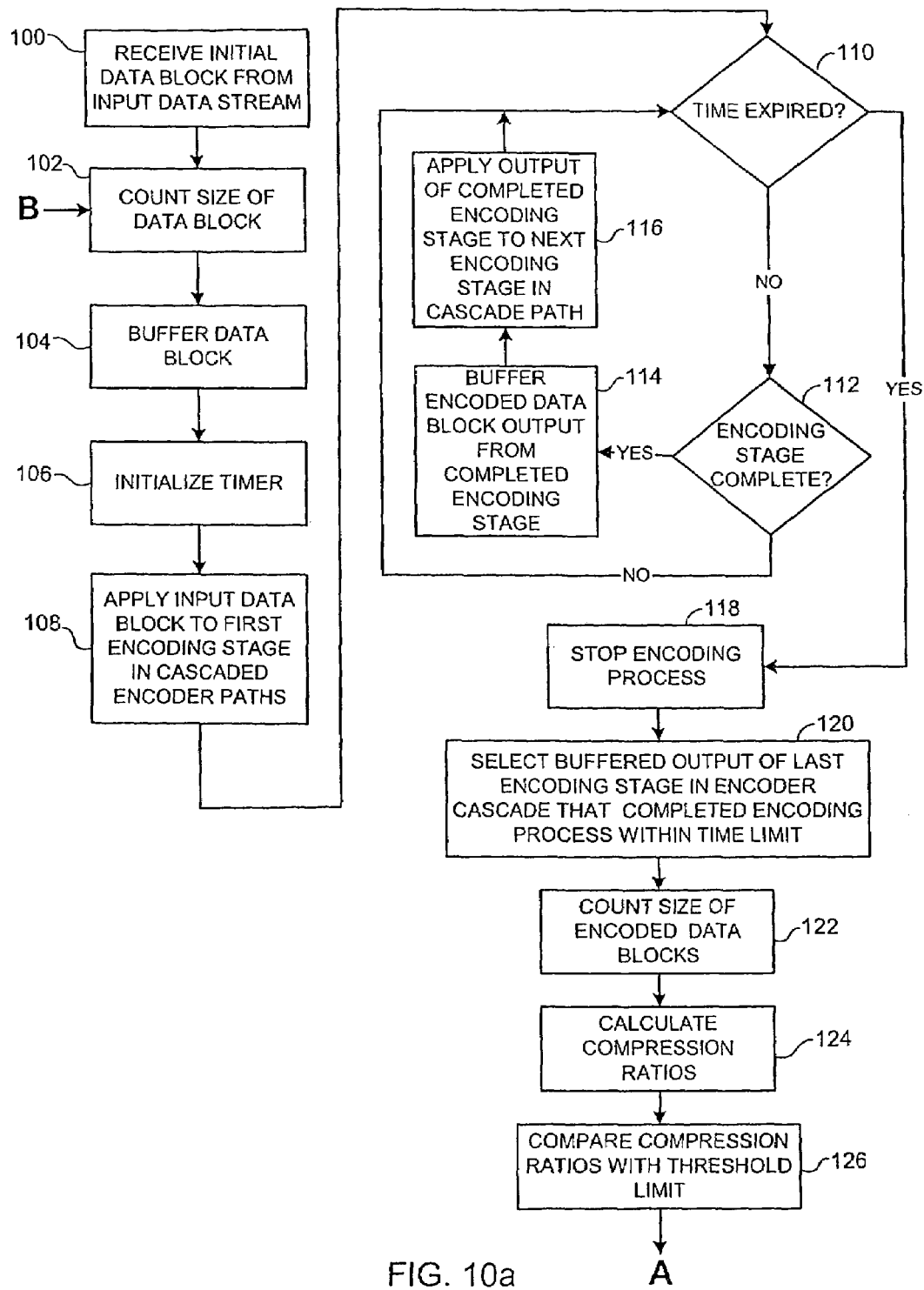
FIGS. 10a and 10b comprise a flow diagram of a data compression method according to another aspect of the present invention, which illustrates the operation of the data compression system of FIG. 9.
Figure 10B:
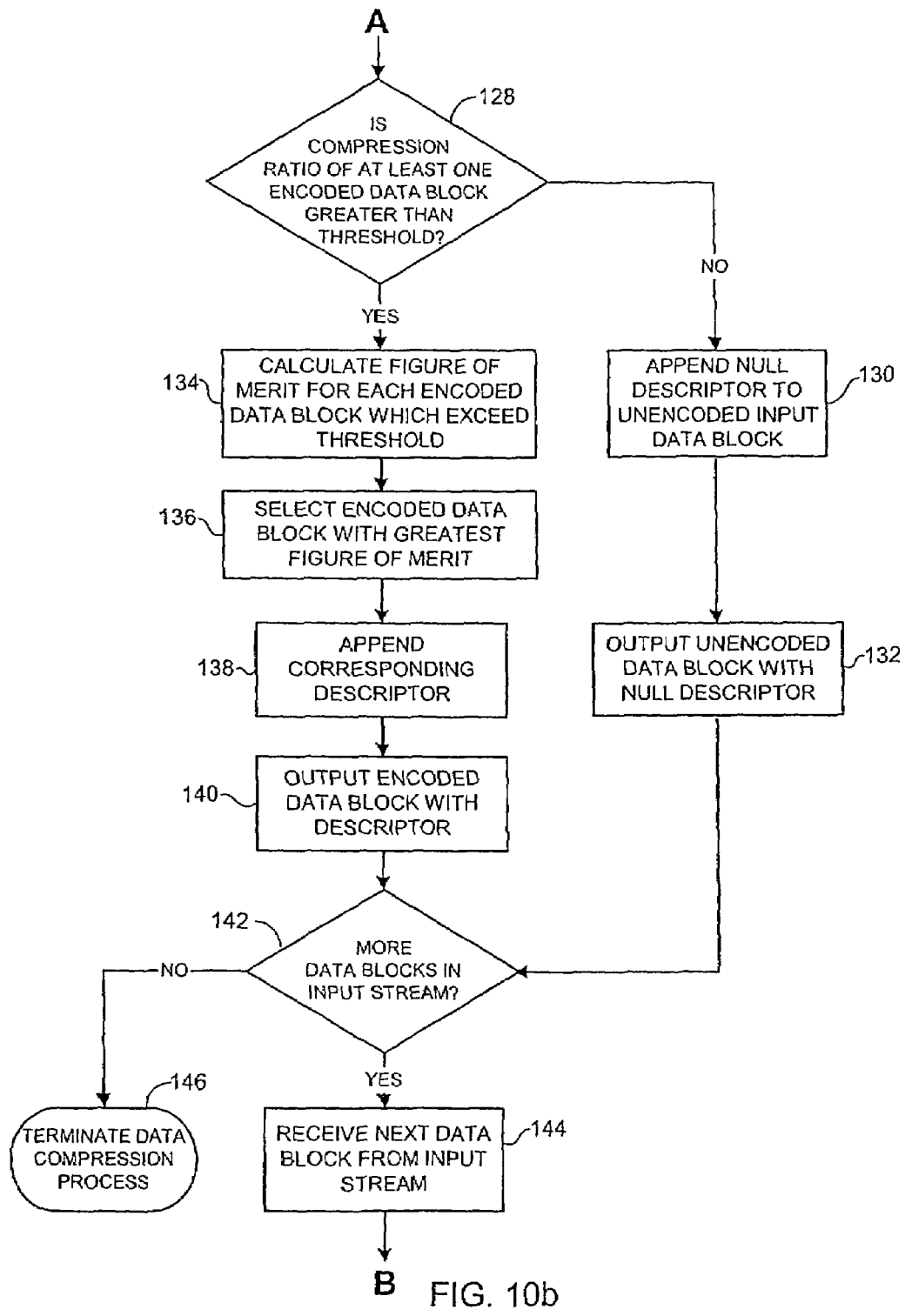

The operation of the data compression system of FIG. 9 will now be discussed in further detail with reference to the flow diagram of FIGS. 10a and 10b. A data stream comprising one or more data blocks is input into the data compression system and the first data block in the data stream is received (step 100), and its size is determined by the counter module 10 (step 102). The data block is then stored in buffer 20 (step 104).

Next, concurrent with the completion of the receipt and counting of the first data block, the interval timer 90 is initialized (step 106) and starts counting towards a user-specified time limit. The input data block is then sent to the cascade encoder module 30C wherein the input data block is applied to the first encoder (i.e., first encoding stage) in each of the cascaded encoder paths E1,1 . . . Em,1 (step 108). Next, a determination is made as to whether the user specified time expires before the completion of the first stage encoding process (steps 110 and 112). If the first stage encoding process is completed before the expiration of the timer, i.e., each encoder (E1,1 . . . Em,1) completes its respective encoding process (negative result in step 110 and affirmative result in step 112), then an encoded data block is output from each encoder E1,1 . . . Em,1 and maintained in a corresponding buffer (step 114). Then for each cascade encoder path, the output of the completed encoding stage is applied to the next successive encoding stage in the cascade path (step 116). This process (steps 110, 112, 114, and 116) is repeated until the earlier of the timer expiration (affirmative result in step 110) or the completion of encoding by each encoder stage in the serially cascaded paths, at which time the encoding process is halted (step 118).

Then, for each cascade encoder path, the buffered encoded data block output by the last encoder stage that completes the encoding process before the expiration of the timer is selected for further processing (step 120). Advantageously, the interim stages of the multi-stage data encoding process are preserved. For example, the results of encoder E1,1 are preserved even after encoder E1,2 begins encoding the output of encoder E1,1. If the interval timer expires after encoder E1,1 completes its respective encoding process but before encoder E1,2 completes its respective encoding process, the encoded data block from encoder E1,1 is complete and is utilized for calculating the compression ratio for the corresponding encoder path. The incomplete encoded data block from encoder E1,2 is either discarded or ignored.

It is to be appreciated that it is not necessary (or in some cases desirable) that some or all of the encoders in the cascade encoder paths complete the encoding process before the interval timer expires. Specifically, due to encoder data dependency, natural variation and the sequential application of the cascaded encoders, it is possible that certain encoders may not operate quickly enough and therefore do not comply with the timing constraints of the end use. Accordingly, the time limit ensures that the real-time or pseudo real-time nature of the data encoding is preserved.

After the encoded data blocks are selected (step 120), the size of each encoded data block is counted (step 122). Next, a compression ratio is calculated for each encoded data block by taking the ratio of the size of the input data block (as determined by the input counter 10) to the size of the encoded data block output from each encoder (step 124). Each compression ratio is then compared with an a priori-specified compression ratio threshold (step 126). A determination is made as to whether the compression ratio of at least one of the encoded data blocks exceeds the threshold limit (step 128). If there are no encoded data blocks having a compression ratio that exceeds the compression ratio threshold limit (negative determination in step 128), then the original unencoded input data block is selected for output and a null data compression type descriptor is appended thereto (step 130). The original unencoded data block and its corresponding null data compression type descriptor is then output for subsequent data processing, storage, or transmittal (step 132).

On the other hand, if one or more of the encoded data blocks possess a compression ratio greater than the compression ratio threshold limit (affirmative result in step 128), then a figure of merit is calculated for each encoded data block having a compression ratio which exceeds the compression ratio threshold limit (step 134). Again, the figure of merit for a given encoded data block is comprised of a weighted average of the a priori user specified threshold and the corresponding encoder desirability factor associated with the encoded data block. Next, the encoded data block having the greatest figure of merit is selected (step 136). An appropriate data compression type descriptor is then appended (step 138) to indicate the data encoding technique applied to the encoded data block. For instance, the data type compression descriptor can indicate that the encoded data block was processed by either a single encoding type, a plurality of sequential encoding types, and a plurality of random encoding types. The encoded data block (which has the greatest figure of merit) along with its corresponding data compression type descriptor is then output for subsequent data processing, storage, or transmittal (step 140).

After the unencoded data block or the encoded data input data block is output (steps 132 and 140), a determination is made as to whether the input data stream contains additional data blocks to be processed (step 142). If the input data stream includes additional data blocks (affirmative result in step 142), then the next successive data block is received (step 144), its block size is counted (return to step 102) and the data compression process is iterated for each successive data block in the input data stream. Once the final input data block is processed (negative result in step 142), data compression of the input data stream is finished (step 146).

Figure 11:
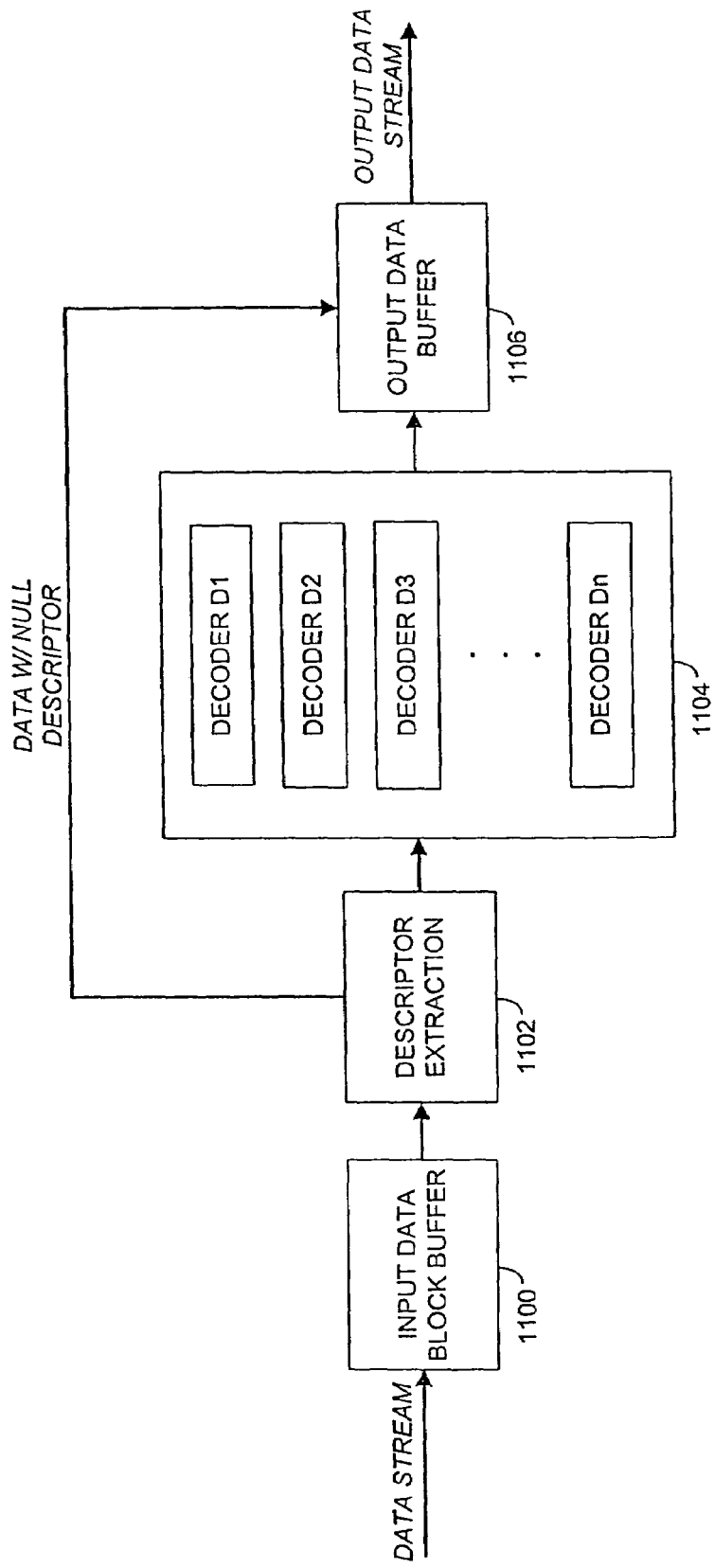
FIG. 11 is block diagram of a content independent data decompression system according to one embodiment of the present invention.

Referring now to FIG. 11, a block diagram illustrates a data decompression system according to one embodiment of the present invention. The data decompression system preferably includes an input buffer 1100 that receives as input an uncompressed or compressed data stream comprising one or more data blocks. The data blocks may range in size from individual bits through complete files or collections of multiple files. Additionally, the data block size may be fixed or variable. The input data buffer 1100 is preferably included (not required) to provide storage of input data for various hardware implementations. A descriptor extraction module 1102 receives the buffered (or unbuffered) input data block and then parses, lexically, syntactically, or otherwise analyzes the input data block using methods known by those skilled in the art to extract the data compression type descriptor associated with the data block. The data compression type descriptor may possess values corresponding to null (no encoding applied), a single applied encoding technique, or multiple encoding techniques applied in a specific or random order (in accordance with the data compression system embodiments and methods discussed above).

A decoder module 1104 includes a plurality of decoders D1 . . . Dn for decoding the input data block using a decoder, set of decoders, or a sequential set of decoders corresponding to the extracted compression type descriptor. The decoders D1 . . . Dn may include those lossless encoding techniques currently well known within the art, including: run length, Huffman, Lempel-Ziv Dictionary Compression, arithmetic coding, data compaction, and data null suppression. Decoding techniques are selected based upon their ability to effectively decode the various different types of encoded input data generated by the data compression systems described above or originating from any other desired source. As with the data compression systems discussed above, the decoder module 1104 may include multiple decoders of the same type applied in parallel so as to reduce the data decoding time.

The data decompression system also includes an output data buffer 1106 for buffering the decoded data block output from the decoder module 1104.

Figure 12:
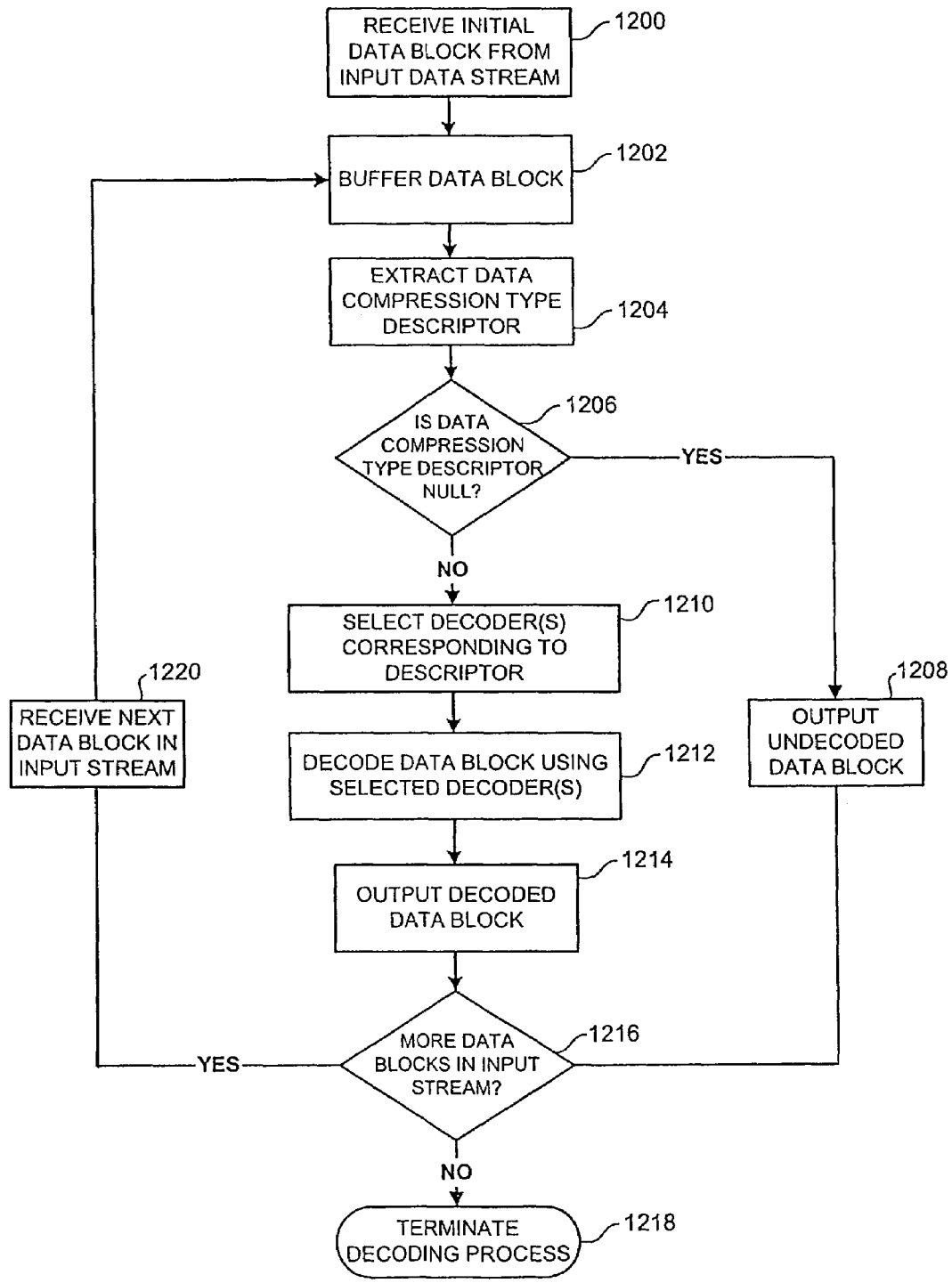
FIG. 12 is a flow diagram of a data decompression method according to one aspect of the present invention, which illustrates the operation of the data compression system of FIG. 11.

The operation of the data decompression system of FIG. 11 will be discussed in further detail with reference to the flow diagram of FIG. 12. A data stream comprising one or more data blocks of compressed or uncompressed data is input into the data decompression system and the first data block in the stream is received (step 1200) and maintained in the buffer (step 1202). As with the data compression systems discussed above, data decompression is performed on a per data block basis. The data compression type descriptor is then extracted from the input data block (step 1204). A determination is then made as to whether the data compression type descriptor is null (step 1206). If the data compression type descriptor is determined to be null (affirmative result in step 1206), then no decoding is applied to the input data block and the original undecoded data block is output (or maintained in the output buffer) (step 1208).

On the other hand, if the data compression type descriptor is determined to be any value other than null (negative result in step 1206), the corresponding decoder or decoders are then selected (step 1210) from the available set of decoders D1 . . . Dn in the decoding module 1104. It is to be understood that the data compression type descriptor may mandate the application of: a single specific decoder, an ordered sequence of specific decoders, a random order of specific decoders, a class or family of decoders, a mandatory or optional application of parallel decoders, or any combination or permutation thereof. The input data block is then decoded using the selected decoders (step 1212), and output (or maintained in the output buffer 1106) for subsequent data processing, storage, or transmittal (step 1214). A determination is then made as to whether the input data stream contains additional data blocks to be processed (step 1216). If the input data stream includes additional data blocks (affirmative result in step 1216), the next successive data block is received (step 1220), and buffered (return to step 1202). Thereafter, the data decompression process is iterated for each data block in the input data stream. Once the final input data block is processed (negative result in step 1216), data decompression of the input data stream is finished (step 1218).

Figure 13A:
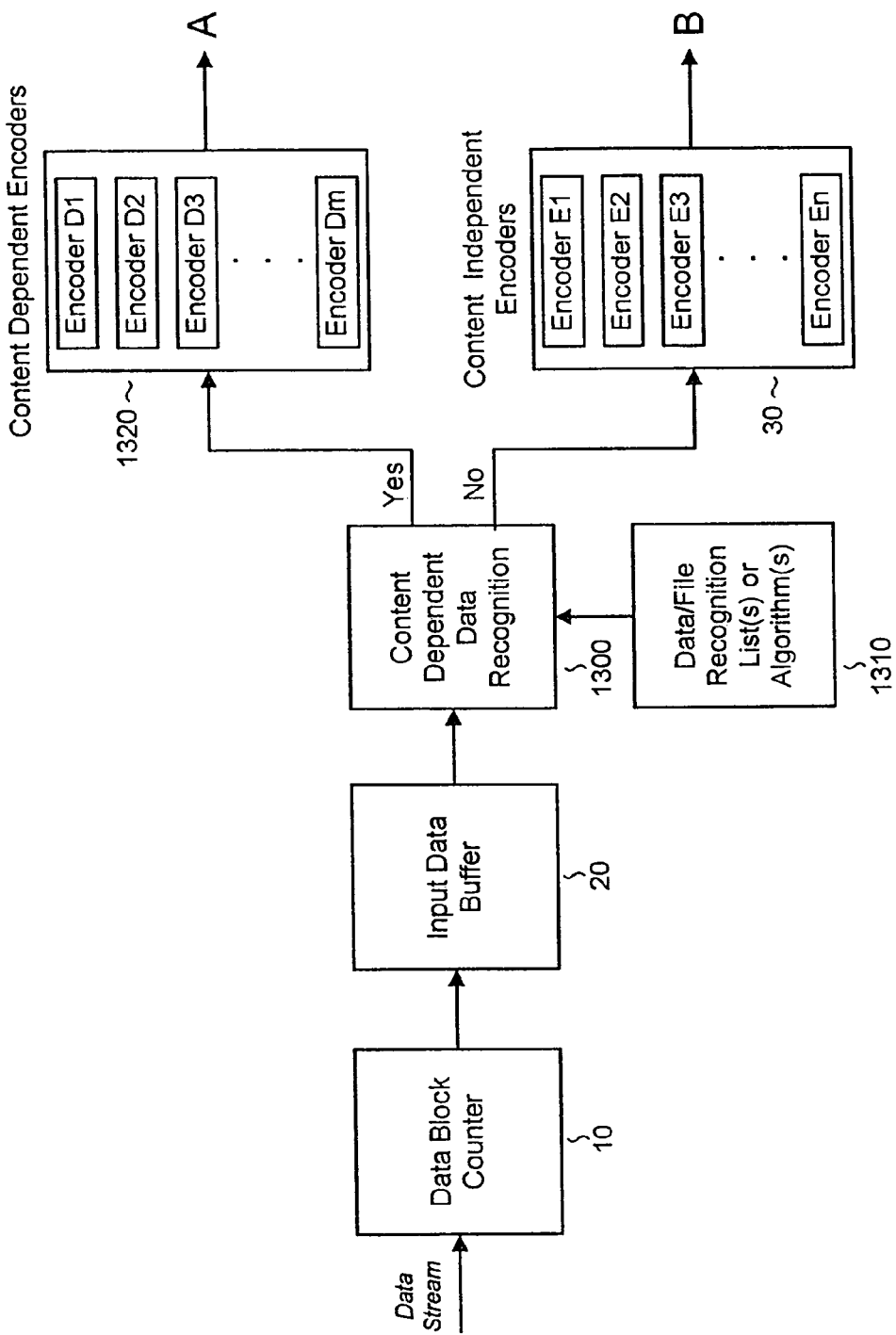
FIGS. 13a and 13b comprise a block diagram of a data compression system comprising content dependent and content independent data compression, according to an embodiment of the present invention.
Figure 13B:
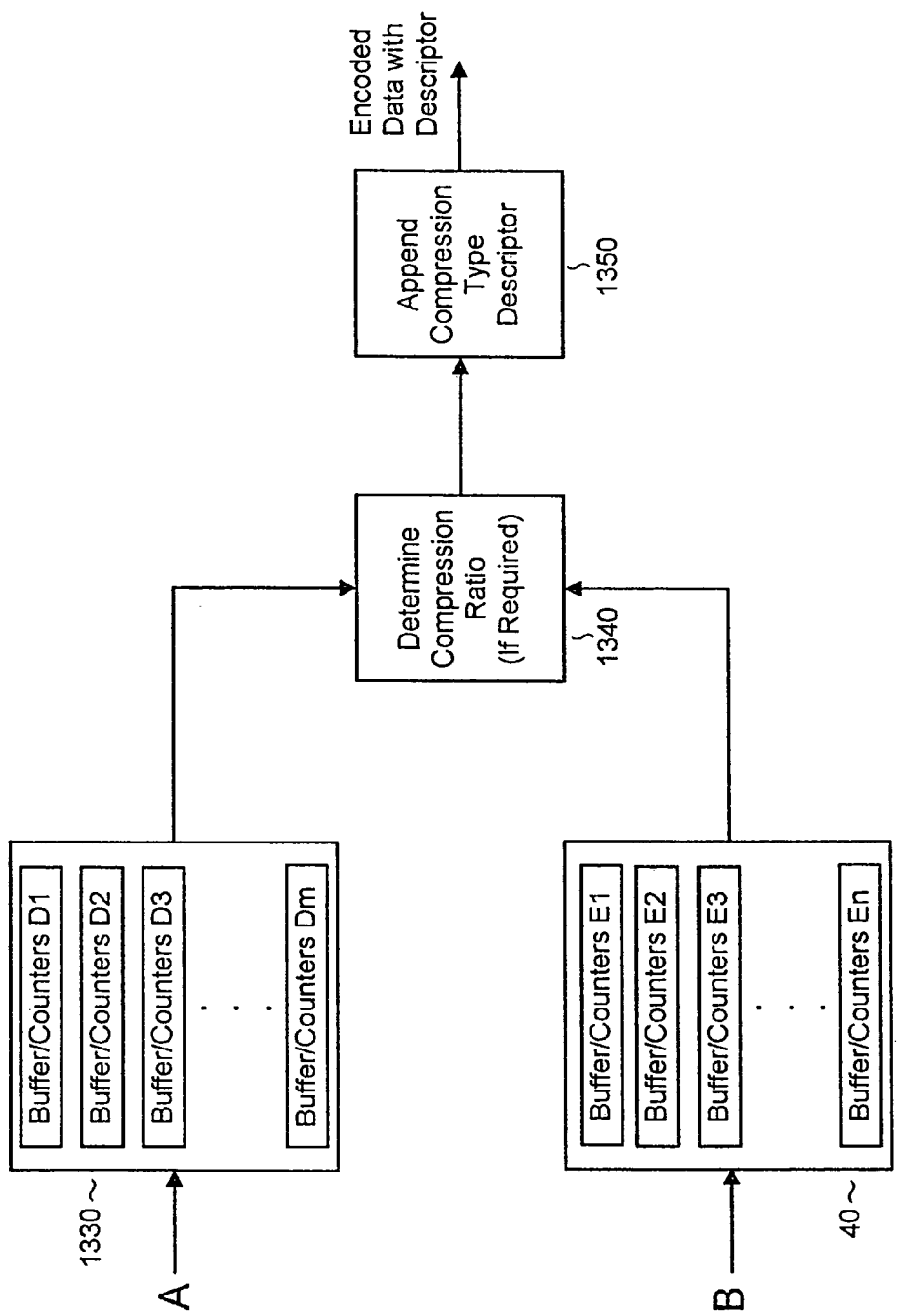
Figure 14A:
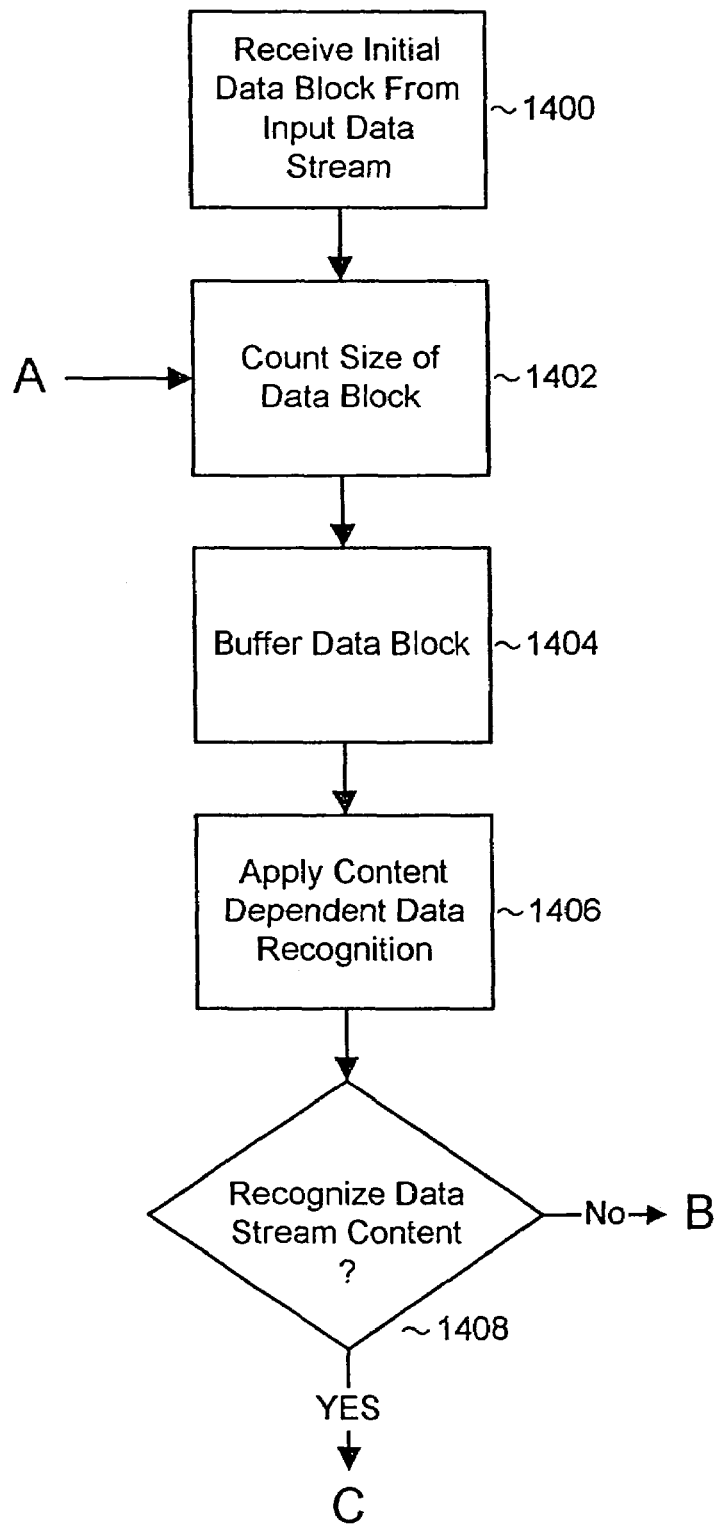
FIGS. 14a-14d comprise a flow diagram of a data compression method using both content dependent and content independent data compression, according to one aspect of the present invention.
Figure 14B:
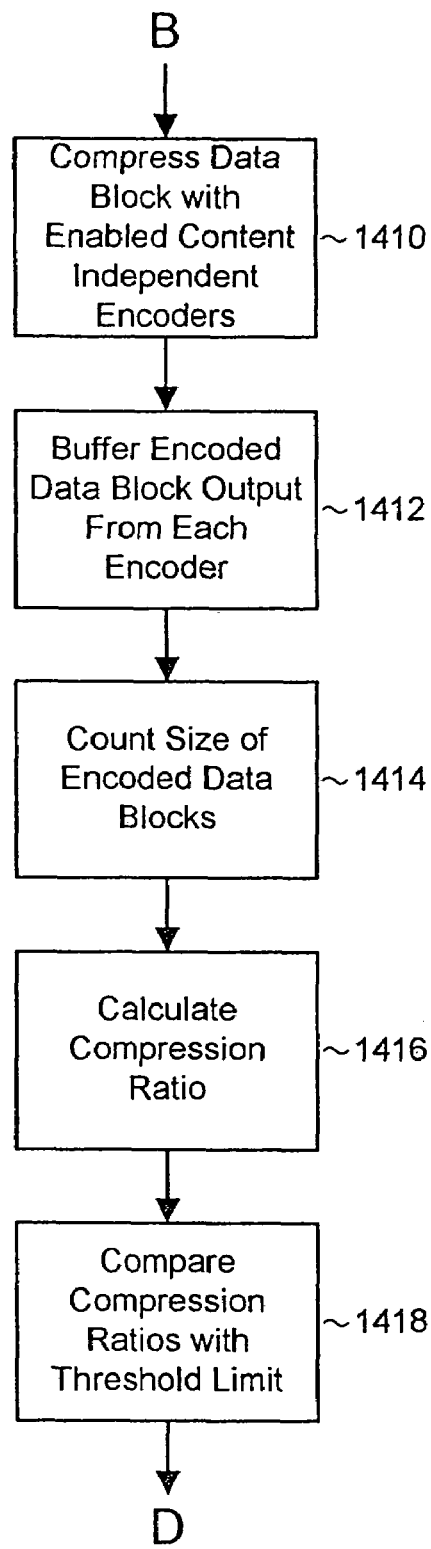
Figure 14C:
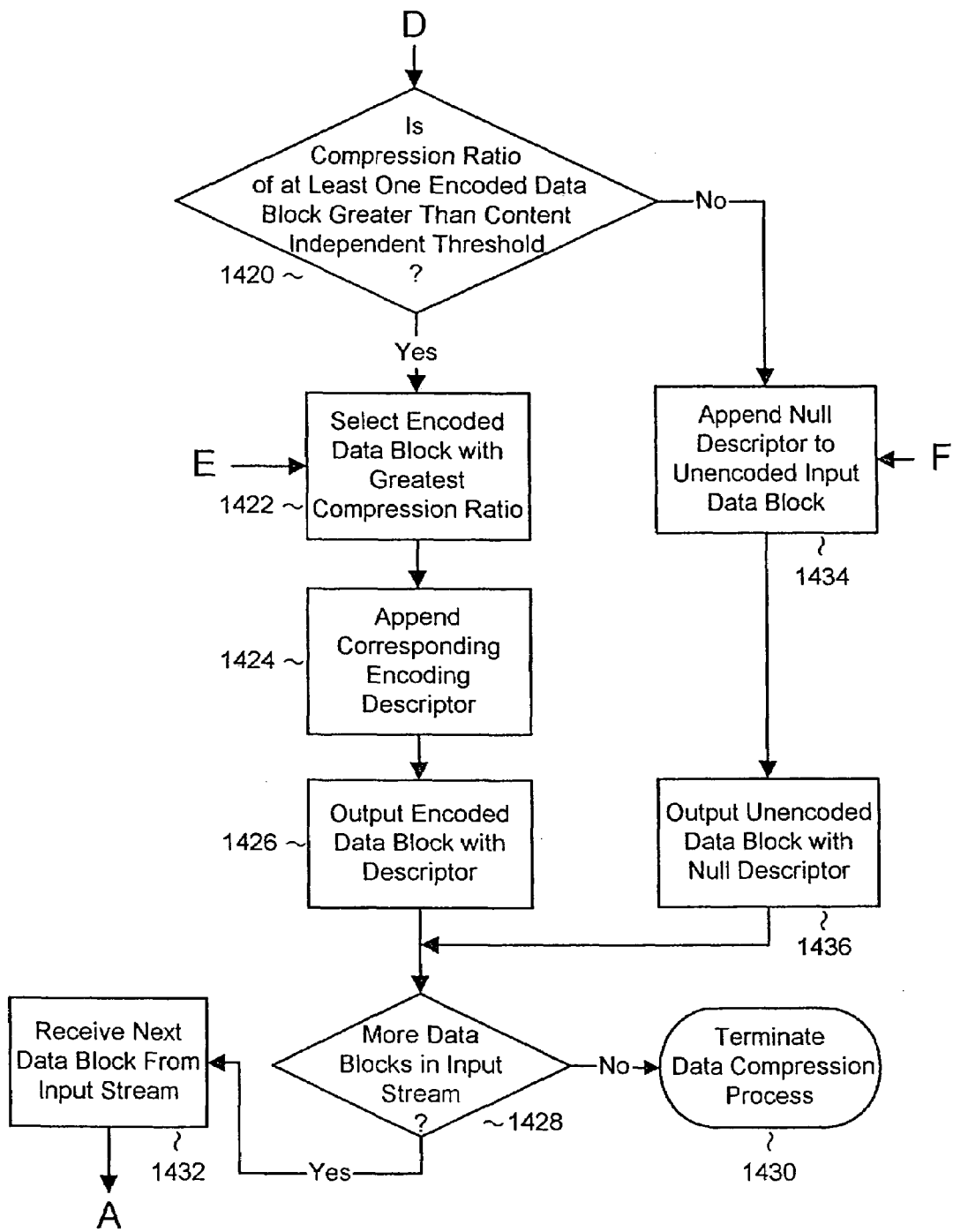
Figure 14D:
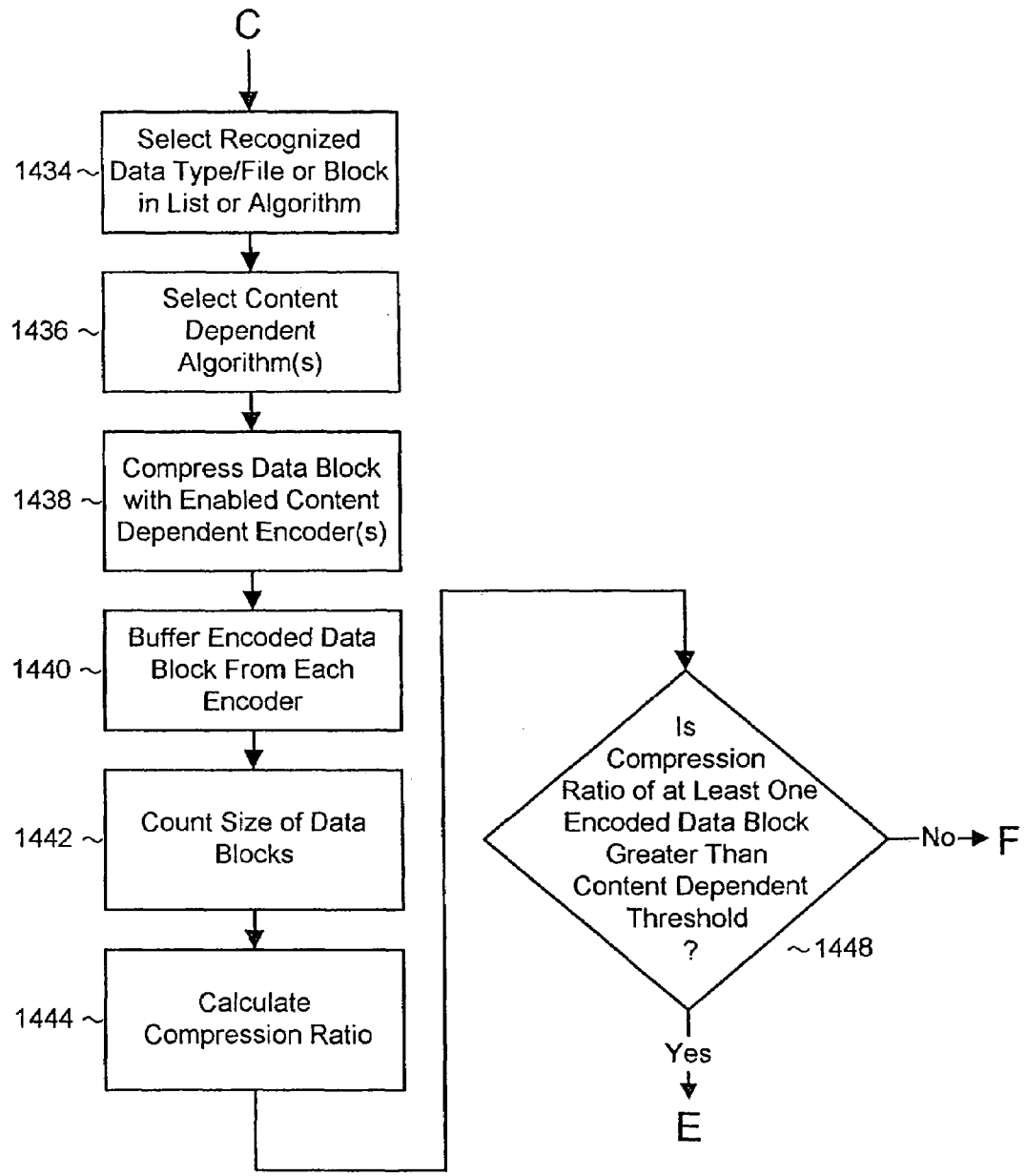

In other embodiments of the present invention described below, data compression is achieved using a combination of content dependent data compression and content independent data compression. For example, FIGS. 13a and 13b are block diagrams illustrating a data compression system employing both content independent and content dependent data compression according to one embodiment of the present invention, wherein content independent data compression is applied to a data block when the content of the data block cannot be identified or is not associable with a specific data compression algorithm. The data compression system comprises a counter module 10 that receives as input an uncompressed or compressed data stream. It is to be understood that the system processes the input data stream in data blocks that may range in size from individual bits through complete files or collections of multiple files. Additionally, the data block size may be fixed or variable. The counter module 10 counts the size of each input data block (i.e., the data block size is counted in bits, bytes, words, any convenient data multiple or metric, or any combination thereof).

An input data buffer 20, operatively connected to the counter module 10, may be provided for buffering the input data stream in order to output an uncompressed data stream in the event that, as discussed in further detail below, every encoder fails to achieve a level of compression that exceeds a priori specified content independent or content dependent minimum compression ratio thresholds. It is to be understood that the input data buffer 20 is not required for implementing the present invention.

A content dependent data recognition module 1300 analyzes the incoming data stream to recognize data types, data strictures, data block formats, file substructures, file types, and/or any other parameters that may be indicative of either the data type/content of a given data block or the appropriate data compression algorithm or algorithms (in serial or in parallel) to be applied. Optionally, a data file recognition list(s) or algorithm(s) 1310 module may be employed to hold and/or determine associations between recognized data parameters and appropriate algorithms. Each data block that is recognized by the content data compression module 1300 is routed to a content dependent encoder module 1320, if not the data is routed to the content independent encoder module 30.

A content dependent encoder module 1320 is operatively connected to the content dependent data recognition module 1300 and comprises a set of encoders D1, D2, D3 . . . Dm. The encoder set D1, D2, D3 . . . Dm may include any number "n" of those lossless or lossy encoding techniques currently well known within the art such as MPEG4, various voice codecs, MPEG3, AC3, AAC, as well as lossless algorithms such as run length, Huffman, Lempel-Ziv Dictionary Compression, arithmetic coding, data compaction, and data null suppression. It is to be understood that the encoding techniques are selected based upon their ability to effectively encode different types of input data. It is to be appreciated that a full complement of encoders and or codecs are preferably selected to provide a broad coverage of existing and future data types.

The content independent encoder module 30, which is operatively connected to the content dependent data recognition module 1300, comprises a set of encoders E1, E2, E3 . . . En. The encoder set E1, E2, E3 . . . En may include any number "n" of those lossless encoding techniques currently well known within the art such as run length, Huffman, Lempel-Ziv Dictionary Compression, arithmetic coding, data compaction, and data null suppression. Again, it is to be understood that the encoding techniques are selected based upon their ability to effectively encode different types of input data. It is to be appreciated that a full complement of encoders are preferably selected to provide a broad coverage of existing and future data types.

The encoder modules (content dependent 1320 and content independent 30) selectively receive the buffered input data blocks (or unbuffered input data blocks from the counter module 10) from module 1300 based on the results of recognition. Data compression is performed by the respective encoder modules wherein some or all of the encoders D1 . . . Dm or E1 . . . En processes a given input data block and outputs a corresponding set of encoded data blocks. It is to be appreciated that the system affords a user the option to enable/disable any one or more of the encoders D1 . . . Dm and E1 . . . En prior to operation. As is understood by those skilled in the art, such feature allows the user to tailor the operation of the data compression system for specific applications. It is to be further appreciated that the encoding process may be performed either in parallel or sequentially. In particular, the encoder set D1 through Dm of encoder module 1320 and/or the encoder set E1 through En of encoder module 30 may operate in parallel (i.e., simultaneously processing a given input data block by utilizing task multiplexing on a single central processor, via dedicated hardware, by executing on a plurality of processor or dedicated hardware systems, or any combination thereof). In addition, encoders D1 through Dm and E1 through En may operate sequentially on a given unbuffered or buffered input data block. This process is intended to eliminate the complexity and additional processing overhead associated with multiplexing concurrent encoding techniques on a single central processor and/or dedicated hardware, set of central processors and/or dedicated hardware, or any achievable combination. It is to be further appreciated that encoders of the identical type may be applied in parallel to enhance encoding speed. For instance, encoder E1 may comprise two parallel Huffman encoders for parallel processing of an input data block. It should be further noted that one or more algorithms may be implemented in dedicated hardware such as an MPEG4 or MP3 encoding integrated circuit.

Buffer/counter modules 1330 and 40 are operatively connected to their respective encoding modules 1320 and 30, for buffering and counting the size of each of the encoded data blocks output from the respective encoder modules. Specifically, the content dependent buffer/counter 1330 comprises a plurality of buffer/counters BCD1, BCD2, BCD3 . . . BCDm, each operatively associated with a corresponding one of the encoders D1 . . . Dm. Similarly the content independent buffer/counters BCE1, BCE2, BCE3 . . . BCEn, each operatively associated with a corresponding one of the encoders E1 . . . En. A compression ratio module 1340, operatively connected to the content dependent output buffer/counters 1330 and content independent buffer/counters 40 determines the compression ratio obtained for each of the enabled encoders D1 . . . Dm and or E1 . . . En by taking the ratio of the size of the input data block to the size of the output data block stored in the corresponding buffer/counters BCD1, BCD2, BCD3 . . . BCDm and or BCE1, BCE2, BCE3 . . . BCEn. In addition, the compression ratio module 1340 compares each compression ratio with an a priori-specified compression ratio threshold limit to determine if at least one of the encoded data blocks output from the enabled encoders BCD1, BCD2, BCD3 . . . BCDm and or BCE1, BCE2, BCE3 . . . BCEn achieves a compression that meets an an a priori-specified threshold. As is understood by those skilled in the art, the threshold limit may be specified as any value inclusive of data expansion, no data compression or expansion, or any arbitrarily desired compression limit. It should be noted that different threshold values may be applied to content dependent and content independent encoded data. Further these thresholds may be adaptively modified based upon enabled encoders in either or both the content dependent or content independent encoder sets, along with any associated parameters. A compression type description module 1350, operatively coupled to the compression ratio module 1340, appends a corresponding compression type descriptor to each encoded data block which is selected for output so as to indicate the type of compression format of the encoded data block.

A mode of operation of the data compression system of FIGS. 13a and 13b will now be discussed with reference to the flow diagrams of FIGS. 14a-14d, which illustrates a method for performing data compression using a combination of content dependent and content independent data compression. In general, content independent data compression is applied to a given data block when the content of a data block cannot be identified or is not associated with a specific data compression algorithm. More specifically, referring to FIG. 14a, a data stream comprising one or more data blocks is input into the data compression system and the first data block in the stream is received (step 1400). As stated above, data compression is performed on a per data block basis. As previously stated a data block may represent any quantity of data from a single bit through a multiplicity of files or packets and may vary from block to block. Accordingly, the 10 first input data block in the input data stream is input into the counter module 10 that counts the size of the data block (step 1402). The data block is then stored in the buffer 20 (step 1404). The data block is then analyzed on a per block or multi-block basis by the content dependent data recognition module 1300 (step 1406). If the data stream content is not recognized utilizing the recognition list(s) or algorithms(s) module 1310 (step 1408) the data is routed to the content independent encoder module 30 and compressed by each (enabled) encoder E1 . . . En (step 1410). Upon completion of the encoding of the input data block, an encoded data block is output from each (enabled) encoder E1 . . . En and maintained in a corresponding buffer (step 1412), and the encoded data block size is counted (step 1414).

Next, a compression ratio is calculated for each encoded data block by taking the ratio of the size of the input data block (as determined by the input counter 10 to the size of each encoded data block output from the enabled encoders (step 1416). Each compression ratio is then compared with an a priori-specified compression ratio threshold (step 1418). It is to be understood that the threshold limit may be specified as any value inclusive of data expansion, no data compression or expansion, or any arbitrarily desired compression limit. It is to be further understood that notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1420). If there are no encoded data blocks having a compression ratio that exceeds the compression ratio threshold limit (negative determination in step 1420), then the original unencoded input data block is selected for output and a null data compression type descriptor is appended thereto (step 1434). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 1436).

On the other hand, if one or more of the encoded data blocks possess a compression ratio greater than the compression ratio threshold limit (affirmative result in step 1420), then the encoded data block having the greatest compression ratio is selected (step 1422). An appropriate data compression type descriptor is then appended (step 1424). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 1426).

As previously stated the data block stored in the buffer 20 (step 1404) is analyzed on a per block or multi-block basis by the content dependent data recognition module 1300 (step 1406). If the data stream content is recognized utilizing the recognition list(s) or algorithms(s) module 1310 (step 1434) the appropriate content dependent algorithms are enabled and initialized (step 1436), and the data is routed to the content dependent encoder module 1320 and compressed by each (enabled) encoder D1 . . . Dm (step 1438). Upon completion of the encoding of the input data block, an encoded data block is output from each (enabled) encoder D1 . . . Dm and maintained in a corresponding buffer (step 1440), and the encoded data block size is counted (step 1442).

Next, a compression ratio is calculated for each encoded data block by taking the ratio of the size of the input data block (as determined by the input counter 10 to the size of each encoded data block output from the enabled encoders (step 1444). Each compression ratio is then compared with an a priori-specified compression ratio threshold (step 1448). It is to be understood that the threshold limit may be specified as any value inclusive of data expansion, no data compression or expansion, or any arbitrarily desired compression limit. It is to be further understood that many of these algorithms may be lossy, and as such the limits may be subject to or modified by an end target storage, listening, or viewing device. Further notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1420). If there are no encoded datablocks having a compression ratio that exceeds the compression ratio threshold limit (negative determination in step 1420), then the original unencoded input data block is selected for output and a null data compression type descriptor is appended thereto (step 1434). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 1436).

On the other hand, if one or more of the encoded data blocks possess a compression ratio greater than the compression ratio threshold limit (affirmative result in step 1420), then the encoded data block having the greatest compression ratio is selected (step 1422). An appropriate data compression type descriptor is then appended (step 1424). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 1426).

After the encoded data block or the unencoded data input data block is output (steps 1426 and 1436), a determination is made as to whether the input data stream contains additional data blocks to be processed (step 1428). If the input data stream includes additional data blocks (affirmative result in step 1428), the next successive data block is received (step 1432), its block size is counted (return to step 1402) and the data compression process in repeated. This process is iterated for each data block in the input data stream. Once the final input data block is processed (negative result in step 1428), data compression of the input data stream is finished (step 1430).

Since a multitude of data types may be present within a given input data block, it is often difficult and/or impractical to predict the level of compression that will be achieved by a specific encoder. Consequently, by processing the input data blocks with a plurality of encoding techniques and comparing the compression results, content free data compression is advantageously achieved. Further the encoding may be lossy or lossless dependent upon the input data types. Further if the data type is not recognized the default content independent lossless compression is applied. It is not a requirement that this process be deterministic—in fact a certain probability may be applied if occasional data loss is permitted. It is to be appreciated that this approach is scalable through future generations of processors, dedicated hardware, and software. As processing capacity increases and costs reduce, the benefits provided by the present invention will continue to increase. It should again be noted that the present invention may employ any lossless data encoding technique.

Figure 15A:
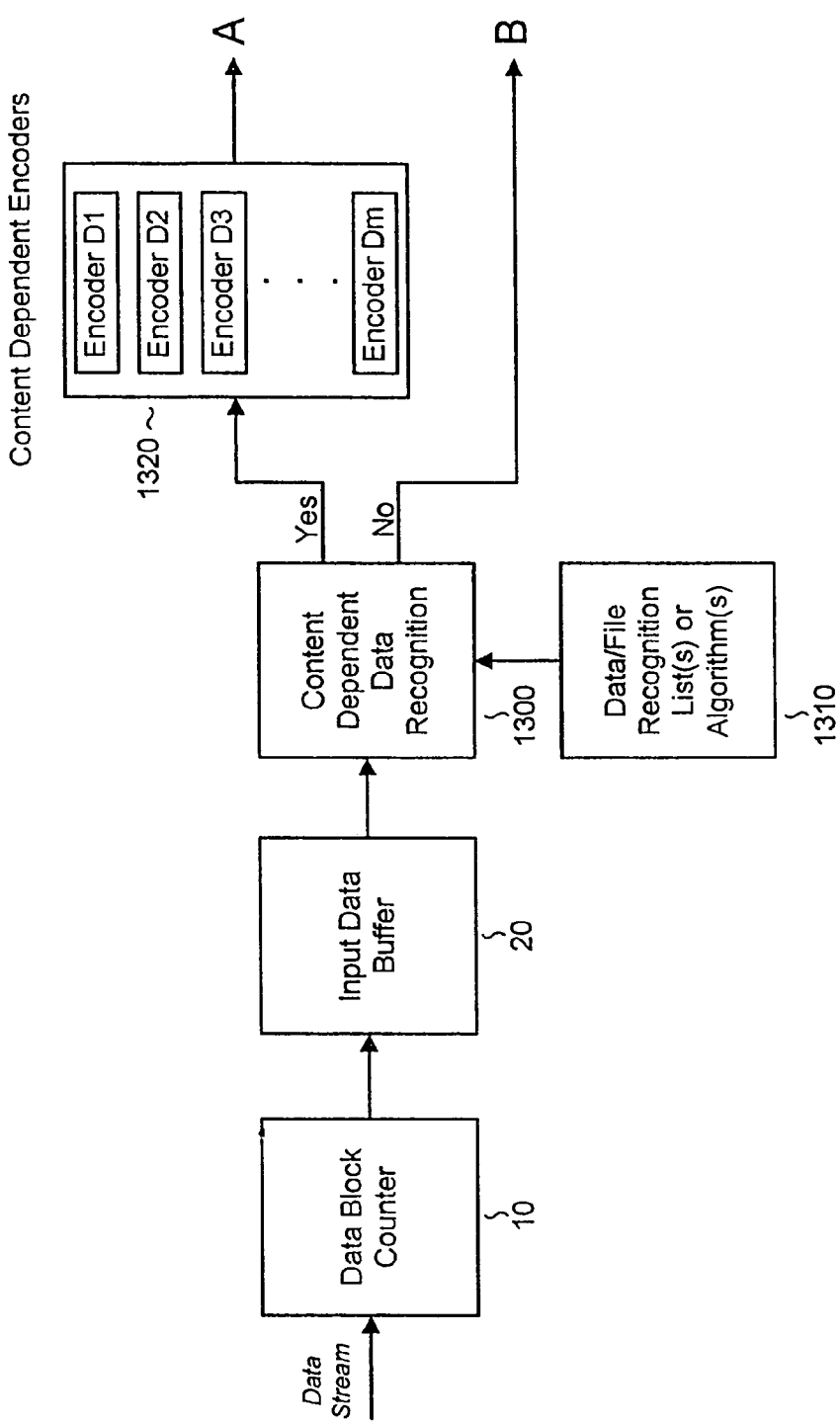
FIGS. 15a and 15b comprise a block diagram of a data compression system comprising content dependent and content independent data compression, according to another embodiment of the present invention.
Figure 15B:
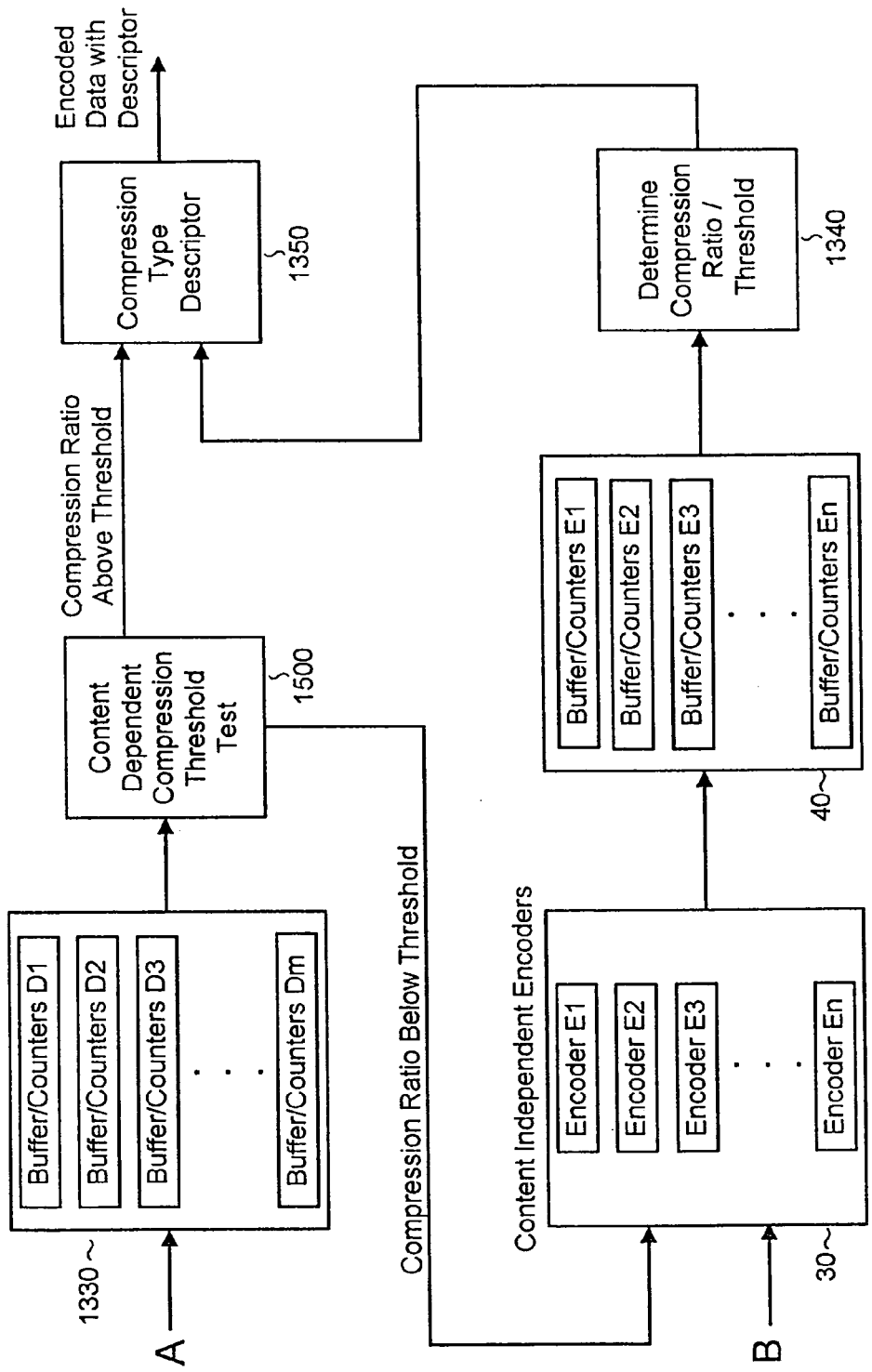
Figure 16A:
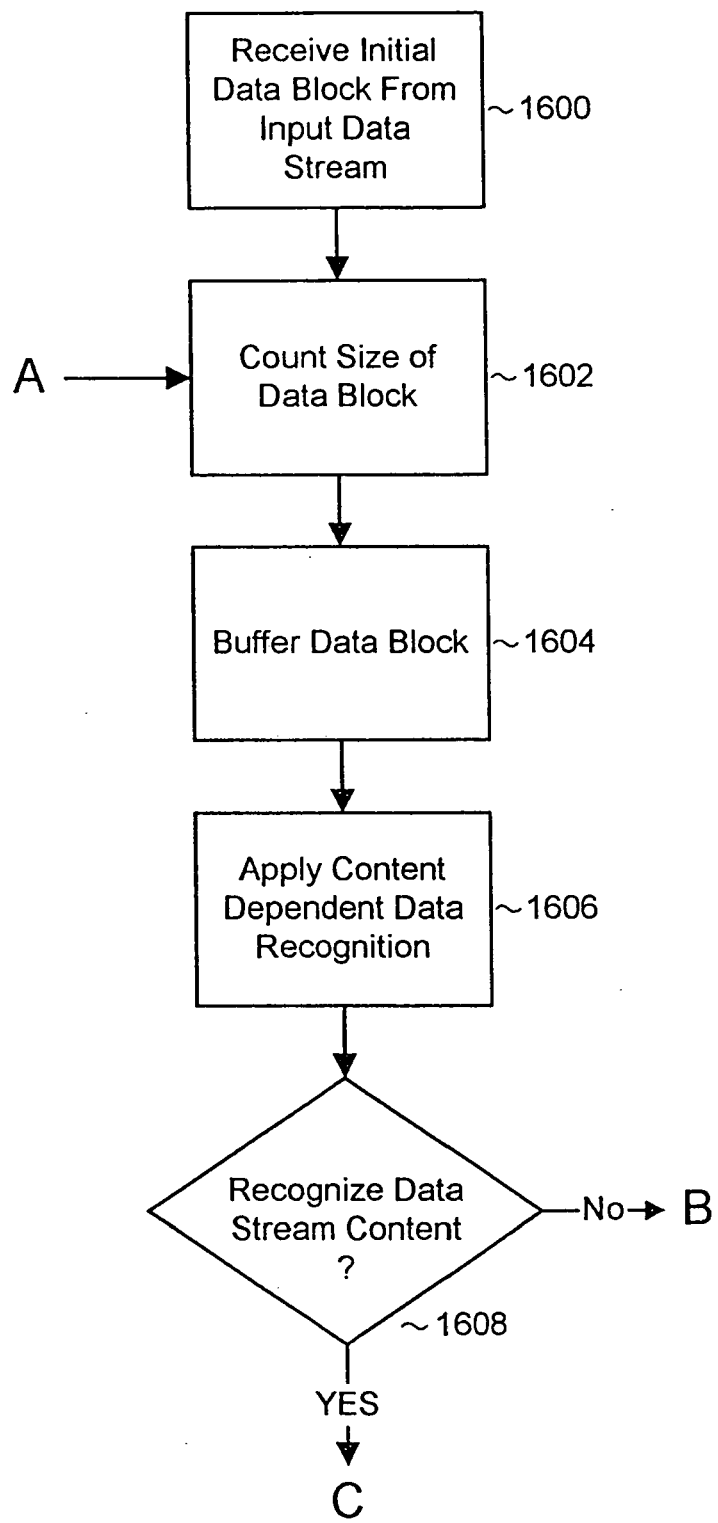
FIGS. 16a-16d comprise a flow diagram of a data compression method using both content dependent and content independent data compression, according to another aspect of the present invention.
Figure 16B:
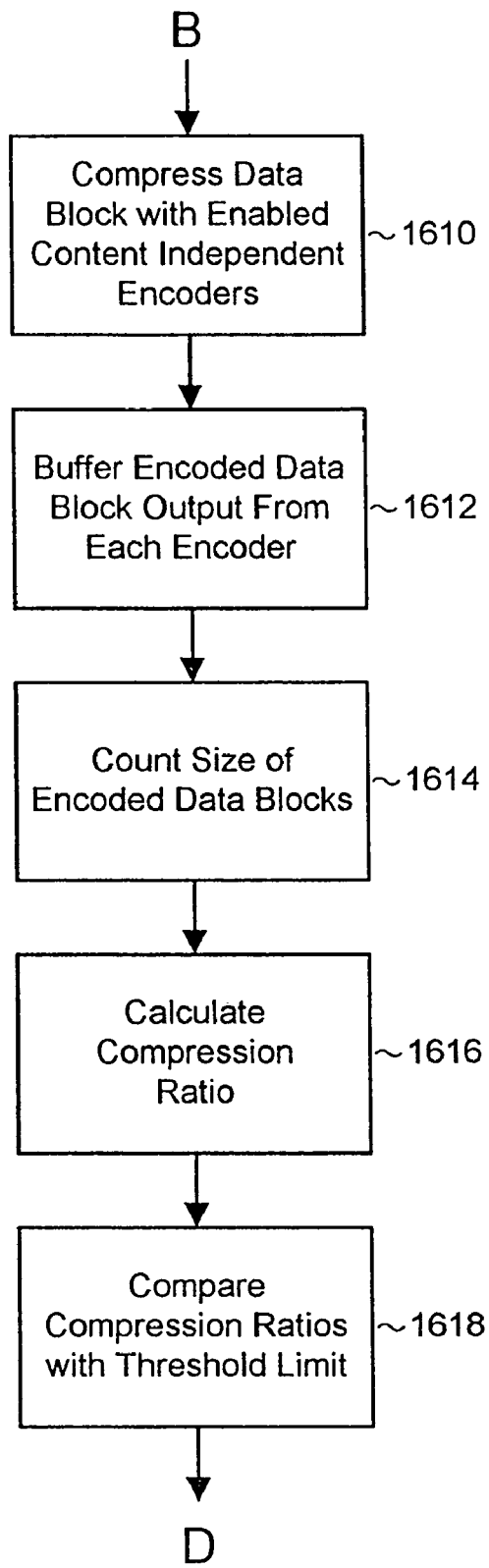
Figure 16C:
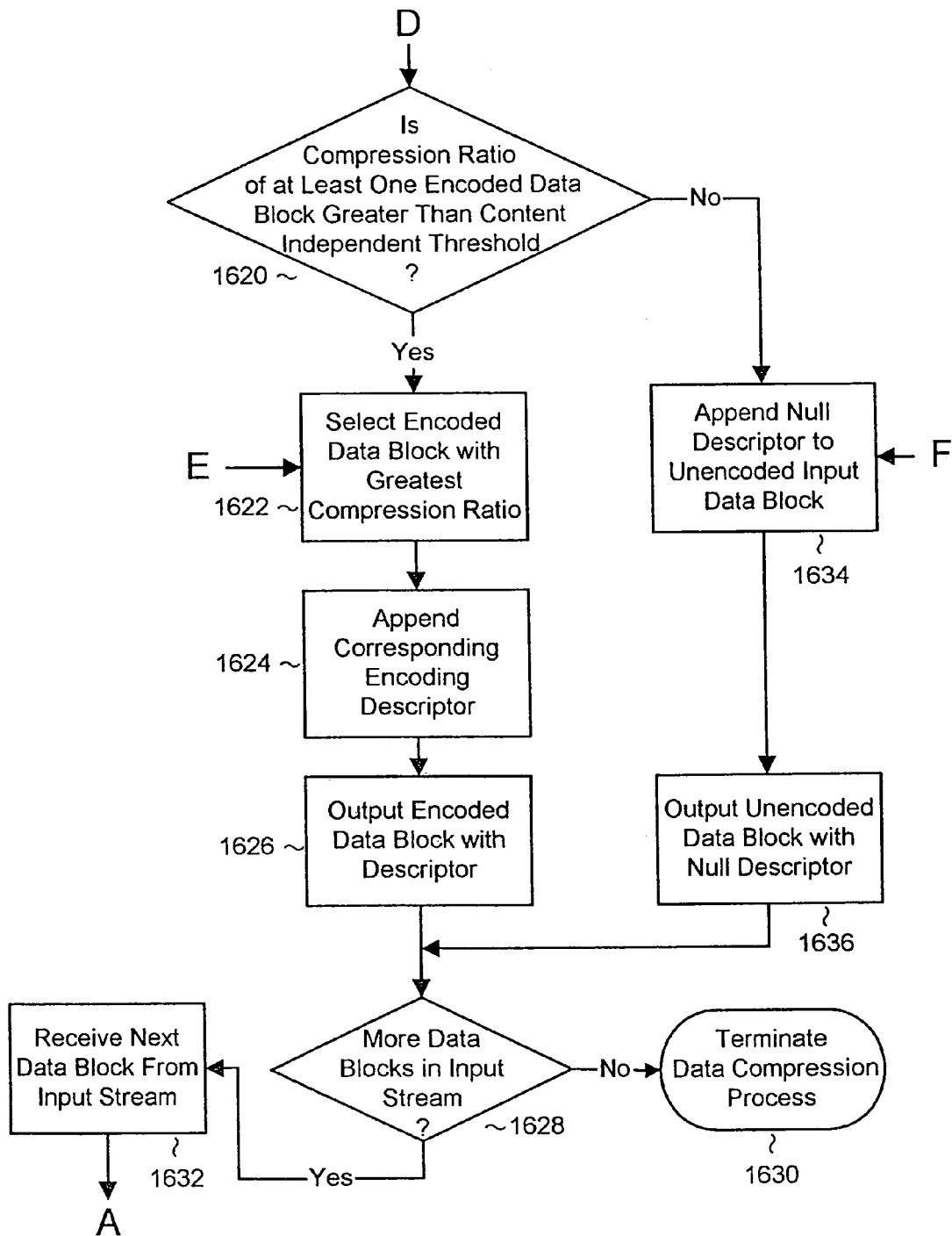
Figure 16D:
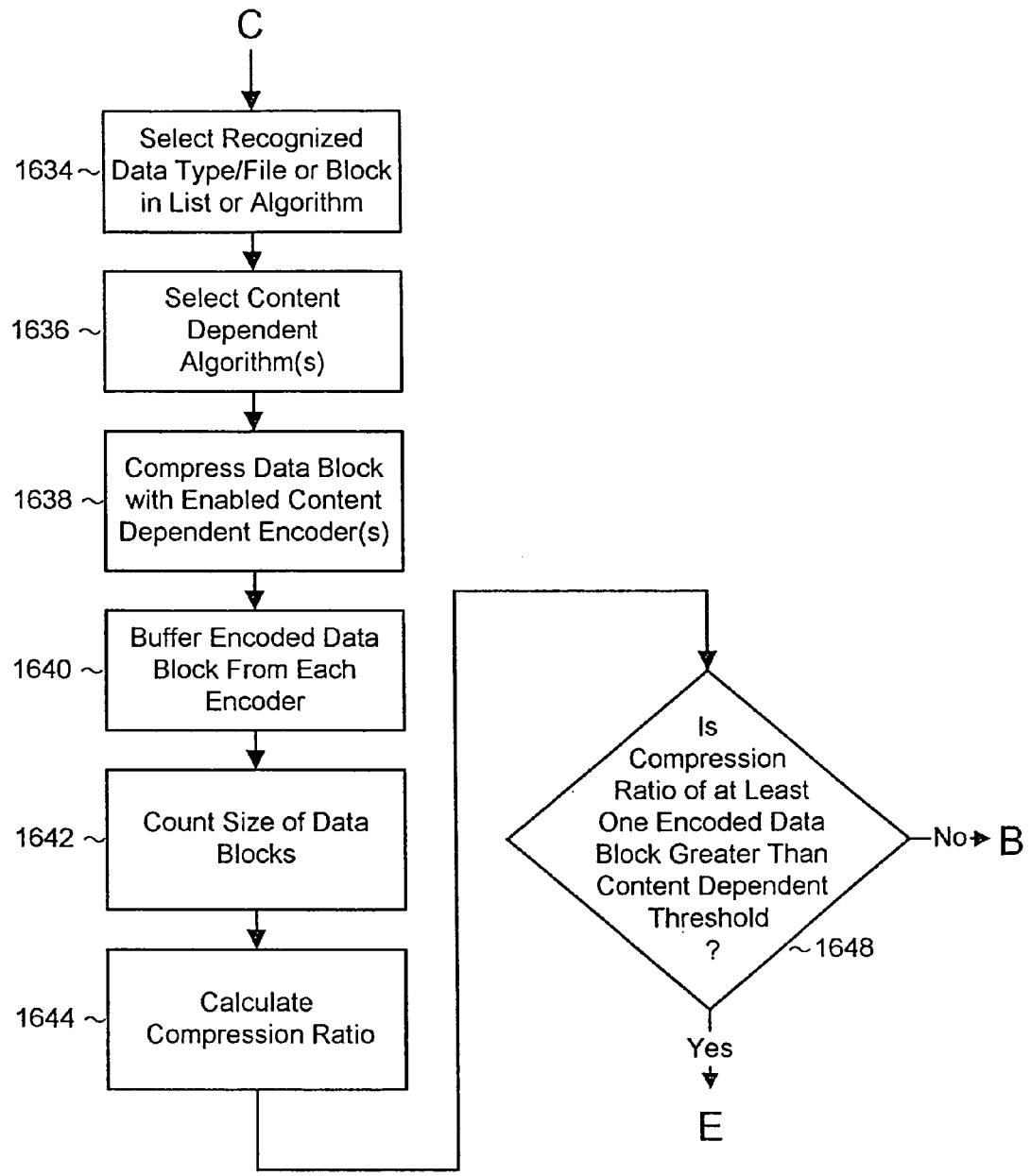

FIGS. 15*a* and 15*b* are block diagrams illustrating a data compression system employing both content independent and content dependent data compression according to another embodiment of the present invention. The system in FIGS. 15*a* and 15*b* is similar in operation to the system of FIGS. 13*a* and 13*b* in that content independent data compression is applied to a data block when the content of the data block cannot be identified or is not associable with a specific data compression algorithm. The system of FIGS. 15*a* and 15*b* additionally performs content independent data compression on a data block when the compression ratio obtained for the data block using the content dependent data compression does not meet a specified threshold.

A mode of operation of the data compression system of FIGS. 15*a* and 15*b* will now be discussed with reference to the flow diagram of FIGS. 16*a*-16*d*, which illustrates a method for performing data compression using a combination of content dependent and content independent data compression. A data stream comprising one or more data blocks is input into the data compression system and the first data block in the stream is received (step 1600). As stated above, data compression is performed on a per data block basis. As previously stated a data block may represent any quantity of data from a single bit through a multiplicity of files or packets and may vary from block to block. Accordingly, the first input data block in the input data stream is input into the counter module 10 that counts the size of the data block (step 1602). The data block is then stored in the buffer 20 (step 1604). The data block is then analyzed on a per block or multi-block basis by the content dependent data recognition module 1300 (step 1606). If the data stream content is not recognized utilizing the recognition list(s) or algorithms(s) module 1310 (Step 1608) the data is routed to the content independent encoder module 30 and compressed by each (enabled) encoder E1 ... En (step 1610). Upon completion of the encoding of the input data block, an encoded data block is output from each (enabled) encoder E1 ... En and maintained in a corresponding buffer (step 1612), and the encoded data block size is counted (step 1614).

Next, a compression ratio is calculated for each encoded data block by taking the ratio of the size of the input data block (as determined by the input counter 10 to the size of each encoded data block output from the enabled encoders (step 1616). Each compression ratio is then compared with an a priori-specified compression ratio threshold (step 1618). It is to be understood that the threshold limit may be specified as any value inclusive of data expansion, no data compression or expansion, or any arbitrarily desired compression limit. It is to be further understood that notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1620). If there are no encoded data blocks having a compression ratio that exceeds the compression ratio threshold limit (negative determination in step 1620), then the original unencoded input data block is selected for output and a null data compression type descriptor is appended thereto (step 1634). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 1636).

On the other hand, if one or more of the encoded data blocks possess a compression ratio greater than the compression ratio threshold limit (affirmative result in step 1620), then the encoded data block having the greatest compression ratio is selected (step 1622). An appropriate data compression type descriptor is then appended (step 1624). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 1626).

As previously stated the data block stored in the buffer 20 (step 1604) is analyzed on a per block or multi-block basis by the content dependent data recognition module 1300 (step 1606). If the data stream content is recognized utilizing the recognition list(s) or algorithms(s) module 1310 (step 1634) the appropriate content dependent algorithms are enabled and initialized (step 1636) and the data is routed to the content dependent encoder module 1620 and compressed by each (enabled) encoder D1 ... Dm (step 1638). Upon completion of the encoding of the input data block, an encoded data block is output from each (enabled) encoder D1 ... Dm and maintained in a corresponding buffer (step 1640), and the encoded data block size is counted (step 1642).

Next, a compression ratio is calculated for each encoded data block by taking the ratio of the size of the input data block (as determined by the input counter 10 to the size of each encoded data block output from the enabled encoders (step 1644). Each compression ratio is then compared with an a priori-specified compression ratio threshold (step 1648). It is to be understood that the threshold limit may be specified as any value inclusive of data expansion, no data compression or expansion, or any arbitrarily desired compression limit. It is to be further understood that many of these algorithms may be lossy, and as such the limits may be subject to or modified by an end target storage, listening, or viewing device. Further notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1648). If there are no encoded data blocks having a compression ratio that exceeds the compression ratio threshold limit (negative determination in step 1620), then the original unencoded input data block is routed to the content independent encoder module 30 and the process resumes with compression utilizing content independent encoders (step 1610).

After the encoded data block or the unencoded data input data block is output (steps 1626 and 1636), a determination is made as to whether the input data stream contains additional data blocks to be processed (step 1628). If the input data stream includes additional data blocks (affirmative result in step 1628), the next successive data block is received (step 1632), its block size is counted (return to step 1602) and the data compression process in repeated. This process is iterated for each data block in the input data stream. Once the final input data block is processed (negative result in step 1628), data compression of the input data stream is finished (step 1630).

Figure 17A:
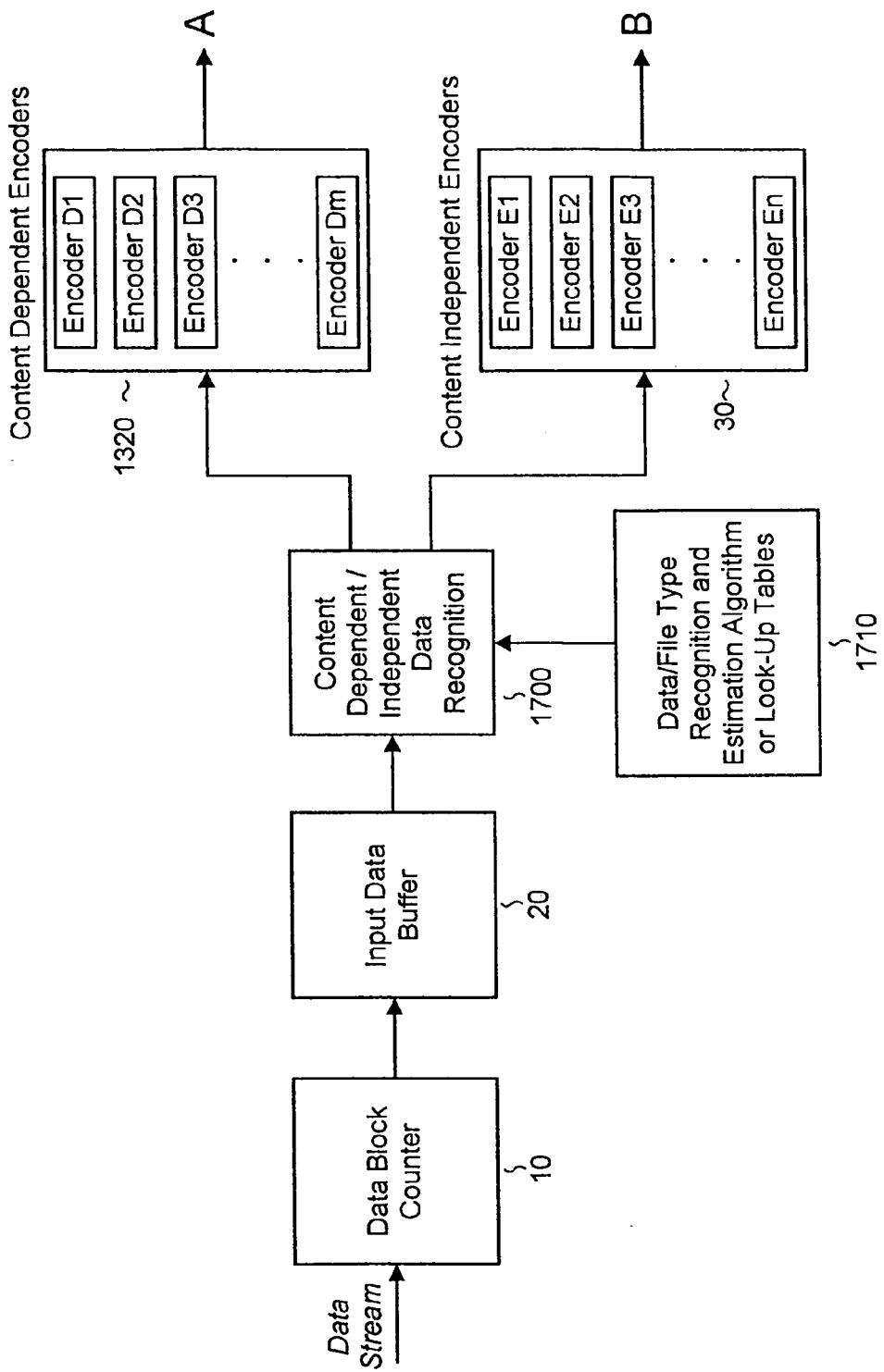
FIGS. 17a and 17b comprise a block diagram of a data compression system comprising content dependent and content independent data compression, according to another embodiment of the present invention.
Figure 17B:
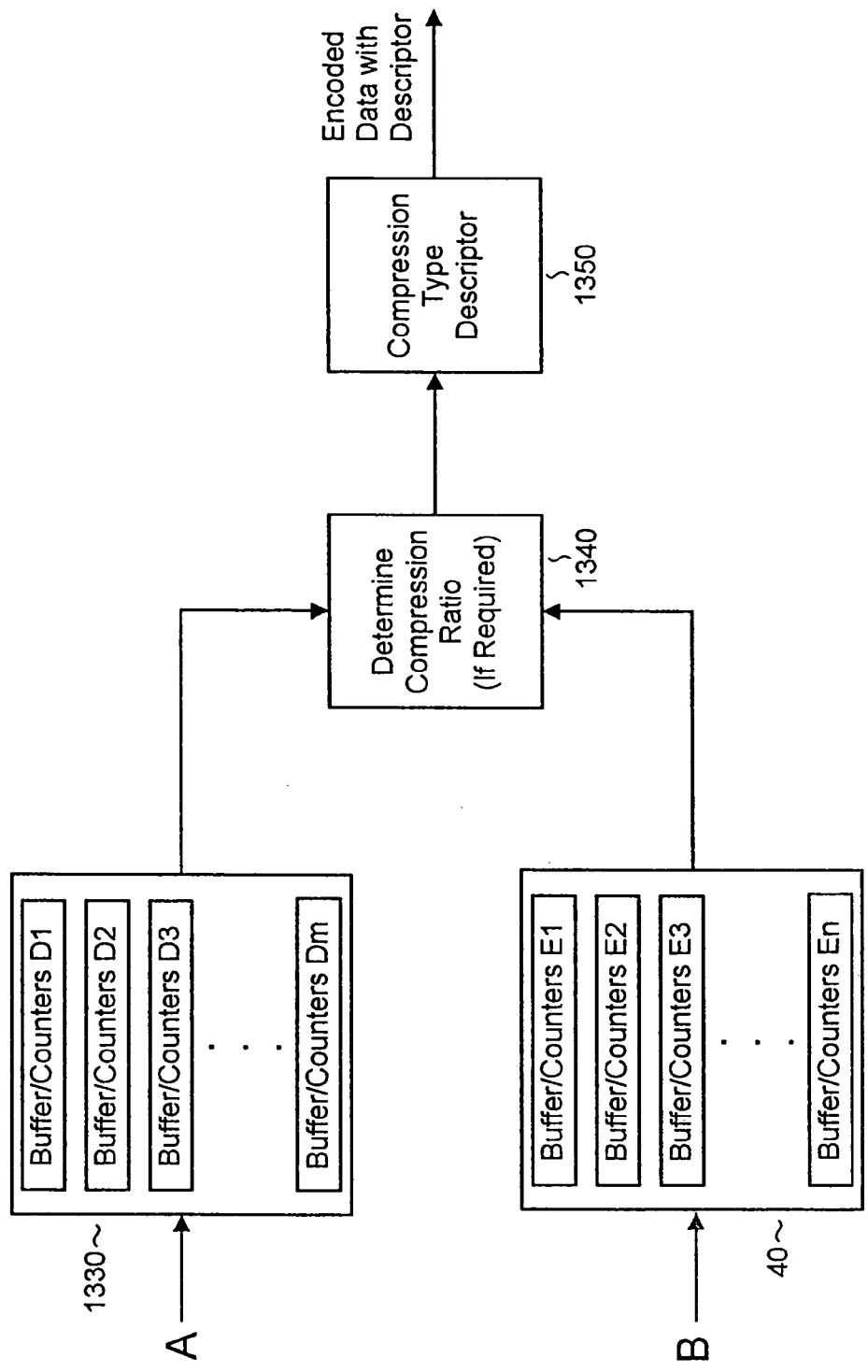
Figure 18A:
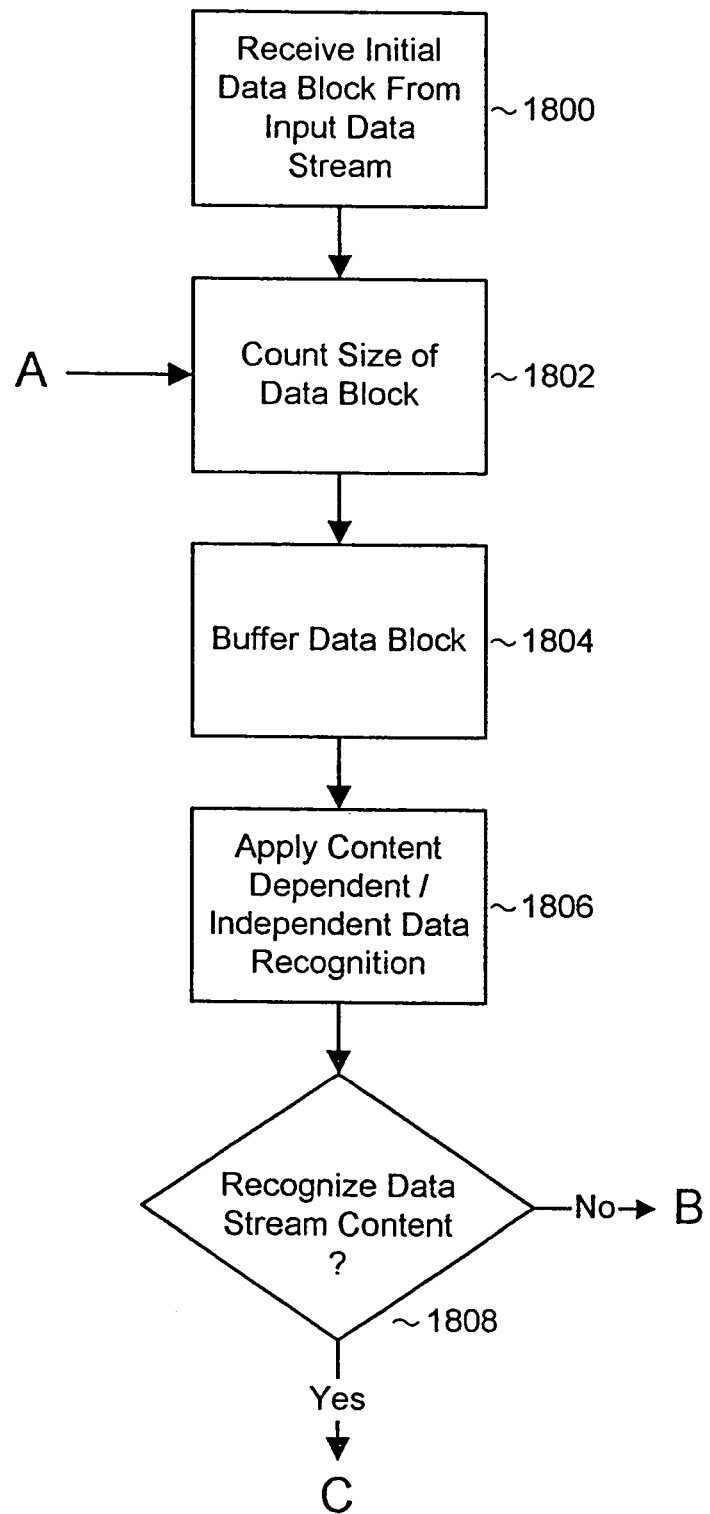
FIGS. 18a-18d comprise a flow diagram of a data compression method using both content dependent and content independent data compression, according to another aspect of the present invention.
Figure 18B:
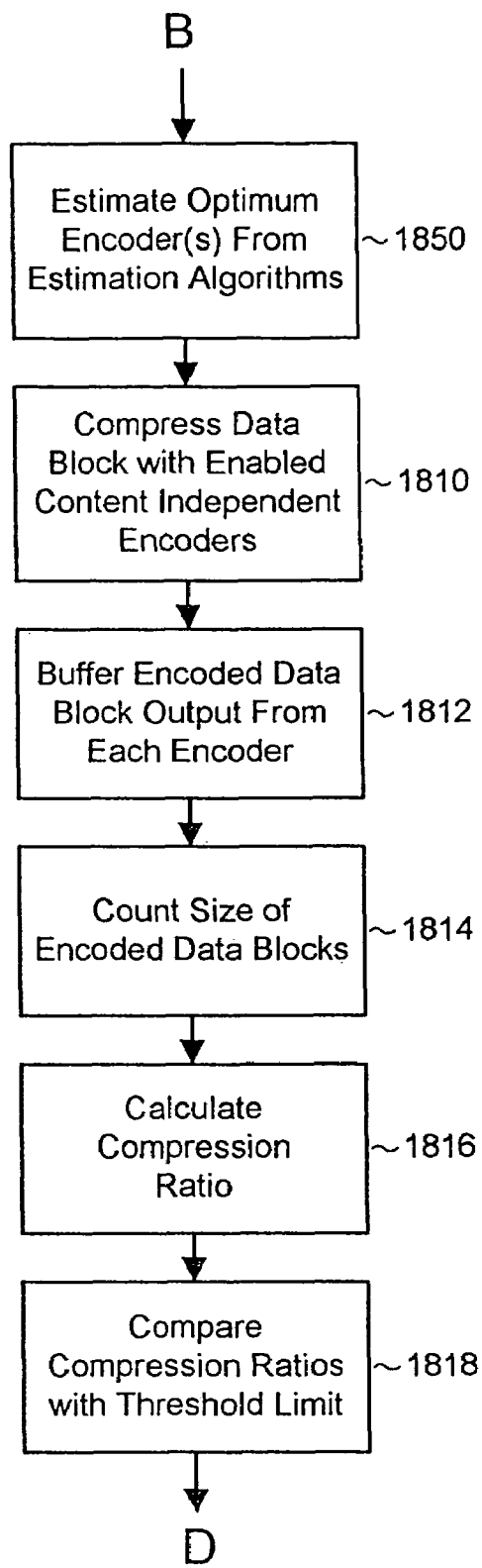
Figure 18C:
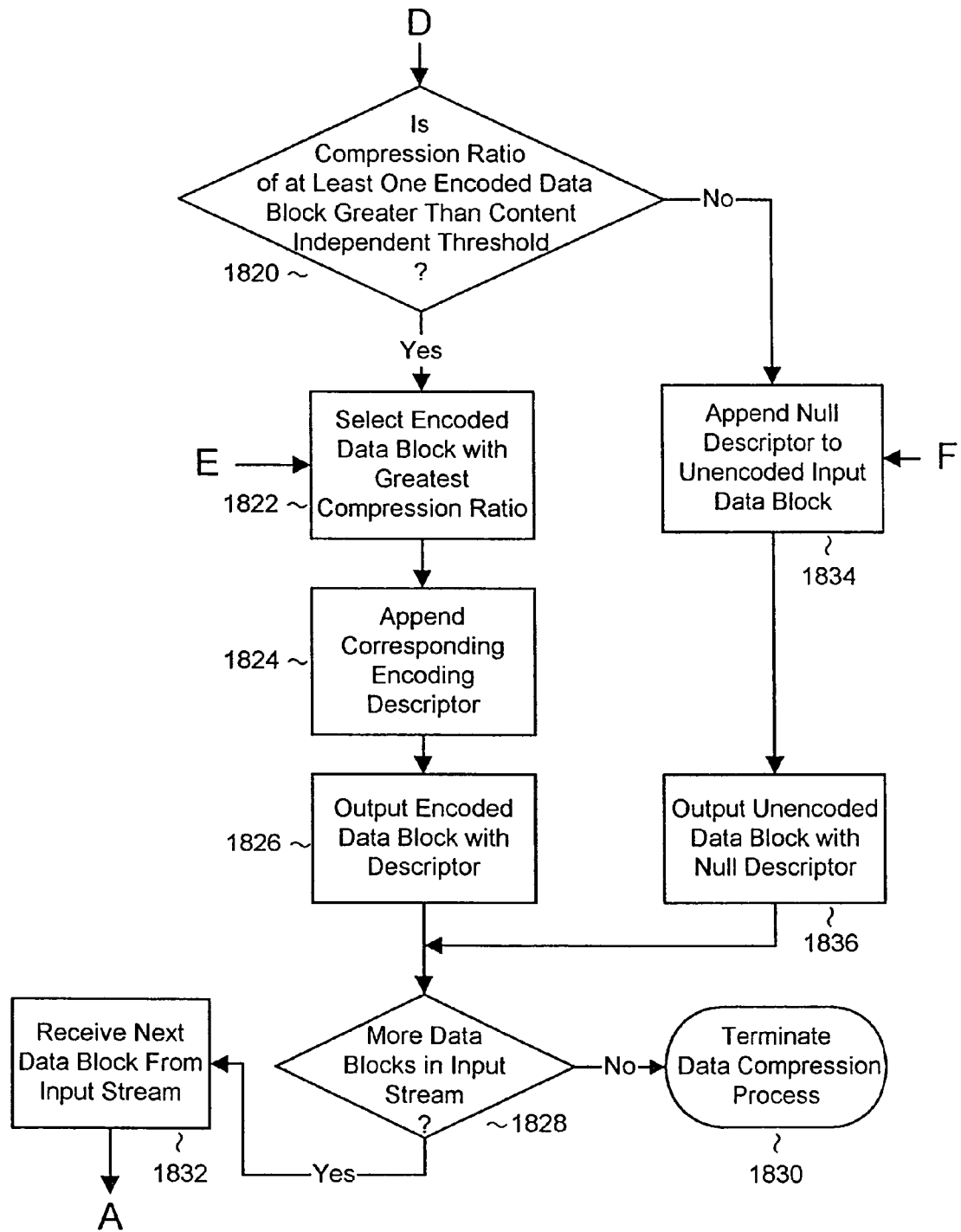
Figure 18D:
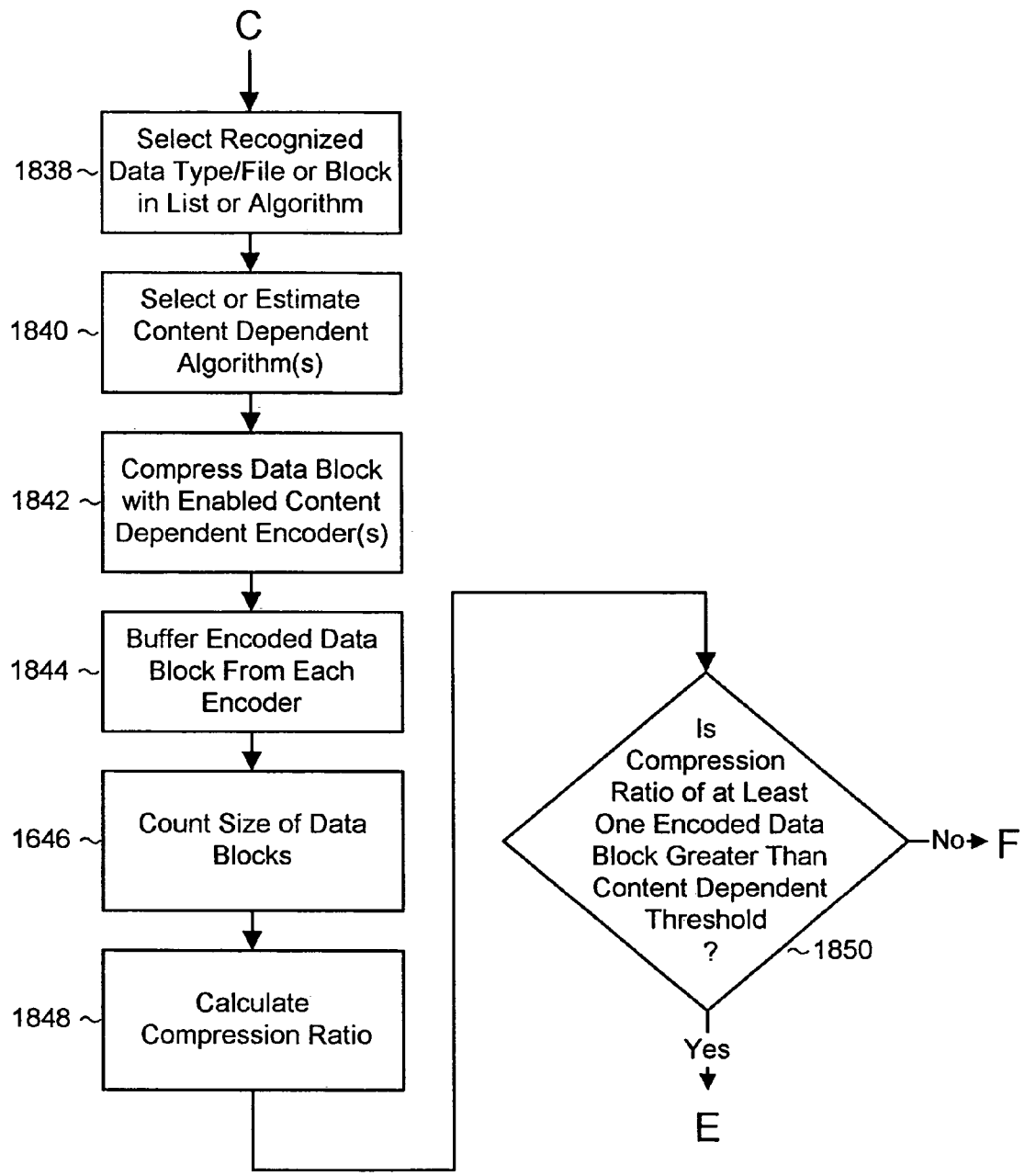

FIGS. 17a and 17b are block diagrams illustrating a data compression system employing both content independent and content dependent data compression according to another embodiment of the present invention. The system in FIGS. 17a and 17b is similar in operation to the system of FIGS. 13a and 13b in that content independent data compression is applied to a data block when the content of the data block cannot be identified or is not associable with a specific data compression algorithm. The system of FIGS. 17a and 17b additionally uses a priori estimation algorithms or look-up tables to estimate the desirability of using content independent data compression encoders and/or content dependent data compression encoders and selecting appropriate algorithms or subsets thereof based on such estimation.

More specifically, a content dependent data recognition and or estimation module 1700 is utilized to analyze the incoming data stream for recognition of data types, data strictures, data block formats, file substructures, file types, or any other parameters that may be indicative of the appropriate data compression algorithm or algorithms (in serial or in parallel) to be applied. Optionally, a data file recognition list(s) or algorithm(s) 1710 module may be employed to hold associations between recognized data parameters and appropriate algorithms. If the content data compression module recognizes a portion of the data, that portion is routed to the content dependent encoder module 1320, if not the data is routed to the content independent encoder module 30. It is to be appreciated that process of recognition (modules 1700 and 1710) is not limited to a deterministic recognition, but may further comprise a probabilistic estimation of which encoders to select for compression from the set of encoders of the content dependent module 1320 or the content independent module 30. For example, a method may be employed to compute statistics of a data block whereby a determination that the locality of repetition of characters in a data stream is determined is high can suggest a text document, which may be beneficially compressed with a lossless dictionary type algorithm. Further the statistics of repeated characters and relative frequencies may suggest a specific type of dictionary algorithm. Long strings will require a wide dictionary file while a wide diversity of strings may suggest a deep dictionary. Statistics may also be utilized in algorithms such as Huffman where various character statistics will dictate the choice of different Huffman compression tables. This technique is not limited to lossless algorithms but may be widely employed with lossy algorithms. Header information in frames for video files can imply a specific data resolution. The estimator then may select the appropriate lossy compression algorithm and compression parameters (amount of resolution desired). As shown in previous embodiments of the present invention, desirability of various algorithms and now associated resolutions with lossy type algorithms may also be applied in the estimation selection process.

A mode of operation of the data compression system of FIGS. 17a and 17b will now be discussed with reference to the flow diagrams of FIGS. 18a-18d. The method of FIGS. 18a-18d use a priori estimation algorithms or look-up tables to estimate the desirability or probability of using content independent data compression encoders or content dependent data compression encoders, and select appropriate or desirable algorithms or subsets thereof based on such estimates. A data stream comprising one or more data blocks is input into the data compression system and the first data block in the stream is received (step 1800). As stated above, data compression is performed on a per data block basis. As previously stated a data block may represent any quantity of data from a single bit through a multiplicity of files or packets and may vary from block to block. Accordingly, the first input data block in the input data stream is input into the counter module 10 that counts the size of the data block (step 1802). The data block is then stored in the buffer 20 (step 1804). The data block is then analyzed on a per block or multi-block basis by the content dependent/content independent data recognition module 1700 (step 1806). If the data stream content is not recognized utilizing the recognition list(s) or algorithms(s) module 1710 (step 1808) the data is to the content independent encoder module 30. An estimate of the best content independent encoders is performed (step 1850) and the appropriate encoders are enabled and initialized as applicable. The data is then compressed by each (enabled) encoder E1 ... En (step 1810). Upon completion of the encoding of the input data block, an encoded data block is output from each (enabled) encoder E1 ... En and maintained in a corresponding buffer (step 1812), and the encoded data block size is counted (step 1814).

Next, a compression ratio is calculated for each encoded data block by taking the ratio of the size of the input data block (as determined by the input counter 10 to the size of each encoded data block output from the enabled encoders (step 1816). Each compression ratio is then compared with an a priori-specified compression ratio threshold (step 1818). It is to be understood that the threshold limit may be specified as any value inclusive of data expansion, no data compression or expansion, or any arbitrarily desired compression limit. It is to be further understood that notwithstanding that the current limit for lossless data-compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1820). If there are no encoded data blocks having a compression ratio that exceeds the compression ratio threshold limit (negative determination in step 1820), then the original unencoded input data block is selected for output and a null data compression type descriptor is appended thereto (step 1834). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 1836).

On the other hand, if one or more of the encoded data blocks possess a compression ratio greater than the compression ratio threshold limit (affirmative result in step 1820), then the encoded data block having the greatest compression ratio is selected (step 1822). An appropriate data compression type descriptor is then appended (step 1824). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 1826).

As previously stated the data block stored in the buffer 20 (step 1804) is analyzed on a per block or multi-block basis by the content dependent data recognition module 1300 (step 1806). If the data stream content is recognized or estimated utilizing the recognition list(s) or algorithms(s) module 1710 (affirmative result in step 1808) the recognized data type/file or block is selected based on a list or algorithm (step 1838) and an estimate of the desirability of using the associated content dependent algorithms can be determined (step 1840). For instance, even though a recognized data type may be associated with three different encoders, an estimation of the desirability of using each encoder may result in only one or two of the encoders being actually selected for use. The data is routed to the content dependent encoder module 1320 and compressed by each (enabled) encoder D1 ... Dm (step 1842). Upon completion of the encoding of the input data block, an encoded data block is output from each (enabled) encoder D1 ... Dm and maintained in a corresponding buffer (step 1844), and the encoded data block size is counted (step 1846).

Next, a compression ratio is calculated for each encoded data block by taking the ratio of the size of the input data block (as determined by the input counter 10 to the size of each encoded data block output from the enabled encoders (step 1848). Each compression ratio is then compared with an a priori-specified compression ratio threshold (step 1850). It is to be understood that the threshold limit may be specified as any value inclusive of data expansion, no data compression or expansion, or any arbitrarily desired compression limit. It is to be further understood that many of these algorithms may be lossy, and as such the limits may be subject to or modified by an end target storage, listening, or viewing device. Further notwithstanding that the current limit for lossless data compression is the entropy limit (the present definition of information content) for the data, the present invention does not preclude the use of future developments in lossless data compression that may increase lossless data compression ratios beyond what is currently known within the art. Additionally the content independent data compression threshold may be different from the content dependent threshold and either may be modified by the specific enabled encoders.

After the compression ratios are compared with the threshold, a determination is made as to whether the compression ratio of at least one of the encoded data blocks exceeds the threshold limit (step 1820). If there are no encoded data blocks having a compression ratio that exceeds the compression ratio threshold limit (negative determination in step 1820), then the original unencoded input data block is selected for output and a null data compression type descriptor is appended thereto (step 1834). A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal (step 1836).

On the other hand, if one or more of the encoded data blocks possess a compression ratio greater than the compression ratio threshold limit (affirmative result in step 1820), then the encoded data block having the greatest compression ratio is selected (step 1822). An appropriate data compression type descriptor is then appended (step 1824). A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal (step 1826).

After the encoded data block or the unencoded data input data block is output (steps 1826 and 1836), a determination is made as to whether the input data stream contains additional data blocks to be processed (step 1828). If the input data stream includes additional data blocks (affirmative result in step 1428), the next successive data block is received (step 1832), its block size is counted (return to step 1802) and the data compression process in repeated. This process is iterated for each data block in the input data stream. Once the final input data block is processed (negative result in step 1828), data compression of the input data stream is finished (step 1830).

It is to be appreciated that in the embodiments described above with reference to FIGS. 13-18, an a priori specified time limit or any other real-time requirement may be employed to achieve practical and efficient real-time operation.

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such Changes and modifications are intended to be included within the scope of the invention as defined by the appended claims.

What is claimed is:

1. A method of decompressing one or more compressed data packets of a data stream using a data decompression processor, wherein multiple decoders applying a plurality of lossless decompression techniques are applied to a data packet, the method comprising:
   receiving a data packet from the data stream having one or more descriptors comprising one or more values, wherein the one or more descriptors indicate lossless encoders used to compress data blocks associated with the data packet, and further wherein the lossless encoders are selected based on analyses of content of the data blocks;
   analyzing the data packet to identify a descriptor;
   selecting one or more lossless decoders for a data block associated with the data packet, wherein the selecting is based on the descriptor;
   decompressing the data block with a selected lossless decoder utilizing content dependent data decompression, if the descriptor indicates the data block is encoded utilizing content dependent data compression; and
   decompressing the data block with a selected lossless decoder utilizing content independent data decompression, if the descriptor indicates the data block is encoded utilizing content independent data compression.

2. The method of claim 1, wherein the descriptor comprises values corresponding to a single applied decoding technique or multiple decoding techniques applied in a specific order.

3. The method of claim 1, wherein the step of decoding the data block utilizing content independent data decompression occurs prior to the step of decoding the data block utilizing content dependent data decompression.

4. The method of claim 1, wherein the multiple decoders are applied to decompress a plurality of data blocks associated with the data packet of the data stream.

5. The method of claim 4, wherein a plurality of data packets of the data stream are decompressed.

6. The method of claim 5, further comprising generating a decompressed data stream from outputs of the multiple decoders.

7. The method of claim 1, wherein the method of decompressing the one or more compressed data packets of the data stream is performed in real-time.

8. A system for decompressing one or more compressed data packets of a data stream, wherein multiple decoders applying a plurality of lossless decompression techniques are applied to a data packet, the system comprising:
   an input interface that receives a data packet from the data stream having one or more descriptors comprising one or more values, wherein the one or more descriptors indicate lossless encoders used to compress data blocks associated with the data packet, and further wherein the lossless encoders are selected based on analyses of content of the data blocks;

a data decompression processor operatively connected to said input interface having a computer readable program code of instructions executable by the data decompression processor, said instructions comprising:

analyze the data packet to identify a descriptor;

select one or more lossless decoders for a data block associated with the data packet, wherein the selecting is based on the descriptor;

decompress the data block with a selected lossless decoder utilizing content dependent data decompression, if the descriptor indicates the data block is encoded utilizing content dependent data compression;

decompress the data block with a selected lossless decoder utilizing content independent data decompression, if the descriptor indicates the data block is encoded utilizing content independent data compression; and an output interface operatively connected to said data decompression processor that outputs a decompressed data packet.

9. The system of claim 8, wherein the descriptor comprises values corresponding to a single applied decoding technique or multiple decoding techniques applied in a specific order.

10. The system of claim 8, wherein the instruction to decode the data block utilizing content independent data decompression is performed prior to the instruction to decode the data block utilizing content dependent data decompression.

11. The system of claim 8, wherein the multiple decoders are applied to decompress a plurality of data blocks associated with the data packet of the data stream.

12. The system of claim 11, wherein the system for decompressing one or more compressed data packets of a data stream operates on a plurality of data packets of the data stream.

13. The system of claim of 8, wherein the system for decompressing one or more compressed data packets of a data stream operates in real-time.

14. A method of compressing a plurality of data blocks to create a compressed data packet in a data stream using a data compression processor, wherein multiple encoders applying a plurality of lossless compression techniques are applied to data blocks, the method comprising:

receiving a data block;

analyzing content of the data block to determine a data block type;

selecting one or more lossless encoders based on the data block type and a computer file, wherein the computer file indicates data block types and associated lossless encoders;

compressing the data block with a selected encoder utilizing content dependent data compression, if the data block type is recognized as associated with a lossless encoder utilizing content dependent data compression;

compressing the data block with a selected lossless encoder utilizing content independent data compression, if the data block type is not recognized as associated with a lossless encoder utilizing content dependent data compression; and providing a descriptor for the compressed data packet in the data stream, wherein the descriptor indicates the one or more selected lossless encoders for the encoded data block.

15. The method of claim 14, wherein the multiple encoders are applied to compress a plurality of data blocks associated with the compressed data packet of the data stream.

16. The method of claim 15, wherein a plurality of data packets of the data stream are compressed.

17. The method of claim 16, further comprising generating a compressed data stream from outputs of the multiple encoders.

18. The method of claim 14, wherein the method of compressing a plurality of data blocks is performed in real-time.

19. A system for compressing a plurality of data blocks to create a compressed data packet in a data stream, wherein multiple encoders applying a plurality of lossless compression techniques are applied to data blocks, comprising:

an input interface that receives a data block;

a data compression processor operatively connected to said input interface having a computer readable program code of instructions executable by the data compression processor, said instructions comprising:

analyze content of the data block to determine a data block type;

select one or more lossless encoders based on the data block type and a computer file, wherein the computer file indicates data block types and associated lossless encoders;

compress the data block with a selected lossless encoder utilizing content dependent data compression, if the data block type is recognized as associated with a lossless encoder utilizing content dependent data compression;

compress the data block with a selected lossless encoder utilizing content independent data compression, if the data block type is not recognized as associated with a lossless encoder utilizing content dependent data compression; and an output interface operatively connected to said data compression processor that outputs a descriptor comprising one or more values in the compressed data packet in the data stream, wherein the descriptor indicates the selected one or more lossless encoders.

20. The system of claim 19, wherein the multiple decoders are applied to compress a plurality of data blocks associated with the compressed data packet of the data stream.

21. The system of claim 20, wherein the system for compressing outputs a plurality of data packets in the data stream.

22. The system of claim 19, wherein the system for compressing operates in real-time.

* * * * *